US012751139B2

(12) United States Patent
Mou

(10) Patent No.: US 12,751,139 B2
(45) Date of Patent: Sep. 29, 2026

(54) DISPLAY PANEL, DISPLAY DEVICE AND CONTROL METHOD OF DISPLAY PANEL

(71) Applicants: Chengdu BOE Optoelectronics Technology Co., Ltd., Chengdu (CN); BOE Technology Group Co., Ltd., Beijing (CN)

(72) Inventor: Xin Mou, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 314 days.

(21) Appl. No.: 18/580,934

(22) PCT Filed: Jul. 20, 2022

(86) PCT No.: PCT/CN2022/106878
§ 371 (c)(1),
(2) Date: Jan. 19, 2024

(87) PCT Pub. No.: WO2023/001205
PCT Pub. Date: Jan. 26, 2023

(65) Prior Publication Data

US 2024/0337886 A1 Oct. 10, 2024

(30) Foreign Application Priority Data

Jul. 20, 2021 (WO) ................ PCT/CN2021/107421

(51) Int. Cl.
*H10K 59/121* (2023.01)
*G02F 1/1343* (2006.01)
(Continued)

(52) U.S. Cl.
CPC ... *H10K 59/1213* (2023.02); *G02F 1/134309* (2013.01); *G02F 1/136286* (2013.01);
(Continued)

(58) Field of Classification Search
CPC ............ H10K 59/1213; H10K 59/131; H10K 59/122; H10K 59/35; H10K 59/1216
(Continued)

(56) References Cited

U.S. PATENT DOCUMENTS 7,710,023 B2 5/2010 Hong et al.
9,123,681 B2 9/2015 Xi et al.
(Continued)

FOREIGN PATENT DOCUMENTS

CN 1917228 A 2/2007
CN 102915693 A 2/2013
(Continued)

OTHER PUBLICATIONS

Aug. 31, 2022—(WO) International Search Report & Written Opinion Appn PCT/CN2022/106878, pp. 1-10 (Chinese language).
(Continued)

*Primary Examiner* — Christopher M Raabe
(74) *Attorney, Agent, or Firm* — Banner & Witcoff, Ltd.

(57) ABSTRACT

A display panel, a display device, and a display panel control method. In the display panel, the display substrate includes a first substrate and a plurality of sub-pixels; each sub-pixel has a first opening allowing for exiting of light for generating a display image; the light control panel is stacked on the display substrate and includes a plurality of sub-light control units; each sub-light control unit has a second opening; the plurality of sub-light control units are in one-to-one correspondence with the plurality of sub-pixels; the light exit from the first openings pass through the second openings of the sub-light control units and then exit from the display panel; the sub-light control units are configured to modulate light exit from the first openings; and the orthographic projection of the second opening of each sub-light
(Continued)

control unit substantially coincides the orthographic projection of the first opening of the corresponding sub-pixel.

19 Claims, 27 Drawing Sheets

(51) Int. Cl.
*G02F 1/1362* (2006.01)
*G02F 1/1368* (2006.01)
*H10K 59/122* (2023.01)
*H10K 59/131* (2023.01)
*H10K 59/35* (2023.01)

(52) U.S. Cl.
CPC ....... *G02F 1/1368* (2013.01); *H10K 59/1216* (2023.02); *H10K 59/122* (2023.02); *H10K 59/131* (2023.02); *H10K 59/35* (2023.02)

(58) Field of Classification Search
USPC ........................................................... 349/42
See application file for complete search history.

(56) References Cited

U.S. PATENT DOCUMENTS

| | | | |
|---|---|---|---|
| 9,893,136 B2 | 2/2018 | Byun et al. | |
| 10,062,311 B2 | 8/2018 | Hsin et al. | |
| 10,141,381 B2 | 11/2018 | Hsin et al. | |
| 10,453,909 B2 | 10/2019 | Li et al. | |
| 10,510,820 B2 | 12/2019 | Toyomura et al. | |
| 10,776,603 B2 | 9/2020 | Ma et al. | |
| 10,930,719 B2 | 2/2021 | Song et al. | |
| 11,690,253 B2 | 6/2023 | Huang et al. | |
| 2005/0168135 A1 | 8/2005 | Iga | |
| 2007/0218261 A1 | 9/2007 | Saitoh et al. | |
| 2014/0312333 A1 | 10/2014 | Chaji et al. | |
| 2016/0181341 A1 | 6/2016 | Lee et al. | |
| 2017/0148366 A1 | 5/2017 | Hsin et al. | |
| 2018/0113370 A1 | 4/2018 | Zhao et al. | |
| 2019/0129549 A1 | 5/2019 | Yeh et al. | |
| 2019/0214440 A1* | 7/2019 | Lee | H10K 59/122 |
| 2020/0057330 A1* | 2/2020 | Yamazaki | H10K 59/50 |
| 2020/0168838 A1 | 5/2020 | Hong et al. | |
| 2020/0211477 A1 | 7/2020 | Lai et al. | |
| 2021/0013455 A1 | 1/2021 | Bae et al. | |
| 2021/0167161 A1 | 6/2021 | Yang et al. | |
| 2021/0356761 A1 | 11/2021 | Li et al. | |
| 2022/0223673 A1 | 7/2022 | Xu et al. | |
| 2022/0367596 A1 | 11/2022 | Chen et al. | |
| 2022/0415981 A1 | 12/2022 | Shu et al. | |
| 2024/0298498 A1* | 9/2024 | Cao | H10K 59/38 |

FOREIGN PATENT DOCUMENTS

| | | | |
|---|---|---|---|
| CN | 104716167 | A | 6/2015 |
| CN | 104966728 | A | 10/2015 |
| CN | 105572930 | A | 5/2016 |
| CN | 105789266 | A | 7/2016 |
| CN | 107579099 | A | 1/2018 |
| CN | 108922469 | A | 11/2018 |
| CN | 208173203 | U | 11/2018 |
| CN | 109074768 | A | 12/2018 |
| CN | 109273498 | A | 1/2019 |
| CN | 109301088 | A | 2/2019 |
| CN | 109581704 | A | 4/2019 |
| CN | 110047383 | A | 7/2019 |
| CN | 111326636 | A | 6/2020 |
| CN | 111508977 | A | 8/2020 |
| CN | 111833754 | A | 10/2020 |
| CN | 111952342 | A | 11/2020 |
| CN | 111969032 | A | 11/2020 |
| CN | 111969125 | A | 11/2020 |
| CN | 111999948 | A | 11/2020 |
| CN | 215895162 | U | 2/2022 |
| CN | 114200704 | A | 3/2022 |
| JP | 2006189475 | A | 7/2006 |
| JP | 2016053690 | A | 4/2016 |
| KR | 20100046439 | A | 5/2010 |
| KR | 20170012767 | A | 2/2017 |
| KR | 20200117293 | A | 10/2020 |
| KR | 1020210068330 | A | 6/2021 |
| WO | 9735223 | A1 | 9/1997 |
| WO | 2020124693 | A1 | 6/2020 |

OTHER PUBLICATIONS

Aug. 31, 2022—(WO) International Search Report Appn PCT/CN2022/106878, pp. 1-2 (English translation).

Aug. 31, 2022—(WO) Written Opinion of the International Searching Authorityt Appn PCT/CN2022/106878, pp. 1-5 (English translation).

Mar. 29, 2022—(WO) International Search Report & Written Opinion Appn PCT/CN2021/107421, pp. 1-10 (Chinese language).

Mar. 29, 2022—(WO) International Search Report Appn PCT/CN2021/107421, pp. 1-3 (English translation).

Mar. 29, 2022—(WO) Written Opinion of the International Searching Authorityt Appn PCT/CN2021/107421, pp. 1-4 (English translation).

Nov. 20, 2025—(US) Non-Final Office Action U.S. Appl. No. 17/790,349.

Sep. 23, 2025—(IN) First Examination Report Appn No. 202347060417.

Jun. 5, 2025—(US) Non-Final Office Action U.S. Appl. No. 17/790,349.

Mar. 19, 2025—(US) Restriction Requirement U.S. Appl. No. 17/790,349.

* cited by examiner

DISPLAY PANEL, DISPLAY DEVICE AND CONTROL METHOD OF DISPLAY PANEL

The application is a U.S. National Phase Entry of International Application No. PCT/CN2022/106878 filed Jul. 20, 2022, designating the United States of America and claiming priority to International Application No. PCT/CN2021/107421 filed Jul. 20, 2021. The present application claims priority to and the benefit of the above-identified applications and the above-identified applications are incorporated by reference herein in their entirety.

This patent application claims priority to the PCT Patent Application No. PCT/CN2021/107421 filed on Jul. 20, 2021, the present disclosure of which is incorporated herein by reference in its entirety as part of the embodiment of the present disclosure.

TECHNICAL FIELD

At least one embodiment of the present disclosure relates to a display panel, a display device, and a control method of the display panel.

BACKGROUND

Compared with traditional liquid crystal displays (LCDs), organic light emitting diode (OLED) display products have the advantages of self-illumination, wide color gamut, high contrast, and thinness, making them widely used in mobile phones, tablets and other fields.

SUMMARY

At lease one embodiments of the present disclosure provides a display panel, and the display panel includes a display substrate and a light control panel. The display substrate includes a first substrate and a plurality of sub-pixels arranged on a main surface of the first substrate, each of the plurality of sub-pixels has a first opening, the light used to generate the display image is emitted from the first opening; the light control panel and the display substrate are stacked in a direction perpendicular to the main surface of the first substrate, the light control panel includes a plurality of sub-light control units, each of the plurality of sub-light control units has a second opening, the plurality of sub-light control units correspond to the plurality of sub-pixels in a one-to-one correspondence, the light emitted from the first opening passes through the second openings of at least part of the sub-light control units in the plurality of sub-light control units and then emits from the display panel, the at least part of the sub-light control units in the plurality of sub-light control units is configured to modulate light emitted from the first opening; an orthographic projection of a second opening of each of the sub-light control units on the main surface of the first substrate is substantially overlapped with an orthographic projection of the first opening of the corresponding sub-pixel on the main surface of the first substrate.

For example, in the display panel provided by at least one embodiment of the present disclosure, a ratio of an area of a part of the second opening of each of the sub-light control units of which part an orthographic projection on the main surface of the first substrate is overlapped with the orthographic projection of the first opening of the corresponding sub-pixel on the main surface of the first substrate to an area of the orthographic projection of the first opening of corresponding the sub-pixel on the main surface of the first substrate is greater than or equal to 80%.

For example, in the display panel provided by at least one embodiment of the present disclosure, the orthographic projection of the second opening of each of the sub-light control units on the main surface of the first substrate completely coincides with the orthographic projection of the corresponding first opening of the sub-pixel on the main surface of the first substrate.

For example, in the display panel provided by at least one embodiment of the present disclosure, the light control panel is a liquid crystal panel, each of the plurality of sub-light control units further comprises a pixel electrode, liquid crystal molecules, a common electrode and a light control transistor; the light control panel further comprises: a light control gate line and a light control data line. The light control gate line extends along a row direction, and is electrically connected with a gate electrode of the light control transistor to provide a light control gate signal to the light control transistor; the light control data line extends along a column direction, and is electrically connected with a first electrode of the light control transistor to provide a light control data signal to the light control transistor; a second electrode of the light control transistor is electrically connected with the pixel electrode, the liquid crystal molecules are configured to be rotatable under an action of an electric field between the pixel electrode and the common electrode, to modulate the light emitted from the first opening; and in each of the sub-light control units, the second opening exposes at least a part of the pixel electrode.

For example, in the display panel provided by at least one embodiment of the present disclosure, each of the plurality of sub-pixels comprises a driving transistor and a light emitting element, the driving transistor is configured to control a magnitude of the driving current flowing through the light emitting element, the light emitting element is configured to receive the driving current and is driven by the driving current to emit light, and comprises a first electrode; in each of the sub-pixels, the first opening exposes at least a part of the first electrode; and an orthographic projection of the pixel electrode on the main surface of the first substrate substantially coincides with an orthographic projection of the corresponding first electrode of the sub-pixel on the main surface of the first substrate.

For example, in the display panel provided by at least one embodiment of the present disclosure, an orthographic projection of the light control transistor of each of the sub-light control units on the main surface of the first substrate is not overlapped with all orthographic projections of the first openings of the plurality of sub-pixels of the display substrate on the main surface of the first substrate, and is not overlapped with all orthographic projections of the second openings of the plurality of sub-light control units of the light control panel on the main surface of the first substrate.

For example, in the display panel provided by at least one embodiment of the present disclosure, an orthographic projection of the light control gate line on the main surface of the first substrate is not overlapped with all orthographic projections of the first openings of the plurality of sub-pixels of the display substrate on the main surface of the first substrate, and is not overlapped with all orthographic projections of the second openings of the plurality of sub-light control units of the light control panel on the main surface of the first substrate.

For example, in the display panel provided by at least one embodiment of the present disclosure, the plurality of sub-light control units are arranged in a light control array; the light control array comprises a plurality of light control units arranged in an array, one of the light control units comprises a plurality of the sub-light control units arranged continuously; the light control array comprises light control rows extending along the row direction and light control columns extending along the column direction, the row direction is intersected with the column direction, both the light control rows and the light control columns comprise a plurality of the light control units; the light control rows comprise a first light control row and a second light control row adjacent to each other, both an orthographic projection of the light control gate line that provides the light control gate signal to the first light control row on the main surface of the first substrate, and orthographic projections of the light control transistors of the plurality of sub-light control units of the first light control row on the main surface of the first substrate are located between orthographic projections of the second openings of the plurality of sub-light control units of the first light control row on the main surface of the first substrate and orthographic projections of the second openings of the plurality of sub-light control units of the second light control row on the main surface of the first substrate.

For example, in the display panel provided by at least one embodiment of the present disclosure, the plurality of sub-light control units are arranged in a light control array; the light control array comprises a plurality of light control units arranged in an array, one of the light control units comprises a plurality of the sub-light control units arranged continuously; each of the light control units comprises a first edge extending along the column direction, the plurality of sub-light control units of each of the light control units are arranged in the row direction and comprise an edge sub-light control unit closest to the first edge; an orthographic projection of the light control data line located at the first edge and providing the light control data signal to the edge sub-light control unit on the main surface of the first substrate is not overlapped with orthographic projections of the second openings of all sub-light control units of each of the light control units on the main surface of the first substrate, and is not overlapped with orthographic projections of the first openings of the sub-pixels corresponding to all the sub-light control units on the main surface of the first substrate.

For example, in the display panel provided by at least one embodiment of the present disclosure, each of the plurality of sub-light control units further comprises a light control storage capacitor, and the light control storage capacitor comprises: a first electrode plate and a second electrode plate. The first electrode plate is configured as the pixel electrode; the second electrode plate is arranged in a same layer as the light control gate line and electrically connected with the light control gate line that provides the light control gate signal to the each of the plurality of sub-light control units; the second electrode plate of the light control storage capacitor protrudes from the light control gate line which is electrically connected with the second electrode plate along the column direction, an orthographic projection of at least an end of the second electrode plate in the column direction away from the light control gate line electrically connected with the second electrode plate on the main surface of the first substrate is overlapped with an orthographic projection of the pixel electrode on the main surface of the first substrate.

For example, in the display panel provided by at least one embodiment of the present disclosure, the plurality of sub-light control units of each of the light control units comprise a first sub-light control unit, a second sub-light control unit and a third sub-light control unit that are arranged sequentially in the row direction, colors of emitting light of the sub-pixels corresponding to the first sub-light control unit, the second sub-light control unit and the third sub-light control unit are different from each other; a distance between the light control transistor of the first sub-light control unit and the light control transistor of the second sub-light control unit in the row direction is a first distance, a distance between the light control transistor of the second sub-light control unit and the light control transistor of the third sub-light control unit in the row direction is a second distance; and the second distance is greater than the first distance.

For example, in the display panel provided by at least one embodiment of the present disclosure, the pixel electrode electrically connected with the second electrode of the light control transistor of the first sub-light control unit is a first pixel electrode, the pixel electrode electrically connected with the second electrode of the light control transistor of the second sub-light control unit is a second pixel electrode, and the pixel electrode electrically connected with the second electrode of the light control transistor of the third sub-light control unit is a third pixel electrode; the first pixel electrode and the second pixel electrode are spaced apart in the column direction, and an entire structure constituted by the first pixel electrode and the second pixel electrode is arranged with the third pixel electrode in the row direction; both the first pixel electrode and the second pixel electrode cover at least part of a space between the light control transistor of the first sub-light control unit and the light control transistor of the second sub-light control unit in the row direction, and at least part of a space between the light control transistor of the second sub-light control unit and the light control transistor of the third sub-light control unit in the row direction, and the third pixel electrode covers at least part of a space between the light control transistor of the second sub-light control unit and the light control transistor of the third sub-light control unit in the row direction.

For example, in the display panel provided by at least one embodiment of the present disclosure, the second pixel electrode is located on a side of the first pixel electrode away from the gate line that provides the light control gate signal to the light control unit in the column direction, a distance in the column direction between the third pixel electrode and the gate line that provides the light control gate signal to the light control unit is greater than a distance in the column direction between the first pixel electrode and the gate line that provides the light control gate signal to the light control unit; a length of the second electrode plate of the light control storage capacitor of the second sub-light control unit in the column direction is greater than a length of the second electrode plate of the light control storage capacitor of the third sub-light control unit in the column direction, and the length of the second electrode plate of the light control storage capacitor of the third sub-light control unit in the column direction is greater than a length of the second electrode plate of the light control storage capacitor of the first sub-light control unit in the column direction.

For example, in the display panel provided by at least one embodiment of the present disclosure, a size of the third pixel electrode in the column direction is larger than a size of the second pixel electrode in the column direction, and is larger than a size of the first pixel electrode in the column direction; and an orthographic projection of the third pixel electrode in the column direction is at least partially overlapped with an orthographic projection of the first pixel electrode in the column direction, and is at least partially overlapped with an orthographic projection of the second pixel electrode in the column direction.

For example, in the display panel provided by at least one embodiment of the present disclosure, the light control transistor of the first sub-light control unit, the light control transistor of the second sub-light control unit and the light control transistor of the third sub-light control unit are basically arranged on a straight line extending along the row direction, a size of the second electrode of the light control transistor of the second sub-light control unit in the column direction is larger than a size of the second electrode of the light control transistor of the third sub-light control unit in the column direction, and the size of the second electrode of the light control transistor of the third sub-light control unit in the column direction is larger than a size of the second electrode of the light control transistor of the first sub-light control unit in the column direction.

For example, in the display panel provided by at least one embodiment of the present disclosure, the second electrode of the light control transistor of the second sub-light control unit comprises an extension part extending along the column direction, an orthographic projection of the extension part on the main surface of the first substrate is located between an orthographic projection of the second opening of the first sub-light control unit on the main surface of the first substrate and an orthographic projection of the second opening of the third sub-light control unit on the main surface of the first substrate.

For example, in the display panel provided by at least one embodiment of the present disclosure, the pixel electrode electrically connected with the second electrode of the light control transistor of the first sub-light control unit is a first pixel electrode, the pixel electrode electrically connected with the second electrode of the light control transistor of the second sub-light control unit is a second pixel electrode, and the pixel electrode electrically connected with the second electrode of the light control transistor of the third sub-light control unit is a third pixel electrode; the first pixel electrode and the second pixel electrode are spaced apart in the row direction, a size of the second pixel electrode in the row direction is larger than a size of the first pixel electrode in the row direction, and the first pixel electrode covers at least part of a space between the light control transistor of the first sub-light control unit and the light control transistor of the second sub-light control unit in the row direction, and the second pixel electrode covers at least part of a space in the row direction between the light control transistor of the second sub-light control unit and the light control transistor of the third sub-light control unit.

For example, in the display panel provided by at least one embodiment of the present disclosure, an entire structure constituted by the first pixel electrode and the second pixel electrode is arranged with the third pixel electrode in the column direction, the third pixel electrode is on a side of the entire structure constituted by the first pixel electrode and the second pixel electrode in the column direction away from the gate line that provides the light control gate signal to the light control unit; a length of the second electrode plate of the light control storage capacitor of the third sub-light control unit in the column direction is greater than a length of the second electrode plate of the light control storage capacitor of the first sub-light control unit in the column direction, and is greater than a length of the second electrode plate of the light control storage capacitor of the second sub-light control unit in the column direction.

For example, in the display panel provided by at least one embodiment of the present disclosure, a size of the third pixel electrode in the row direction is larger than a size of the second pixel electrode in the row direction, and an orthographic projection of the third pixel electrode in the row direction is at least partially overlapped with an orthographic projection of the first pixel electrode in the row direction, and is at least partially overlapped with an orthographic projection of the second pixel electrode in the row direction.

For example, in the display panel provided by at least one embodiment of the present disclosure, an orthographic projection of the light control data line that provides the light control data signal to the second sub-light control unit on the main surface of the first substrate is located between an orthographic projection of the first pixel electrode on the main surface of the first substrate and an orthographic projection of the second pixel electrode on the main surface of the first substrate, and is overlapped with an orthographic projection of the third pixel electrode on the main surface of the first substrate; an orthographic projection of the light control data line on the main surface of the first substrate that provides the light control data signal to the third sub-light control unit is overlapped with the orthographic projection of the second pixel electrode on the main surface of the first substrate and the orthographic projection of the second pixel electrode on the main surface of the first substrate, and is overlapped with the orthographic projection of the third pixel electrode on the main surface of the first substrate.

For example, in the display panel provided by at least one embodiment of the present disclosure, the light control transistor of the first sub-light control unit, the light control transistor of the second sub-light control unit and the light control transistor of the third sub-light control unit are basically arranged on a straight line extending along the row direction, a size of the second electrode of the light control transistor of the third sub-light control unit in the column direction is larger than a size of the second electrode of the light control transistor of the first sub-light control unit in the column direction and a size of the second electrode of the light control transistor of the second sub-light control unit in the column direction; an orthographic projection of an end of the second electrode of the light control transistor of the third sub-light control unit close to the third pixel electrode on the main surface of the first substrate is overlapped with an orthographic projection of the third pixel electrode on the main surface of the first substrate, a part extending along the column direction of the orthographic projection of the second electrode of the light control transistor of the third sub-light control unit on the main surface of the first substrate is also overlapped with an orthographic projection of the second pixel electrode on the main surface of the first substrate.

For example, in the display panel provided by at least one embodiment of the present disclosure, an area of the orthographic projection of the first pixel electrode on the main surface of the first substrate is smaller than an area of the orthographic projection of the second pixel electrode on the main surface of the first substrate, and the area of the orthographic projection of the second pixel electrode on the main surface of the first substrate is smaller than an area of the orthographic projection of the third pixel electrode on the main surface of the first substrate.

For example, in the display panel provided by at least one embodiment of the present disclosure, the sub-pixel corresponding to the first sub-light control unit emits red light, the sub-pixel corresponding to the second sub-light control unit emits green light, and the sub-pixel corresponding to the third sub-light control unit emits blue light.

For example, in the display panel provided by at least one embodiment of the present disclosure, the liquid crystal panel comprises a second substrate and a third substrate opposite to the second substrate, both the second substrate and the third substrate are stacked with the display substrate in a direction perpendicular to the main surface of the first substrate, the third substrate is located on a side of the second substrate away from the first substrate, the liquid crystal molecules are sandwiched between the second substrate and the third substrate, the light control transistor is located on the second substrate; the pixel electrode is located on the second substrate, and the common electrode is located on the third substrate; or, the pixel electrode is located on the third substrate, and the common electrode is located on the second substrate.

At least one embodiment of the present disclosure further provides a display device, and the display device includes any one of the display panels provided by the embodiments of the present disclosure.

At least one embodiment of the present disclosure further provides a control method of a display panel. The control method includes: utilizing at least part of the sub-light control units of the plurality of sub-light control units of the light control panel to modulate the light emitted from the first opening, so that the light emitted from the first opening passes through the second openings of at least part of the sub-light control units in the plurality of sub-light control units and then emit from the display panel.

For example, in the display panel provided by at least one embodiment of the present disclosure, the display panel comprises a first edge display region close to a first edge of the display panel, a second edge display region close to a second edge of the display panel, and a middle display region located between the first edge display region and the second edge display region, and the first edge is opposite to the second edge; in a direction perpendicular to ground, a distance from the first edge display region to an eye box of an observer of the display panel is less than a distance from the second edge display region to the eye box of the observer of the display panel; the control method comprises: controlling a deflection direction of the light emitted from the first opening in the first edge display region after being modulated by the sub-light control unit to be opposite to a deflection direction of the light emitted from the first opening in the second edge display region after being modulated by the sub-light control unit, and controlling the light emitted from the first opening in the middle display region not to be deflected after being modulated by the sub-light control unit.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

FIGS. 6A to 11A are partial schematic diagrams of each layer of a display substrate provided by an embodiment of the present disclosure.

DETAILED DESCRIPTION

Figure 1A:
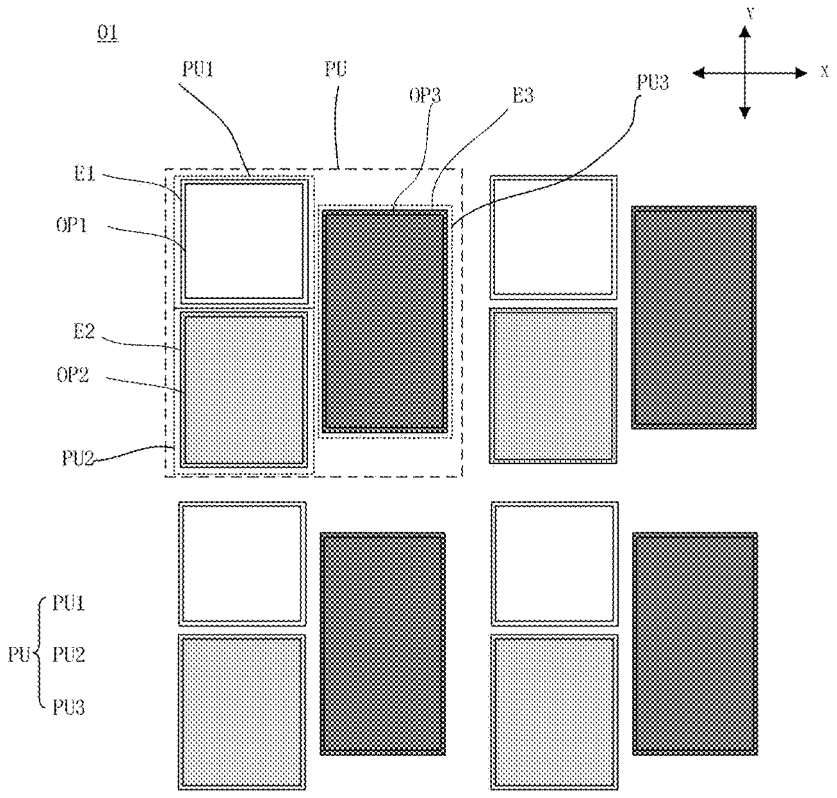
FIG. 1A is a partial planar schematic diagram of a display substrate in a display panel provided by an embodiment of the present disclosure.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases “connect”, “connected”, etc., are not intended to define a physical connection or mechanical connection, but may include an electrical connection, directly or indirectly. “On,” “under,” “left,” “right” and the like are only used to indicate relative position relationship, and when the position of the described object is changed, the relative position relationship may be changed accordingly.

When the quantity of a component is not specified in the following embodiments of the present disclosure, it means that the component can be one or more, or it can be understood as at least one. The term “at least one” means one or more, and “plurality” means at least two.

The term “arranged in a same layer” in the embodiments of the present disclosure refers to a relationship among a plurality of layers formed by performing a same step (for example, a same patterning process) on a film made of a same material. The term “arranged in a same layer” here does not always mean that thicknesses of the multiple layers are the same or heights of the multiple layers in a cross-sectional schematic diagram are the same.

The terms “substantially overlapped” used in the present disclosure include certain errors, taking into account the errors in measurements and associated with the measurement of specific quantities (for example, limitations of the measurement system), the terms “substantially overlapped” means being within an acceptable range of deviation for a particular value as determined by one of ordinary skilled in the art. For example, “basically” can mean within one or more standard deviations, unless otherwise specified, “basically” can mean within a deviation range of 10% or 5% of the stated value.

At least one embodiment of the present disclosure provides a display panel, which includes a display substrate and a light control panel. The display substrate includes a first substrate and a plurality of sub-pixels arranged on a main surface of the first substrate, each of the plurality of sub-pixels has a first opening, the light used to generate the display image is emitted from the first opening; the light control panel and the display substrate are stacked in a direction perpendicular to the main surface of the first substrate, the light control panel includes a plurality of sub-light control units, each of the plurality of sub-light control units has a second opening, the plurality of sub-light control units correspond to the plurality of sub-pixels in a one-to-one correspondence, the light emitted from the first opening passes through the second openings of at least part of the sub-light control units in the plurality of sub-light control units and then emits from the display panel, the at least part of the sub-light control units in the plurality of sub-light control units is configured to modulate light emitted from the first opening; an orthographic projection of a second opening of each of the sub-light control units on the main surface of the first substrate is substantially overlapped with an orthographic projection of the first opening of the corresponding sub-pixel on the main surface of the first substrate.

At least one embodiment of the present disclosure further provides a display device, and the display device includes any one of the display panels provided by the embodiments of the present disclosure.

At least one embodiment of the present disclosure further provides a control method of a display panel. The control method includes: utilizing at least part of the sub-light control units of the plurality of sub-light control units of the light control panel to modulate the light emitted from the first opening, so that the light emitted from the first opening passes through the second openings of at least part of the sub-light control units in the plurality of sub-light control units and then emit from the display panel.

Figure 1B:
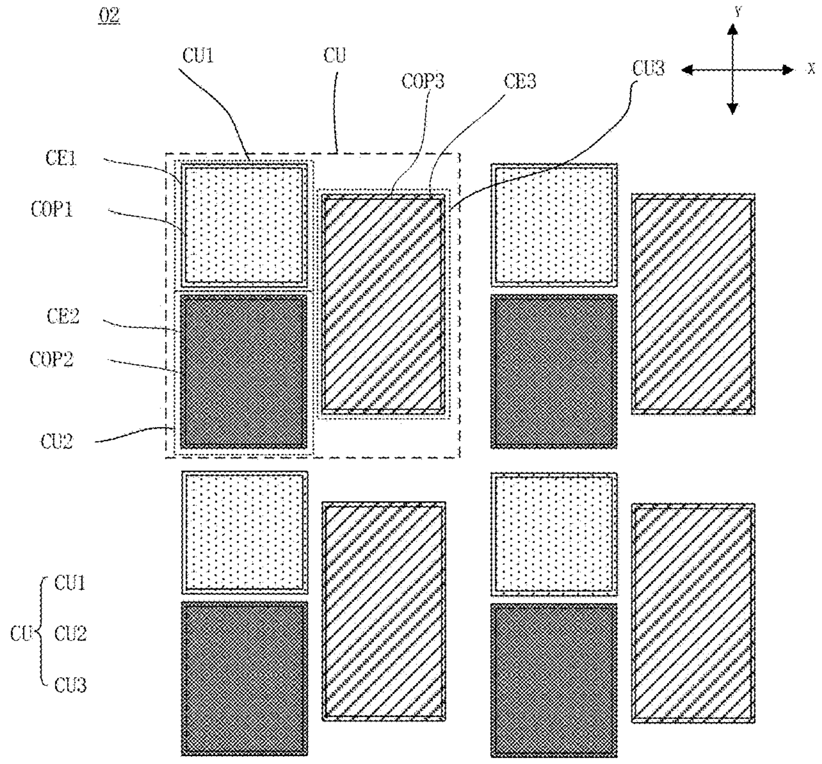
FIG. 1B is a partial planar schematic diagram of a light control panel stacked with the display substrate shown in FIG. 1A in a display panel provided by an embodiment of the present disclosure.
Figure 1C:
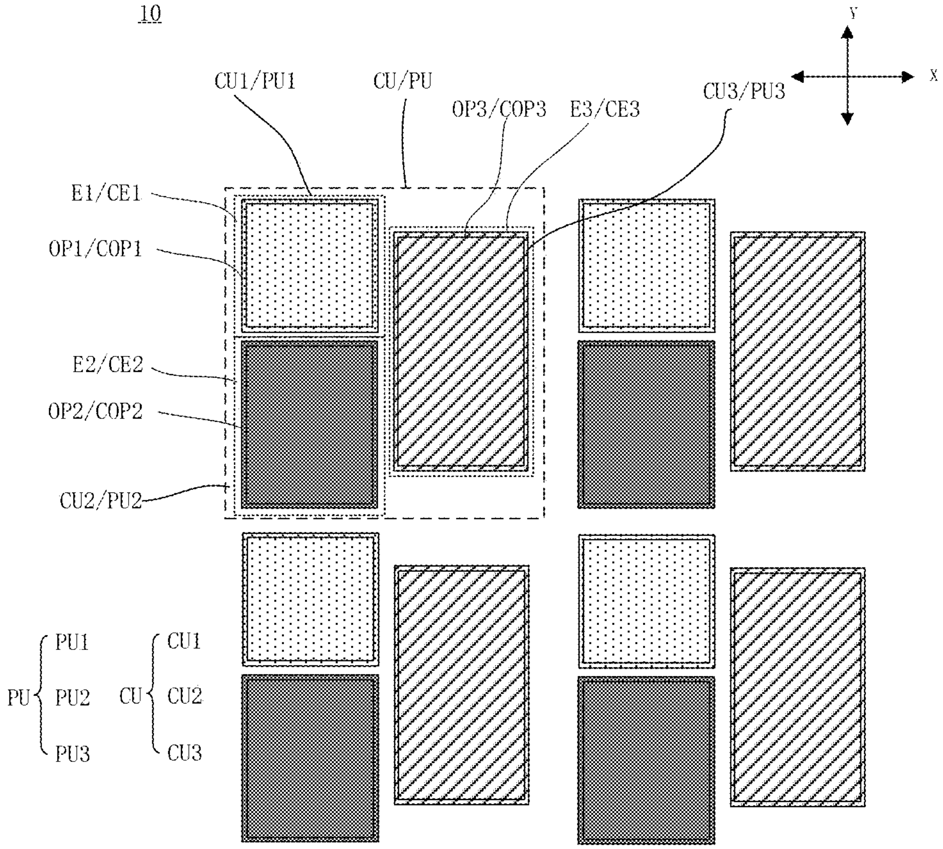
FIG. 1C is a partial planar schematic diagram of a display panel provided by an embodiment of the present disclosure, the display panel includes the display substrate shown in FIG. 1A and the light control panel shown in FIG. 1B that are stacked with each other.
Figure 2:
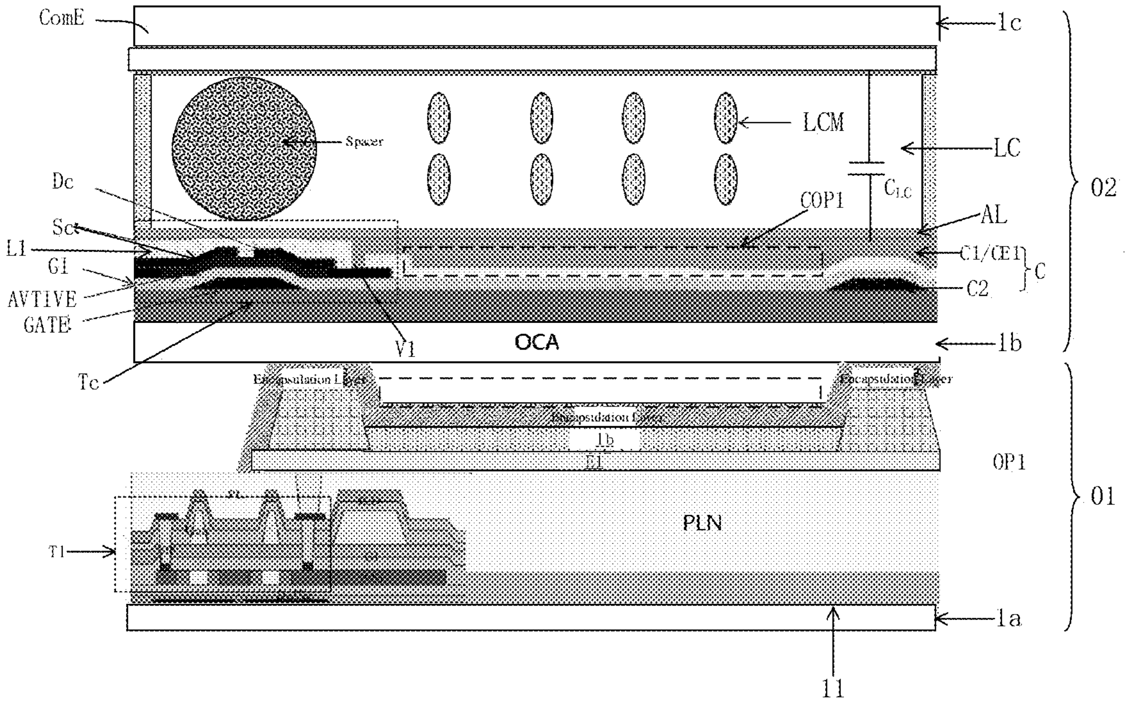
FIG. 2 is a cross-sectional schematic diagram of a sub-light control unit and the sub-pixel corresponding thereto of the display panel shown in FIG. 1C.

Exemplarily, FIG. 1A is a partial planar schematic diagram of a display substrate in a display panel provided by an embodiment of the present disclosure, FIG. 1B is a partial planar schematic diagram of a light control panel stacked with the display substrate shown in FIG. 1A in a display panel provided by an embodiment of the present disclosure; FIG. 1C is a partial planar schematic diagram of a display panel provided by an embodiment of the present disclosure, the display panel includes the display substrate shown in FIG. 1A and the light control panel shown in FIG. 1B that are stacked with each other, and FIG. 2 is a cross-sectional schematic diagram of a sub-light control unit and the sub-pixel corresponding thereto of the display panel shown in FIG. 1C. As shown in FIGS. 1A to 1C and FIG. 2, the display panel 10 includes a display substrate 01 and a light control panel 02. The display substrate 01 includes a first substrate 1*a* and a plurality of sub-pixels PU1/PU2/PU3 arranged on the main surface 11 of the first substrate 1*a*. Each of the plurality of sub-pixels PU1/PU2/PU3 has a first opening. For example, the plurality of sub-pixels PU1/PU2/PU3 are arranged in a pixel array; the pixel array includes a plurality of pixel units PU arranged in an array, a pixel unit PU includes a plurality of sub-pixels PU1/PU2/PU3 arranged continuously; the pixel array includes pixel rows extending along the row direction X and pixel columns extending along the column direction Y, the row direction X is intersected with the column direction Y, each of the pixel rows and each of the pixel columns include a plurality of pixel units PU. For example, each of the pixel units PU includes a first sub-pixel PU1, a second sub-pixel PU2 and a third sub-pixel PU3, the light used to generate the display image is emitted from the first opening of the display substrate 01 to the light control panel 02. For example, the first sub-pixel PU1 has a first opening OP1, the second sub-pixel PU2 has a first opening OP2, and the third sub-pixel PU3 has a first opening OP3.

As shown in FIG. 2, the light control panel 02 and the display substrate 01 are stacked in a direction perpendicular to the main surface 11 of the first substrate 1*a*, and the light control panel 02 includes a plurality of sub-light control units CU1/CU2/CU3, each of the plurality of sub-light control units CU1/CU2/CU3 has a second opening. For example, the plurality of sub-light control units CU1/CU2/CU3 are arranged in a light control array; the light control array includes a plurality of light control units CU arranged in an array, each of the light control units CU includes a plurality of continuously arranged sub-light control units CU1/CU2/CU3; for example, each of the light control units CU includes a first sub-light control unit CU1, a second sub-light control unit CU2, and a third sub-light control unit CU3; the first sub-light control unit CU1 has a second opening COP1, the second sub-light control unit CU2 has a second opening COP2, and the third sub-light control unit CU3 has a second opening COP3. The light control array includes a light control row extending along the row direction X and a light control column extending along the column direction Y, both the light control row and the light control column include a plurality of light control units CU. The plurality of sub-light control units CU1/CU2/CU3 of the light control panel 02 are in one-to-one correspondence with the plurality of sub-pixels PU1/PU2/PU3 of the display substrate 01. The light emitted from the first opening passes through the second openings of at least part of the sub-light control units CU1/CU2/CU3 and then emits from the display panel 10, and the at least part of the plurality of sub-light control units CU1/CU2/CU3 are configured to modulate the light emitted from the first opening. The orthographic projection of the second opening of each sub-light control unit on the main surface 11 of the first substrate 1*a* is substantially overlapped with the orthographic projection of the first opening of the corresponding sub-pixel on the main surface 11 of the first substrate 1*a*. For example, the orthographic projection of the second opening COP1 of the first sub-light control unit CU1 on the main surface 11 of the first substrate 1*a* is substantially overlapped with the orthographic projection of the first opening OP1 of the first sub-pixel PU1 on the main surface 11 of the first substrate 1*a*; the orthographic projection of the second opening COP2 of the second sub-light control unit CU2 on the main surface 11 of the first substrate 1*a* is substantially overlapped with the orthographic projection of a first opening OP2 of the second sub-pixel PU2 on the main surface 11 of the first substrate 1*a*; the orthographic projection of the second opening COP3 of the third sub-light control unit CU3 on the main surface 11 of the first substrate 1*a* is substantially overlapped with the orthographic projection of the first opening OP3 of the third sub-pixel PU3 on the main surface 11 of the first substrate 1*a*. In this way, while adjusting the direction of the light emitted from the display substrate 01, the aperture ratio of the entire display panel 10 can be increased, and the reduction of the light extraction rate of the display substrate 01 caused by the installation of the light control panel 02 can be avoided or reduced.

Of course, here the case where each of the light control units includes three sub-light control units and each pixel includes three sub-pixels is taken as an example. In other embodiments, the number of sub-light control units included in each light control unit and the number of sub-pixels included in each pixel are not limited to 3, or may be less than three or more than three, and those skilled in the art can select according to specific needs.

For example, a liquid crystal panel includes a light control driving circuit, the light control driving circuit is configured to independently control modulation of the light from the display substrate 01 in a plurality of regions of the liquid crystal panel, so that independent dimming in different areas can be achieved.

For example, the ratio of the area of the part of the second opening of each light control unit in the sub-light control units CU1/CU2/CU3 of which part the orthographic projection on the main surface 11 of the first substrate 1*a* is overlapped with the orthographic projection of the first opening of the corresponding sub-pixel on the main surface 11 of the first substrate 1*a* to the area of the orthographic projection of the first opening of the corresponding sub-pixel on the main surface 11 of the first substrate 1*a* is greater than or equal to 80%, to ensure that the entire display panel 10 has a high aperture ratio while adjusting the direction of the light emitted from the display substrate 01, and to better avoid or reduce the reduction in the light extraction rate of the display substrate 01 caused by the installation of the light control panel 02.

For example, the orthographic projection of the second opening of each sub-light control unit on the main surface 11 of the first substrate 1*a* is completely coincided with the orthographic projection of the first opening of the corresponding sub-pixel on the main surface 11 of the first substrate 1*a*. For example, the orthographic projection of the second opening COP1 of the first sub-light control unit CU1 on the main surface 11 of the first substrate 1*a* is completely coincided with the orthographic projection of the first opening OP1 of the first sub-pixel PU1 on the main surface 11 of the first substrate 1*a*; the orthographic projection of the second opening COP2 of the second sub-light control unit CU2 on the main surface 11 of the first substrate 1*a* is completely coincided with an orthographic projection of the first opening OP2 of the second sub-pixel PU2 on the main surface 11 of the first substrate 1*a*; the orthographic projection of the second opening COP3 of the third sub-light control unit CU3 on the main surface 11 of the first substrate 1*a* is completely coincided with the orthographic projection of the first opening OP3 of the third sub-pixel PU3 on the main surface 11 of the first substrate 1*a*, to ensure that the display panel 10 has a higher aperture ratio, and to better modulate the light emitted from the display panel 10 and at the same time improve the light extraction rate of the display substrate 10.

For example, as shown in FIG. 2, the light control panel 02 is a liquid crystal panel, and the liquid crystal panel includes a second substrate 1*b*, a third substrate 1*c* opposite to the second substrate 1*b*, and a liquid crystal layer LC sandwiched between the second substrate 1*b* and the third substrate 1*c*, and the liquid crystal layer LC includes liquid crystal molecules LCM. The second substrate 1*b* and the third substrate 1*c* are both stacked with the display substrate 01 in the direction perpendicular to the main surface 11 of the first substrate 1*a*, the third substrate 1*c* is located on the side of the second substrate 1*b* away from the first substrate 1*a*, and the light control transistor Tc is located on the second substrate 1*b*; and each of the plurality of sub-light control units CU1/CU2/CU3 further includes a pixel electrode CE1, a common electrode ComE and a light control transistor Tc.

Figure 4A:
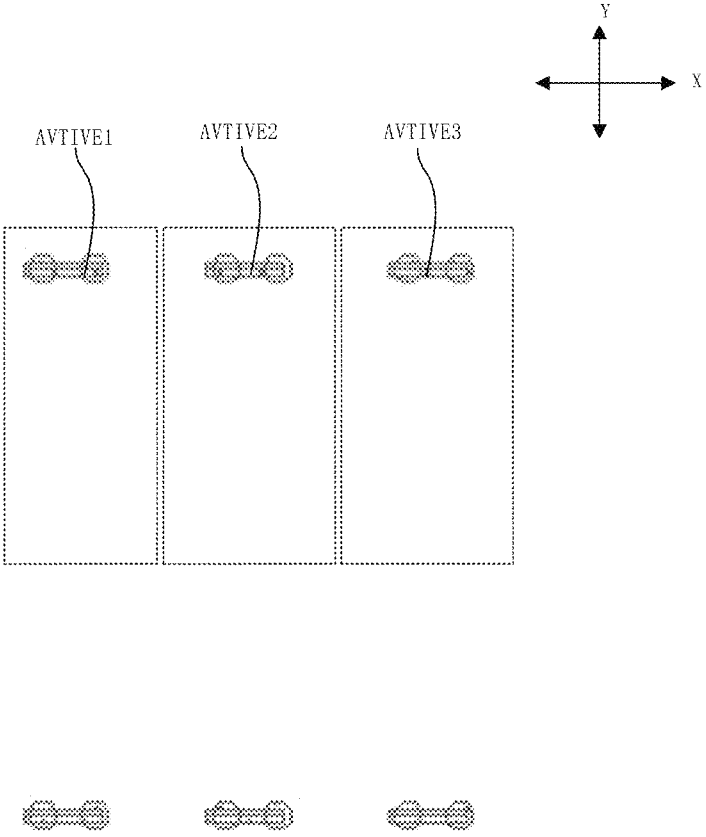
FIGS. 4A to 4H are layer schematic diagrams of a plurality of sub-light control units of the light control panel of the display panel provided by an embodiment of the present disclosure.
Figure 4B:
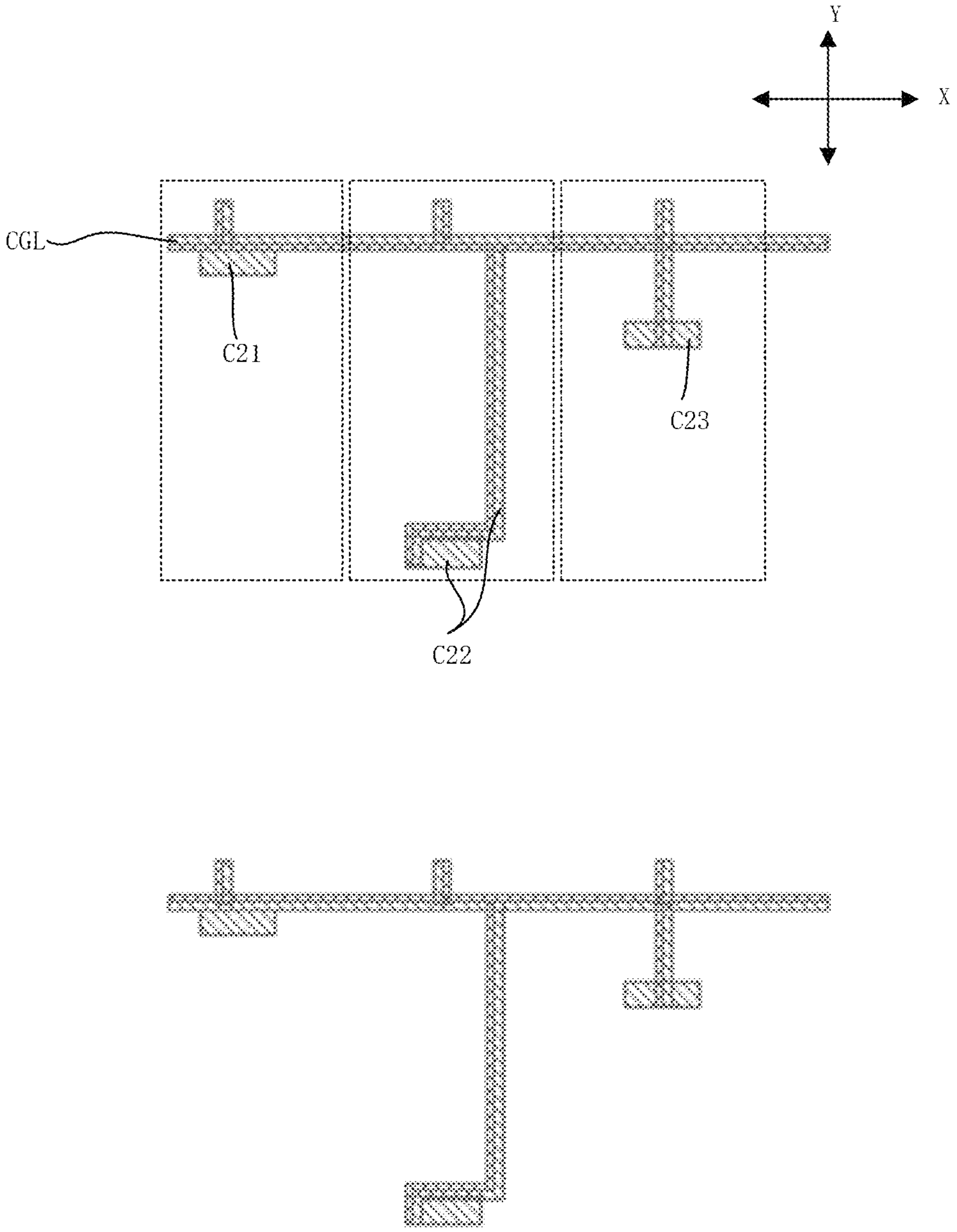
Figure 4C:
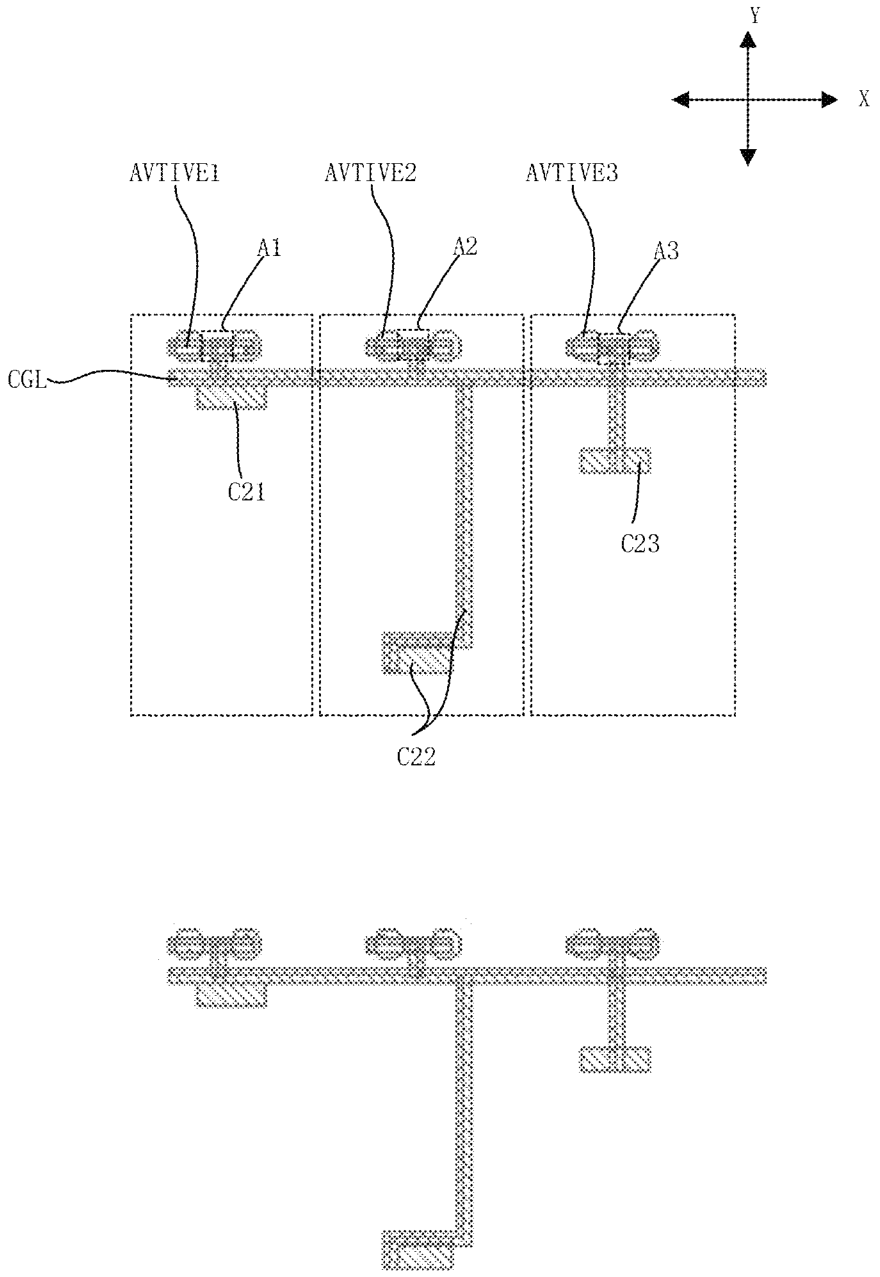
Figure 4D:
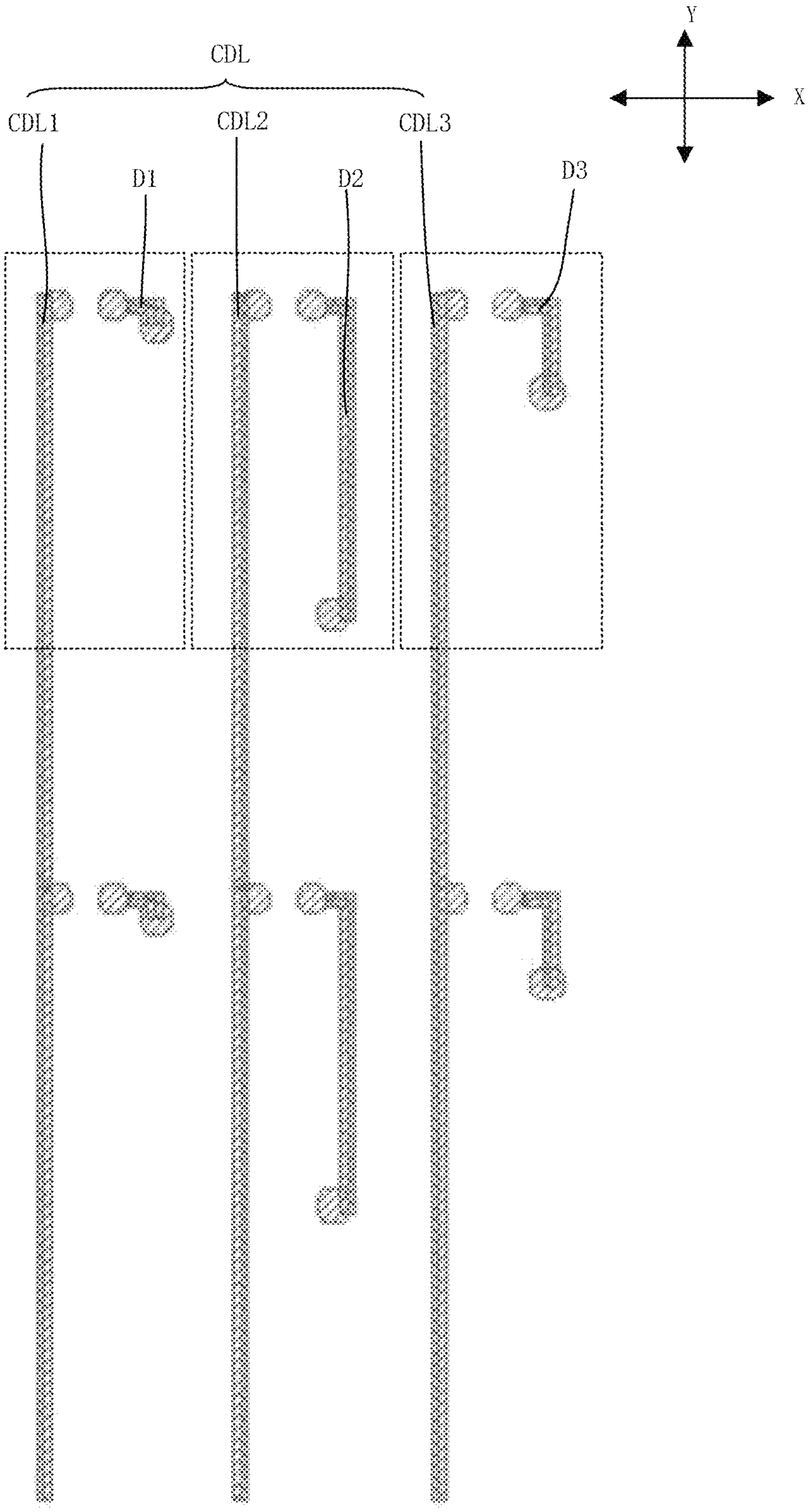
Figure 4E:
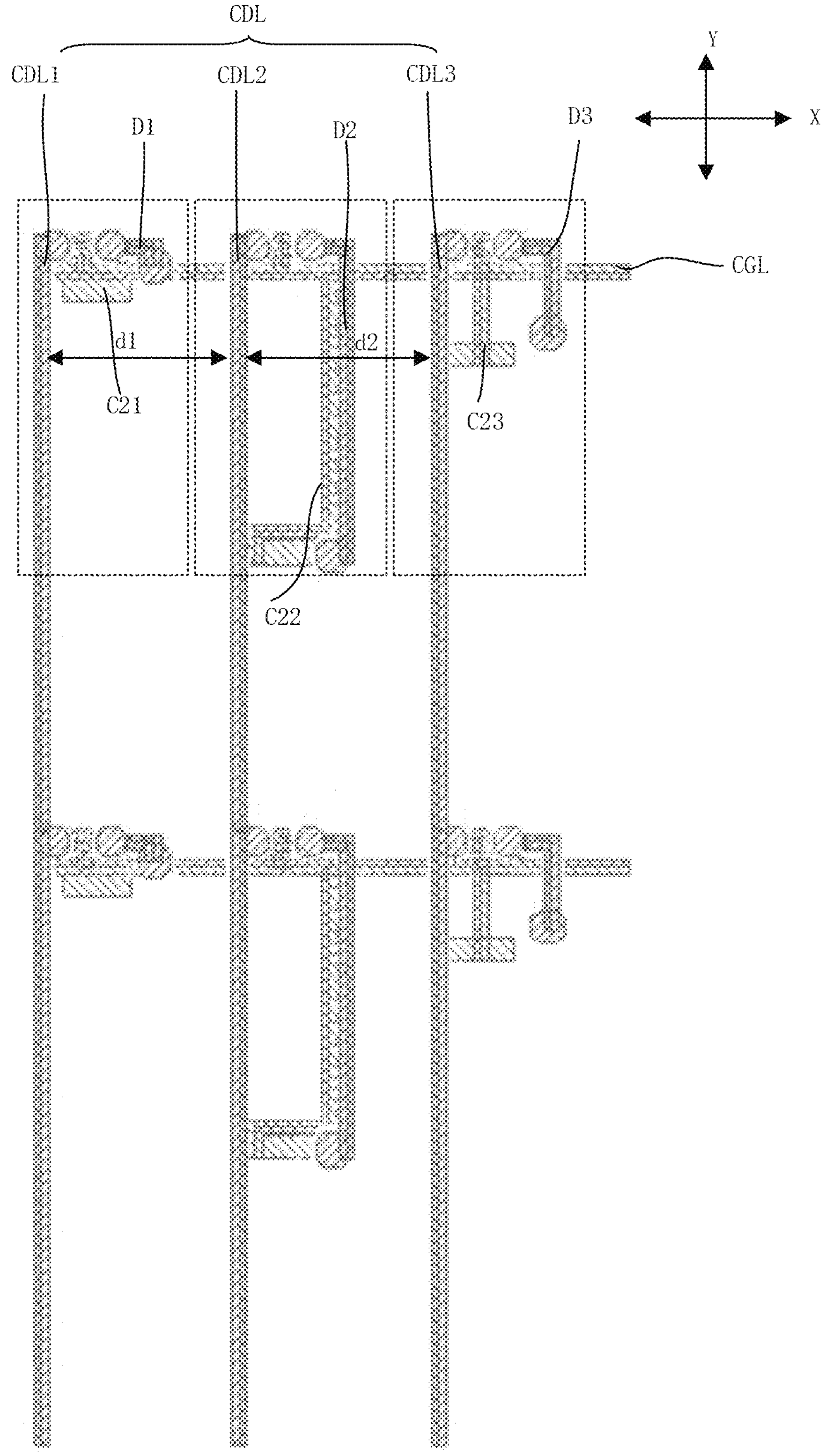
Figure 4F:
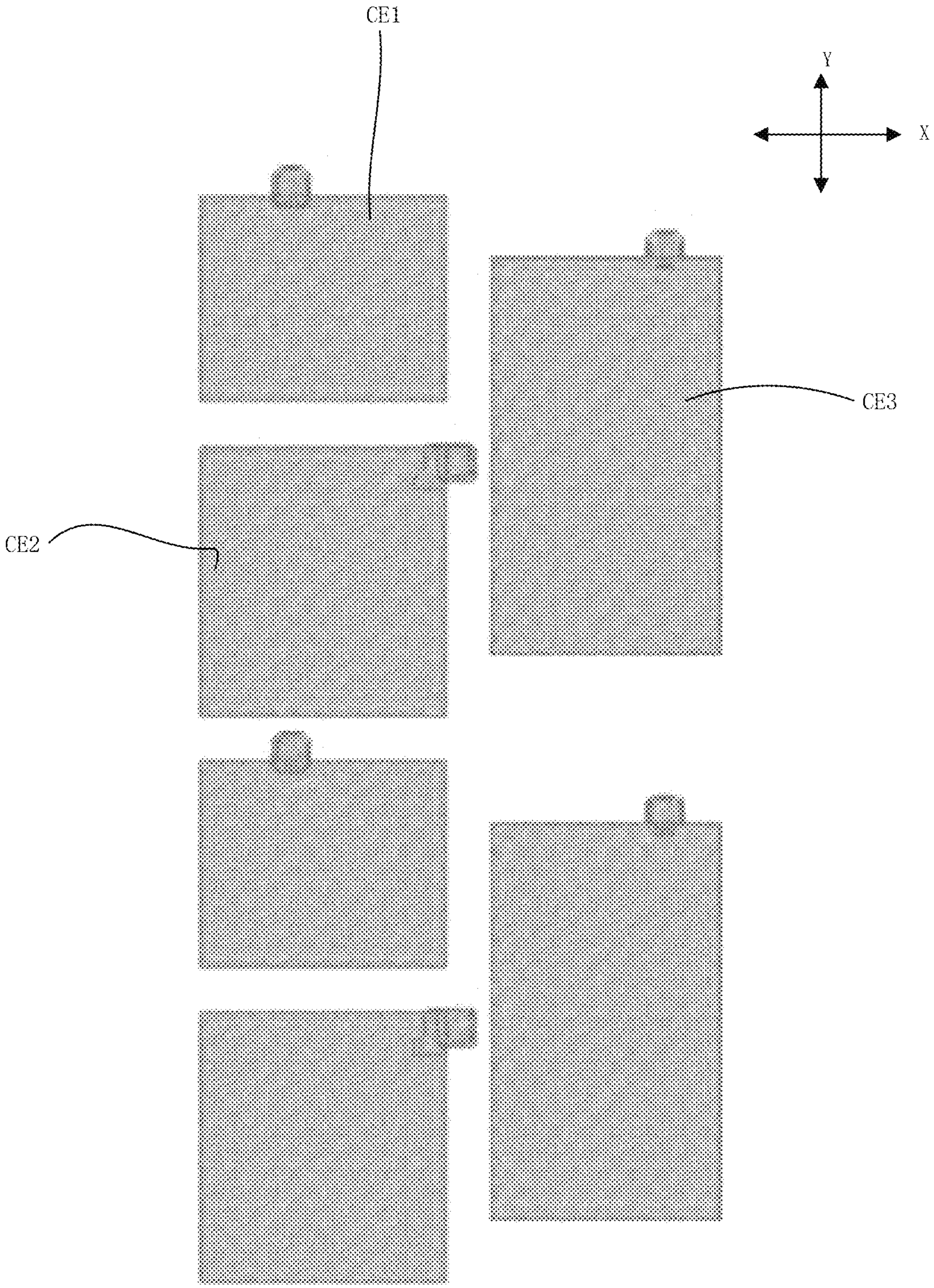
Figure 4G:
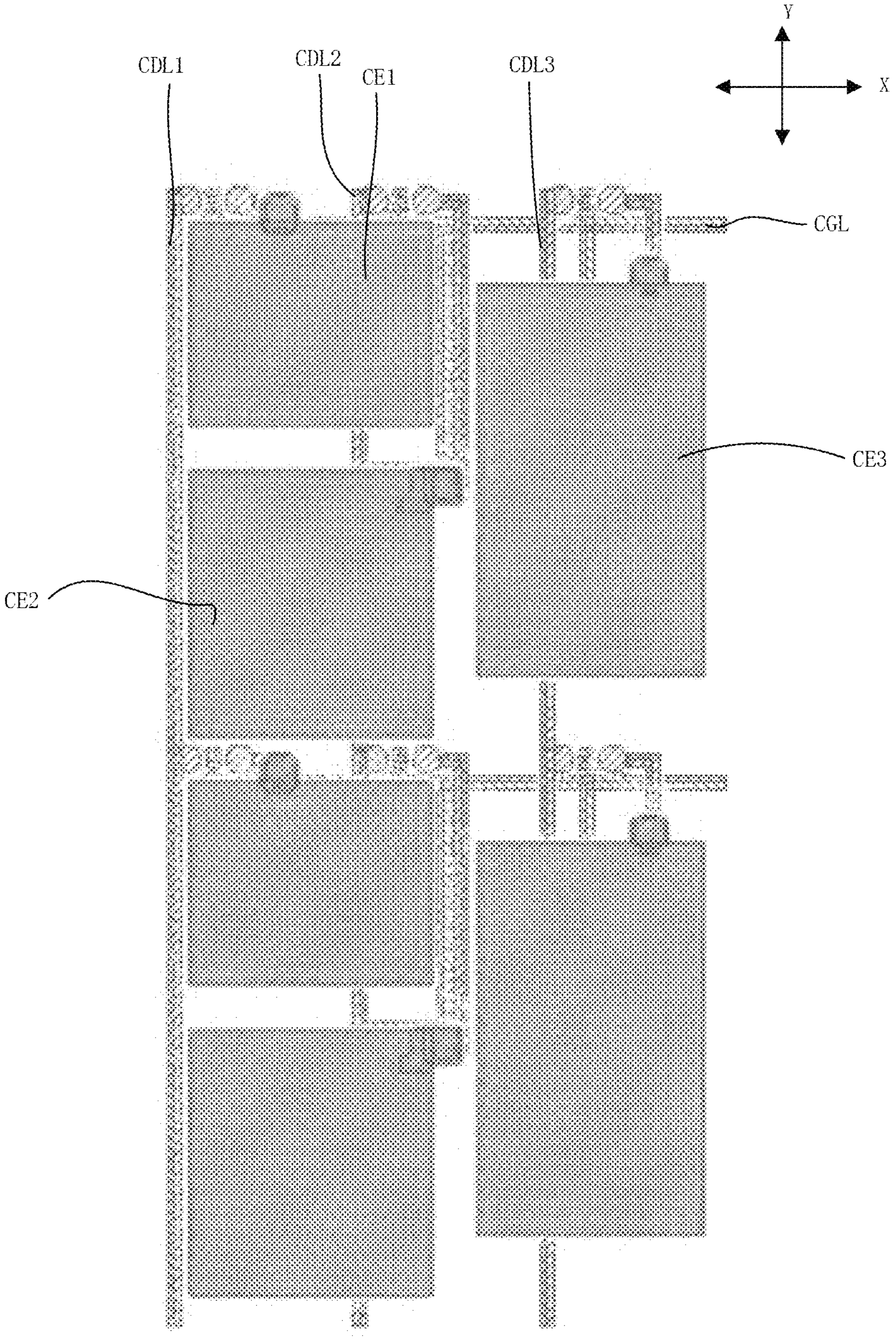
Figure 4H:
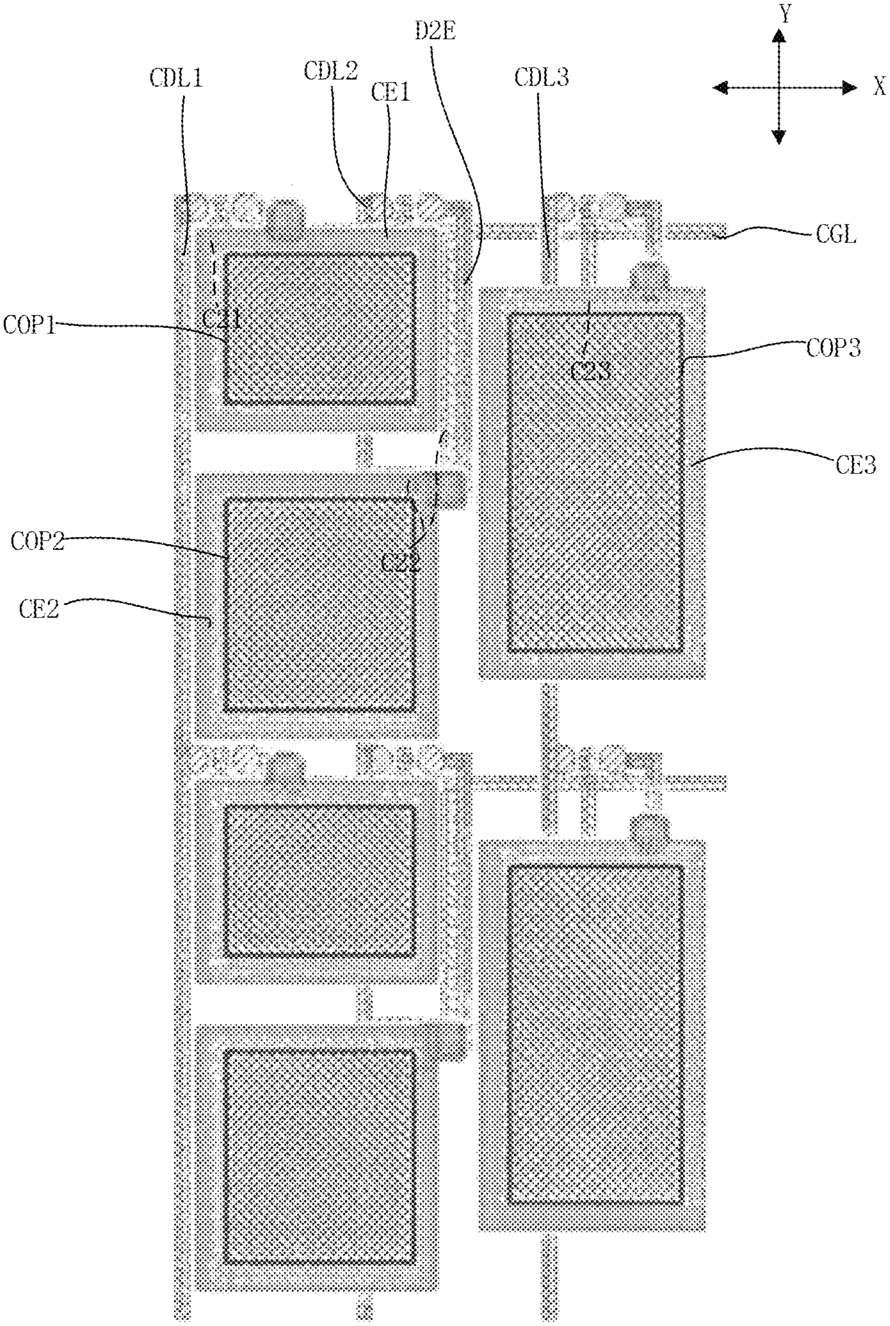
Figure 4I:
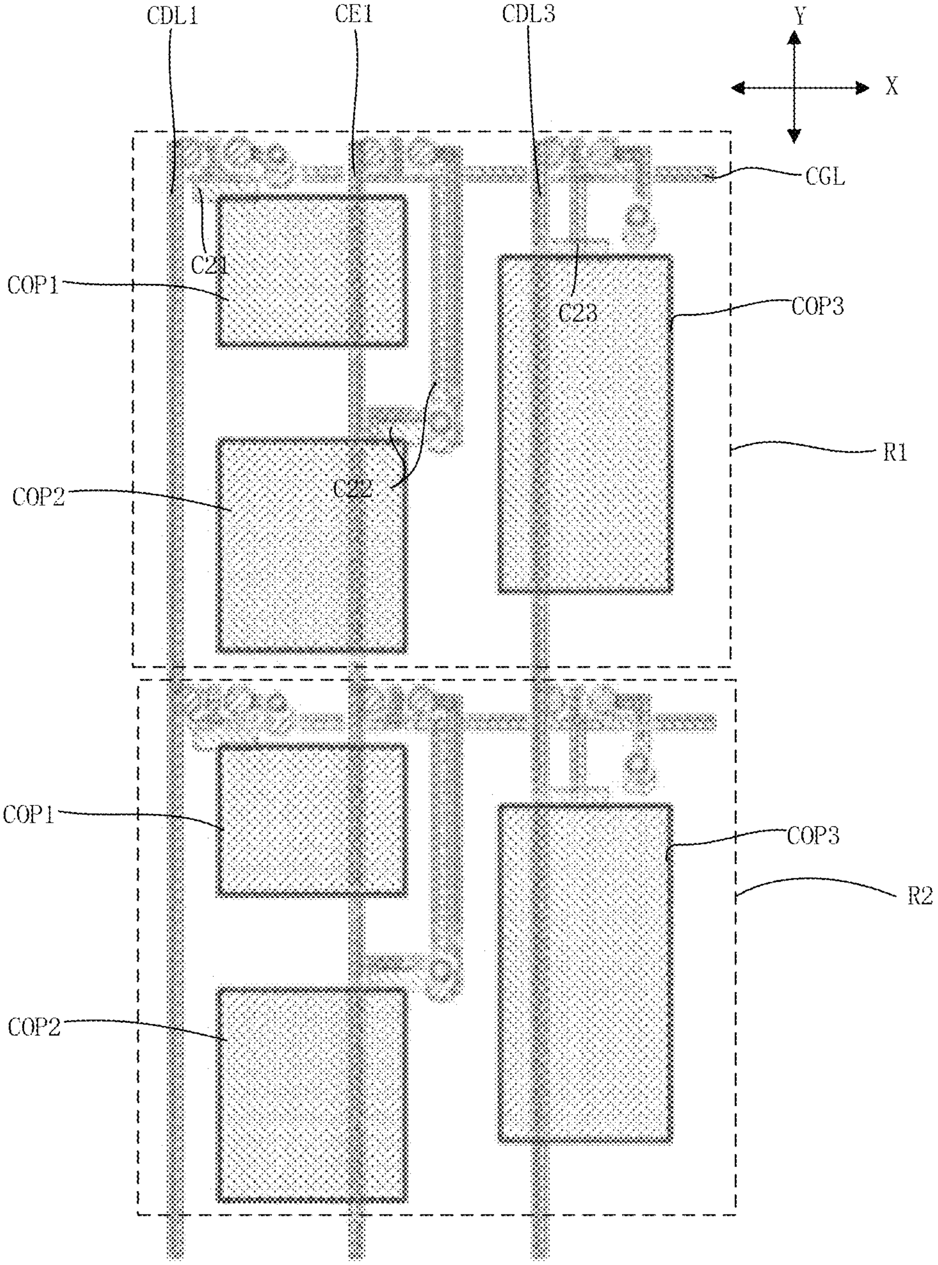
FIG. 4I is a structure after removing the pixel electrode in FIG. 4H.

FIGS. 4A to 4H are layer schematic diagrams of a plurality of sub-light control units of the light control panel of the display panel provided by an embodiment of the present disclosure; and FIG. 4I is a structure after removing the pixel electrode in FIG. 4H. As shown in FIGS. 4A to 4H, the light control panel 02 also includes a light control grating line CGL and a light control data line CDL. The light control gate line CGL extends along the row direction X, and is electrically connected with the gate electrode of the light control transistor Tc to provide the light control gate signal to the light control transistor Tc; and the light control data line CDL extends along the column direction Y, and is electrically connected with the first electrode Sc (for example, the source electrode) of the light control transistor Tc to provide the light control data signal to the light control transistor Tc.

Figure 3:
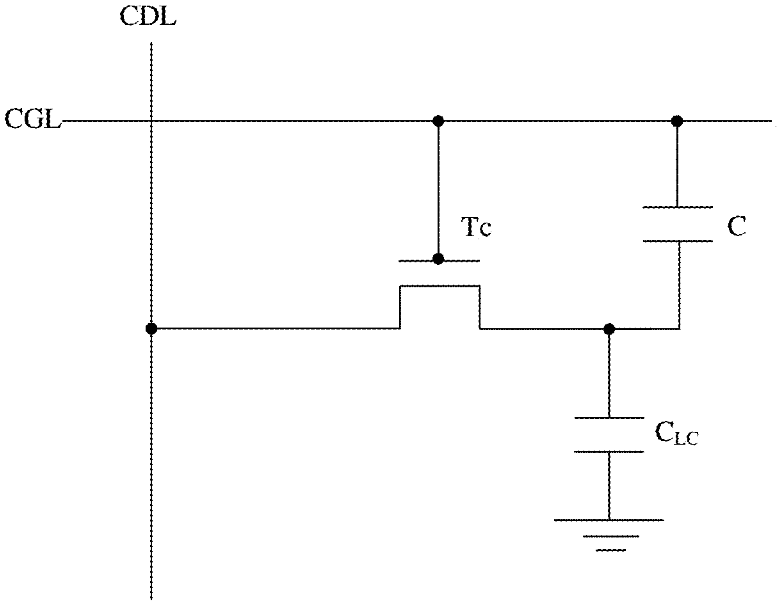
FIG. 3 is a circuit diagram of a sub-light control unit of a display panel provided by an embodiment of the present disclosure.

Combining the light control driving circuit diagram of the light control unit shown in FIG. 3 and FIG. 2, taking a sub-light control unit such as the first sub-light control unit CU1 as an example, the second electrode Dc (such as the drain electrode) of the light control transistor Tc is electrically connected with the pixel electrode, to charge the pixel electrode in a case that the light control transistor Tc is in a conductive state; the liquid crystal molecules LCM are configured to rotate under an action of the electric field between the pixel electrode and the common electrode ComE, to modulate light emitted from the first opening, the modulating of the light emitted from the first opening herein includes adjusting the light emitting direction and/or light intensity; the common electrode ComE and the pixel electrode and the liquid crystal layer LC together form a liquid crystal capacitor CLC. After the pixel electrode is charged, an electric field is formed between the common electrode ComE and the pixel electrode to control rotation of the liquid crystal molecules LCM in the liquid crystal layer LC. That is, the light control gate line CGL and the light control data line CDL are configured to distribute light control gate signals and light control data signals for driving the rotation of the liquid crystal molecules LCM in the light control unit of the light control panel 02, to realize an adjustment of the emitting angle or intensity of the light emitted from the display substrate 01 by the light control panel 02.

As shown in FIG. 2, each of the light control transistors also includes a gate electrode GATE and a semiconductor layer ACTIVE, and the liquid crystal panel 02 also includes a gate insulating layer GI located between the gate electrode GATE and the semiconductor layer ACTIVE. These structures can be designed with reference to conventional techniques in the art.

For example, as shown in FIG. 2, the liquid crystal panel 02 also includes an alignment layer AL, to control initial orientation of the liquid crystal molecules, setting of the alignment layer AL and other components of the liquid crystal panel not mentioned can refer to conventional techniques.

Referring to FIG. 1B and FIG. 2, the pixel electrode connected with the second electrode Dc (D1 in FIG. 4D) of the light control transistor Tc of the first sub-light control unit CU1 is a first pixel electrode CE1, the pixel electrode connected with the second electrode Dc (D2 in FIG. 4D) of the light control transistor Tc of the second sub-light control unit CU2 is a second pixel electrode CE2, and the second electrode Dc (D3 in FIG. 4D) of the light control transistor Tc of the third sub-light control unit CU3 is a third pixel electrode CE3. As shown in FIG. 1B, in each of the sub-light control units, the second opening exposes at least part of the pixel electrode. For example, the second opening COP1 of the first sub-light control unit CU1 exposes a part of the first pixel electrode CE1, the second opening COP2 of the second sub-light control unit CU2 exposes a part of the second pixel electrode CE2, the second opening COP3 of the third sub-light control unit CU3 exposes a part of the third pixel electrode CE3. For example, in each of the sub-light control units, an area of the pixel electrode is larger than an area of the second opening; for example, in each of the sub-pixels, an area of the first electrode is larger than an area of the first opening.

Figure 5:
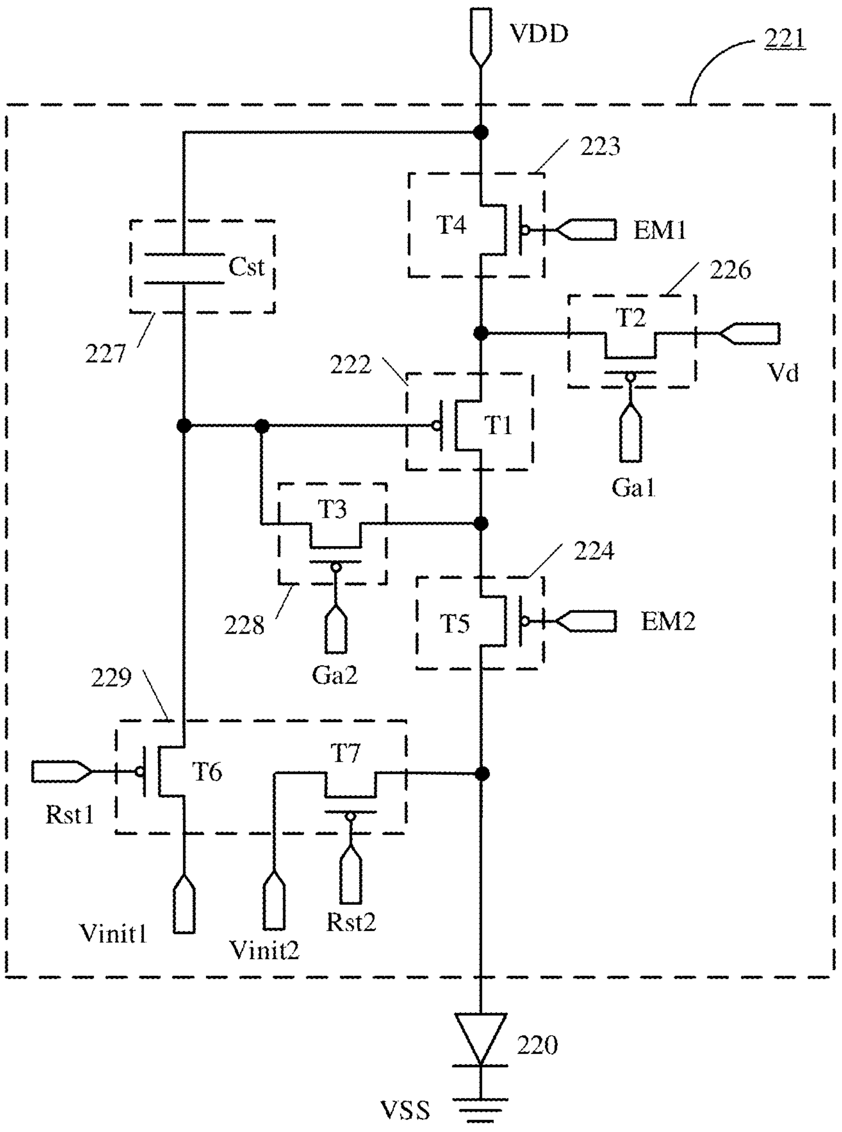
FIG. 5 is a circuit schematic diagram of a pixel circuit provided by an embodiment of the present disclosure.

For example, as shown in FIG. 5, each of the plurality of sub-pixels PU1/PU2/PU3 includes a driving transistor T1 and a light emitting element 220, the driving transistor T1 is configured to control magnitude of a driving current flowing through the light emitting element 220, and the light emitting element 220 is configured to receive the driving current and be driven by the driving current to emit light. For example, the light emitting element 220 is an organic light emitting element, the sub-pixel includes a pixel circuit that drives an organic light emitting element, and the pixel circuit includes a driving transistor T1 and a light emitting element 220. For example, as shown in FIG. 2, the organic light emitting element includes a first electrode E1, a second electrode (not shown in FIG. 2), and an organic light emitting material 1*b* located between the first electrode E1 and the second electrode. For example, the first electrode E1 is an anode, and the second electrode is a cathode, such as a common cathode.

For example, as shown in FIG. 1A, in each of the sub-pixels, the first opening exposes at least part of the first electrode. For example, the first opening OP1 of the first sub-pixel PU1 exposes the first electrode E1 of the first sub-pixel PU1, the first opening OP2 of the second sub-pixel PU2 exposes the first electrode E2 of the second sub-pixel PU2, and the first opening OP3 of the third sub-pixel PU3 exposes the first electrode E3 of the third sub-pixel PU3. As shown in FIG. 1C, an orthographic projection of the pixel electrode on the main surface 11 of the first substrate 1*a* is substantially coincided with an orthographic projection of the first electrode of the corresponding sub-pixel on the main surface 11 of the first substrate 1*a*, for example, an orthographic projection of the first pixel electrode CE1 of the first sub-light control unit CU1 on the main surface 11 of the first substrate 1*a* is substantially coincided with an orthographic projection of the first electrode E1 of the corresponding first sub-pixel PU1 on the main surface 11 of the first substrate 1*a*, an orthographic projection of the first pixel electrode CE2 of the second sub-light control unit CU2 on the main surface 11 of the first substrate 1*a* is substantially coincided with an orthographic projection of the corresponding first electrode E2 of the second sub-pixel PU2 on the main surface 11 of the first substrate 1*a*, and an orthographic projection of the first pixel electrode CE3 of the third sub-light control unit CU3 on the main surface 11 of the first substrate 1*a* is substantially coincided with an orthographic projection of the corresponding first electrode E3 of the third sub-pixel PU3 on the main surface 11 of the first substrate 1*a*. For example, a ratio of an overlapping area of the orthographic projection of the pixel electrode of each sub-light control unit on the main surface 11 of the first substrate 1*a* and the orthographic projection of the corresponding first electrode on the main surface 11 of the first substrate 1*a* to an area of the orthographic projection of the first electrode on the main surface 11 of the first substrate 1*a* is greater than or equal to 0.8, for example, 0.9 or 0.95. For example, preferably, the orthographic projection of the pixel electrode on the main surface 11 of the first substrate 1*a* is completely coincided with the orthographic projection of the first electrode of the corresponding sub-pixel on the main surface 11 of the first substrate 1*a*, that is, the ratio of the overlapping area of the orthographic projection of the pixel electrode of each sub-light control unit on the main surface 11 of the first substrate 1*a* and the orthographic projection of the corresponding first electrode on the main surface 11 of the first substrate 1*a* to the area of the orthographic projection of the first electrode on the main surface 11 of the first substrate 1*a* is 1, to maximize the aperture ratio of the display panel 10.

For example, the pixel electrode, the common electrode of the sub-light control unit, and the first electrode of each of the sub-pixels of the display substrate are all light-transmissive. For example, the materials of the pixel electrodes and common electrodes of the sub-light control unit can be transparent conductive materials, such as ITO and IZO. For example, the material of the first electrode may be a metal material, such as an anode material of a commonly used OLED light emitting device. The embodiments of the present disclosure do not specifically limit the material type of each electrode, and those skilled in the art can select according to needs.

For example, as shown in FIG. 2, the orthographic projection of the light control transistor Tc of each sub-light control unit on the main surface 11 of the first substrate 1*a* is not substantially overlapped with the orthographic projection of the first openings of the plurality of sub-pixels PU1/PU2/PU3 of the display substrate 01 on the main surface 11 of the first substrate 1*a*, and is not substantially overlapped with the orthographic projection of the second openings of the plurality of sub-light control units of the light control panel 02 on the main surface 11 of the first substrate 1*a*, that is, the orthographic projection of the light control transistor Tc of each of the sub-light control units on the main surface 11 of the first substrate 1*a* is not overlapped with the orthographic projection of the second opening of the sub-light control unit where the light control transistor Tc is located on the main surface 11 of the first substrate 1*a*, and is not overlapped with the orthographic projection of the first opening of the sub-pixel corresponding to the sub-light control unit on the main surface 11 of the first substrate 1*a*, to prevent the light control transistor from blocking the first opening and the second opening, and further improve the aperture ratio of the display panel 10. For example, a ratio of an overlapping area of the orthographic projection of the light control transistor Tc of each sub-light control unit on the main surface 11 of the first substrate 1*a* and the orthographic projection of the first openings of the plurality of sub-pixels PU1/PU2/PU3 of the display substrate 01 on the main surface 11 of the first substrate 1*a* to an area of the orthographic projection of the light control transistor Tc on the main surface 11 of the first substrate 1*a* is less than or equal to 0.2, for example, 0.1 or 0.05. For example, preferably, the entire front projection of the light control transistor Tc of each sub-light control unit on the main surface 11 of the first substrate 1*a* is not overlapped with the orthographic projections of the first openings of the plurality of sub-pixels PU1/PU2/PU3 of the display substrate 01 on the main surface 11 of the first substrate 1*a*, that is, a ratio of an overlapping area of the orthographic projection of the light control transistor Tc of each of the sub-light control units on the main surface 11 of the first substrate 1*a* and the orthographic projections of the first openings of the plurality of sub-pixels PU1/PU2/PU3 of the display substrate 01 on the main surface 11 of the first substrate 1*a* to an area of the orthographic projection of the light control transistor Tc on the main surface 11 of the first substrate 1*a* is 0, to maximize the aperture ratio of the display panel 10.

FIG. 4A shows that light control transistors Tc of a first sub-light control unit CU1, a second sub-light control unit CU2 and a third sub-light control unit CU3 included in a light control unit respectively includes a first semiconductor layer ACTIE1, a first semiconductor layer ACTIE2 and a third semiconductor layer ACTIE3.

FIG. 4B shows the light control gate line CGL, and the second electrode plates C21/C22/C23 of the light control storage capacitors of the first sub-light control unit CU1, the second sub-light control unit CU2 and the third sub-light control unit CU3.

FIG. 4C shows the stacked structure of FIG. 4A and FIG. 4B, the photo-control gate line CGL is overlapped with the first semiconductor layer ACTIE1, the first semiconductor layer ACTIE2 and the third semiconductor layer ACTIE3 respectively to form the channel regions A1/A2/A3 of the light control transistors Tc of the first sub-light control unit CU1, the second sub-light control unit CU2 and the third sub-light control unit CU3.

FIG. 4D shows the light control data line CDL, and the second electrodes D1/D2/D3 of the light control transistor Tc of the first sub-light control unit CU1, the second sub-light control unit CU2 and the third sub-light control unit CU3; for example, the light control data line CDL and the second electrode D1/D2/D3 of the light control transistor Tc are arranged in a same layer.

FIG. 4E shows the stacked structure of FIG. 4C and FIG. 4D.

FIG. 4F shows the pixel electrodes CE1/CE2/CE3 of the first sub-light control unit CU1, the second sub-light control unit CU2 and the third sub-light control unit CU3.

FIG. 4G shows the stacked structure of FIG. 4E and FIG. 4F.

FIG. 4H shows a schematic diagram of FIG. 4G after superimposing the second openings COP1/COP2/COP3 of the first sub-light control unit CU1, the second sub-light control unit CU2, and the third sub-light control unit CU3.

FIG. 4I is the structure after removing the pixel electrode in FIG. 4H.

For example, as shown in FIG. 4I, an orthographic projection of the light control gate line CGL on the main surface 11 of the first substrate 1*a* is not overlapped with orthographic projections of the first openings of the plurality of sub-pixels PU1/PU2/PU3 of the display substrate 01 on the main surface 11 of the first substrate 1*a*, and is not overlapped with orthographic projections of the second openings of the plurality of sub-light control units CU1/CU2/CU3 of the light control panel 02 on the main surface 11 of the first substrate 1*a*, that is, an orthographic projection of each of the light control gate lines CGL on the main surface 11 of the first substrate 1*a* is not overlapped with orthographic projections of the second openings of all the sub-light control units that the light control gate line CGL providing light control gate signals on the main surface 11 of the first substrate 1*a*, and is not overlapped with orthographic projections of the first openings of the sub-pixels corresponding to all the sub-light control units on the main surface 11 of the first substrate 1*a*, so that the light control grating line CGL is prevented from blocking the first opening and the second opening, and the aperture ratio of the display panel 10 is further improved.

For example, as shown in FIG. 4I, the light control rows include a first light control row R1 and a second light control row R2 adjacent to each other, an orthographic projection of the light control gate line CGL that provides the light control gate signal with the first light control row R1 on the main surface 11 of the first substrate 1*a* and orthographic projections of the light control transistors Tc of the plurality of sub-light control units CU1/CU2/CU3 of the first light control row R1 on the main surface 11 of the first substrate 1*a* are all located among orthographic projections of the second openings COP1/COP2/COP3 of the plurality of sub-light control units CU1/CU2/CU3 of the first light control row R1 on the main surface 11 of the first substrate 1*a* and orthographic projections of the second openings of the plurality of sub-light control units COP1/COP2/COP3 of the second light control row R2 on the main surface 11 of the first substrate 1*a*, so that the light control gate line CGL is prevented from blocking the first opening and the second opening, and the aperture ratio of the display panel 10 is further improved, and the light control gate line CGL can be set up by rationally utilizing the space, to match positions of the plurality of first openings of the display substrate 01, and the light control gate line CGL can be set up by using a non-opening region of the display substrate 01 and a non-opening region of the light control panel 02.

For example, as shown in FIGS. 4H to 4I, each of the light control units includes a first edge extending along the column direction Y, the plurality of sub-light control units CU1/CU2/CU3 of each of the light control units are arranged in the row direction X and include an edge sub-light control unit closest to the first edge; an orthographic projection of the light control data line CDL1 located at the first edge and providing light control data signals to the edge sub-light control unit on the main surface 11 of the first substrate 1*a* is not overlapped with orthographic projections of the second openings of all sub-light control units of each of the light control units on the main surface 11 of the first substrate 1*a*, and is not overlapped with orthographic projections of the first openings of the sub-pixels corresponding to all sub-light control units on the main surface 11 of the first substrate 1_a_, so that the light control data line CDL located at the first edge of each light control unit avoids the first opening and the second opening, and thus the light control data line CDL located at the first edge of each light control unit is prevented.

For example, combining FIG. 2 and FIG. 3, each of the plurality of sub-light control units CU1/CU2/CU3 also includes a light control storage capacitor C, so that signal can be cached better and dimming effect can be optimized. The light control storage capacitor C includes a first electrode plate C1 and a second electrode plate C2. The first electrode plate C1 is a pixel electrode; the second electrode plate C2 is arranged in a same layer as the light control gate line CGL and is electrically connected with the light control gate line CGL that provides the light control gate signal to the sub-light control unit, for example, the second electrode plate C2 is placed in a same layer as the light control gate line CGL and forms an integrated structure with the light control gate line CGL that provides the light control gate signal to the sub-light control unit, so that the light control gate line and the second electrode plate of the light control storage capacitor are formed by performing a same patterning process on a same film layer, and the structure and manufacturing process of the display panel are simplified.

It should be noted that in the present disclosure, the plurality of structures that constitute an "integrated structure" refer to the plurality of structures being a continuous, seamless whole made of a same material, and the plurality of structures may be formed by performing a same patterning process on a same film layer.

For example, as shown in FIGS. 4B and 4G, for each of the sub-light control units, the second electrode plate C2 of the light control storage capacitor C protrudes from the light control gate line CGL along the column direction Y from the light control gate line CGL that is electrically connected with the light control storage capacitor C, and an orthographic projection of at least an end of the second electrode plate C2 away from the light control gate line CGL electrically connected with the end in the column direction Y on the main surface 11 of the first substrate 1_a_ is overlapped with an orthographic projection of the pixel electrode on the main surface 11 of the first substrate 1_a_. An orthographic projection of the second electrode plate C21 of the storage capacitor C of the first sub-light control unit CU1 on the main surface 11 of the first substrate 1_a_ is overlapped with an orthographic projection of the first pixel electrode CE1 on the main surface 11 of the first substrate 1_a_, an orthographic projection of the second electrode plate C22 of the storage capacitor C of the second sub-light control unit CU2 on the main surface 11 of the first substrate 1_a_ is overlapped with an orthographic projection of the second pixel electrode CE2 on the main surface 11 of the first substrate 1_a_, and an orthographic projection of the second electrode plate C23 of the storage capacitor C of the third sub-light control unit CU3 on the main surface 11 of the first substrate 1_a_ is overlapped with an orthographic projection of the third pixel electrode CE3 on the main surface 11 of the first substrate 1_a_.

For example, the plurality of sub-light control units CU1/CU2/CU3 of each of the light control units include a first sub-light control unit CU1, a second sub-light control unit CU2 and a third sub-light control unit CU3 that are arranged in sequence in the row direction X, and emitting colors of the sub-pixels corresponding to the first sub-light control unit CU1, the second sub-light control unit CU2 and the third sub-light control unit CU3 are different from each other. As shown in FIG. 4E, a distance between the light control transistor Tc of the first sub-light control unit CU1 and the light control transistor Tc of the second sub-light control unit CU2 in the row direction X is a first distance d1, and a distance in the row direction X between the light control transistor Tc of the second sub-light control unit CU2 and the light control transistor Tc of the third sub-light control unit CU3 is a second distance d2; a distance between the opposite sides of the light control data line CDL1 that provides the light control data signal to the first sub-light control unit CU1 and the light control data line CDL2 that provides the light control data signal to the second sub-light control unit CU2 opposite to each other is taken as the first distance d1. The distance between the opposite sides of the light control data line CDL2 that provides the light control data signal to the second sub-light control unit CU2 and the light control data line CDL3 that provides the light control data signal to the third sub-light control unit CU3 opposite to each other is taken as the second distance d2. The second distance d2 is not equal to the first distance d1. For example, the second distance d2 is greater than the first distance d1, to adapt to an arrangement of a plurality of sub-light control units of a light control unit and different sizes of the plurality of sub-light control units of a light control unit in the row direction.

As shown in FIG. 4E, in at least part of the sub-light control units, for example, in the second sub-light control unit, the second electrode plate C22 are also overlapped, for example, partially overlapped, with a second electrode D2 of the light control transistor Tc (in other embodiments, the entire second electrode plate C22 can be also overlapped with the second electrode D2 of the light control transistor Tc), so that another storage capacitor is formed, and the signal can be cached better and the dimming effect can be optimized.

For example, combining FIG. 4H and FIG. 4E, the first pixel electrode CE1 and the second pixel electrode CE2 are spaced apart in the column direction Y, a whole formed by the first pixel electrode CE1 and the second pixel electrode CE2 is aligned with the third pixel electrode CE3 in the row direction X; both the first pixel electrode CE1 and the second pixel electrode CE2 cover at least part of a space between the light control transistor Tc of the first sub-light control unit CU1 and the light control transistor Tc of the second sub-light control unit CU2 in the row direction X, and at least part of a space in the row direction X between the light control transistor Tc of the second sub-light control unit CU2 and the light control transistor Tc of the third sub-light control unit CU3, and the third pixel electrode CE3 covers at least part of a space in the row direction X between the light control transistor Tc of the second sub-light control unit CU2 and the light control transistor Tc of the third sub-light control unit CU3. For example, an area of an orthographic projection of the first pixel electrode CE1 on the main surface 11 of the first substrate 1_a_ is smaller than an area of an orthographic projection of the second pixel electrode CE2 on the main surface 11 of the first substrate 1_a_, and an area of the orthographic projection of the second pixel electrode CE2 on the main surface 11 of the first substrate 1_a_ is smaller than an area of an orthographic projection of the third pixel electrode CE3 on the main surface 11 of the first substrate 1_a_. In this way, the smaller first pixel electrode CE1 and the second pixel electrode CE2 arranged in the column direction correspond to the smaller first distance d1, and the larger third pixel electrode CE3 corresponds to the larger second distance. d2, so that the waste of space can be minimized, which is beneficial to realizing a high PPI display panel.

For example, as shown in FIG. 4D, the second pixel electrode CE2 is located on a side of the first pixel electrode CE1 in the column direction Y away from the gate line that provides the light control gate signal to the light control unit. A distance between the third pixel electrode CE3 in the column direction Y and the gate line that provides the light control gate signal to the light control unit is greater than a distance between the first pixel electrode CE1 in the column direction Y and the gate line that provides the light control gate signal to the light control unit; a length of the second electrode plate C22 of the light control storage capacitor C of the second sub-light control unit CU2 in the column direction Y is greater than the length of the second electrode plate C23 of the light control storage capacitor C of the third sub-light control unit CU3 in the column direction Y, and a length of the second electrode plate C23 of the light control storage capacitor C of the third sub-light control unit CU3 in the column direction Y is greater than the length of the second electrode plate C21 of the light control storage capacitor C of the first sub-light control unit CU1 in the column direction Y, to adapt to the positions of the first pixel electrode CE1, the second pixel electrode CE2 and the third pixel electrode CE3.

For example, as shown in FIG. 4G, a size of the third pixel electrode CE3 in the column direction Y is larger than a size of the second pixel electrode CE2 in the column direction Y, and is larger than a size of the first pixel electrode CE1 in the column direction Y; moreover, an orthographic projection of the third pixel electrode CE3 in the column direction Y is at least partially overlapped with an orthographic projection of the first pixel electrode CE1 in the column direction Y, and is at least partially overlapped with an orthographic projection of the second pixel electrode CE2 in the column direction Y.

For example, combining FIG. 4D and FIG. 4G, a light control transistor Tc of the first sub-light control unit CU1, a light control transistor Tc of the second sub-light control unit CU2, and a light control transistor Tc of the third sub-light control unit CU3 are basically arranged on a straight line extending along the row direction X, a size of a second electrode D2 of the light control transistor Tc of the second sub-light control unit CU2 in the column direction Y is larger than a size of a second electrode D3 of the light control transistor Tc of the third sub-light control unit CU3 in the column direction Y, the size of the second electrode D3 of the light control transistor Tc of the third sub-light control unit CU3 in the column direction Y is larger than a size of a second electrode D1 of the light control transistor Tc of the first sub-light control unit CU1 in the column direction Y, to adapt to the positions of the first pixel electrode CE1, the second pixel electrode CE2 and the third pixel electrode CE3, the second electrode D1, the second electrode D2, and the second electrode D3 are respectively used to be electrically connected with the first pixel electrode CE1, the second pixel electrode CE2, and the third pixel electrode CE3. For example, an electrical connection is through a first via hole V1 penetrating the first insulating layer L1 shown in FIG. 2. Moreover, a second electrode D1/D2/D3 of a light control transistor of each of the sub-light control units includes an extending part extending along the column direction, for example, a size of an extending part of the second electrode D1 in the column direction Y is larger than a size of an extending part of the second electrode D3 in the column direction Y, and the size of the extending part of the second electrode D3 in the column direction Y is larger than a size of an extending part of the second electrode D1 in the column direction Y.

For example, as shown in FIG. 4E and FIG. 4H, for each of the sub-light control units, an orthographic projection of the second electrode D1/D2/D3 of the light control transistor Tc on the main surface 11 of the first substrate 1*a* is not overlapped with an orthographic projection of the second opening on the main surface 11 of the first substrate 1*a*, to increase the aperture ratio of the display panel 10 as much as possible. The "not overlapped with" includes not overlapped at all, or an overlapping area of the two projections accounts for 5% to 10% of an area of the second opening. Preferably, the orthographic projection of the second electrode D1/D2/D3 of the light control transistor Tc on the main surface 11 of the first substrate 1*a* is not overlapped at all with the orthographic projection of the second opening on the main surface 11 of the first substrate 1*a*.

For example, as shown in FIG. 4H, an orthographic projection of the extending part D2E extending along the column direction Y of the second electrode D2 of the light control transistor Tc of the second sub-light control unit CU2 on the main surface 11 of the first substrate 1*a* is located between an orthographic projection of the second opening of the first sub-light control unit CU1 on the main surface 11 of the first substrate 1*a* and an orthographic projection of the second opening of the three-sub light control unit CU3 on the main surface 11 of the first substrate 1*a*, so that an extending part D2E is arranged in a non-display region between a whole formed by the first pixel electrode CE1 and the second pixel electrode CE2 and the third pixel electrode CE3, a positional relationship of the plurality of sub-light control units is utilized, and limited space is rationally utilized, so that the extending part D2E is prevented from blocking the first opening and the second opening, and the aperture ratio of the display panel 10 is further increased.

It should be noted that in the embodiment of the present disclosure, an arrangement of the plurality of first electrodes on the display substrate and an arrangement of the plurality of pixel electrodes on the light control panel are not limited to the above methods, which can be designed as needed, as long as the two orthographic projections are overlapped.

For example, as shown in FIG. 2, in a case that the light control panel 02 is a liquid crystal panel, the pixel electrode CE1 of the sub-light control unit and the common electrode ComE can be located on different substrates opposite to each other. For example, the pixel electrode CE1 of the sub-light control unit is located on the second substrate 1*b*, and the common electrode ComE is located on the third substrate 1*c*, or in some other embodiments, the pixel electrode is located on the third substrate 1*c*, and the common electrode ComE is located on the second substrate 1*b*. In this case, the pixel electrode CE1 can form a TN-type electric field with the common electrode ComE. In this embodiment, more space is provided to design the arrangement of the pixel electrode CE1, and arrangement freedom of the pixel electrode CE1 is relatively high, it is more conducive for the second opening of the light control panel 02 to coincide with the first opening of the display substrate 01 in a direction perpendicular to the main surface of the first substrate, and it is more conducive for the pixel electrode of the light control panel 02 to overlap with the first electrode of the display substrate 01 in a direction perpendicular to the main surface of the first substrate, and a higher overlap ratio can be easily achieved, so that the display panel 10 with a higher aperture ratio can be obtained.

Of course, the electric field of the light control panel 02 of the present disclosure is not limited to the TN type, in other embodiments, the pixel electrode CE1 of the sub-light control unit can also be located on a same substrate as the common electrode ComE, for example, both are located on the second substrate 1 *b*, for example, the pixel electrode CE1 and the common electrode ComE form an IPS type horizontal electric field.

Figure 7:
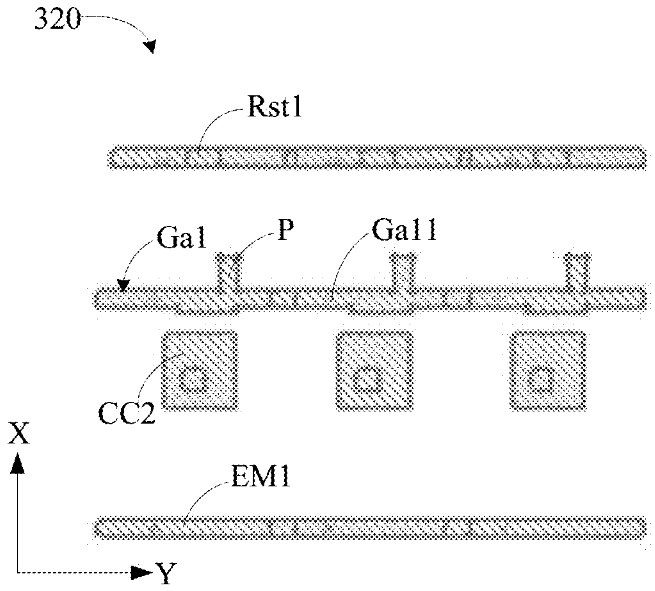

The display substrate 01 may not adopt the arrangement of the first electrodes Nov. 12, 2013 shown in FIG. 7, but may also adopt the arrangement of the first electrodes shown in FIG. 4H of the present disclosure.

For example, a structure of a sub-pixel of the display substrate 01 is introduced below. In one embodiment, as shown in FIG. 5, the pixel circuit 221 includes a driving circuit 222. The driving circuit 222 includes a control end, a first end and a second end, and is configured to provide the organic light emitting element 220 with a driving current that drives the organic light emitting element 220 to emit light.

In one embodiment, as shown in FIG. 5, the pixel circuit 221 includes a first light emitting control circuit 223 and a second light emitting control circuit 224. For example, the first light emitting control circuit 223 is connected with the first end of the driving circuit 222 and a first voltage end VDD, and is configured to enable a connection between the driving circuit 222 and the first voltage end VDD to be turned on or off, the second light emitting control circuit 224 is electrically connected with the second end of the driving circuit 222 and the first electrode of the organic light emitting element 220, and is configured to turn on or off a connection between the driving circuit 222 and the organic light emitting element 220.

In one embodiment, as shown in FIG. 5, the pixel circuit 221 also includes a data writing circuit 226, a storage circuit 227, a threshold compensation circuit 228, and a reset circuit 229. The data writing circuit 226 is electrically connected with the first end of the driving circuit 222, and is configured to write the data signal into the storage circuit 227 under the control of the scanning signal. The storage circuit 227 is electrically connected with the control end of the driving circuit 222 and the first voltage end VDD, and is configured to store the data signal. The threshold compensation circuit 228 is electrically connected with the control end and the second end of the driving circuit 222, and is configured to perform threshold compensation on the driving circuit 222. The reset circuit 229 is electrically connected with the control end of the driving circuit 222 and the first electrode of the organic light emitting element 220, and is configured to reset the control end of the driving circuit 222 and the first electrode of the organic light emitting element 220 under the control of the reset control signal.

In one embodiment, as shown in FIG. 5, the driving circuit 222 includes a driving transistor T1, and the control end of the driving circuit 222 includes a gate electrode of the driving transistor T1, the first end of the driver circuit 222 includes a first electrode of the driving transistor T1, and the second end of the driving circuit 222 includes a second electrode of the driving transistor T1.

In one embodiment, as shown in FIG. 5, the data writing circuit 226 includes a data writing transistor T2, and the storage circuit 227 includes a capacitor Cst, the threshold compensation circuit 228 includes a threshold compensation transistor T3, and the first light emitting control circuit 223 includes a first light emitting control transistor T4, the second light emitting control circuit 224 includes a second light emitting control transistor T5, and the reset circuit 229 includes a first reset transistor T6 and a second reset transistor T7, and the reset control signal may include a first sub-reset control signal and a second sub-reset control signal.

In one embodiment, as shown in FIG. 5, the first electrode of the data writing transistor T2 is electrically connected with the first electrode of the driving transistor T1, the second electrode of the data writing transistor T2 is configured to be electrically connected with the data line Vd to receive the data signal, the gate electrode of the data writing transistor T2 is configured to be electrically connected with the scanning signal line Ga1 to receive a scanning signal; the first electrode of the capacitor Cst is electrically connected with the first power supply end VDD, the second electrode of the capacitor Cst is electrically connected with the gate electrode of the driving transistor T1; the first electrode of the threshold compensation transistor T3 is electrically connected with the second electrode of the driving transistor T1, the second electrode of the threshold compensation transistor T3 is electrically connected with the gate electrode of the driving transistor T1, the gate electrode of the threshold compensation transistor T3 is configured to be electrically connected with the scanning signal line Ga2 to receive a compensation control signal; the first electrode of the first reset transistor T6 is configured to be electrically connected with the reset power end Vinit1 to receive a first reset signal, the second electrode of the first reset transistor T6 is electrically connected with the gate electrode of the driving transistor T1, and the gate electrode of the first reset transistor T6 is configured to be electrically connected with the reset control signal line Rst1 to receive a first sub-reset control signal; the first electrode of the second reset transistor T7 is configured to be electrically connected with the reset power end Vinit2 to receive a second reset signal, the second electrode of the second reset transistor T7 is electrically connected with the first electrode of the organic light emitting element 220, the gate electrode of the second reset transistor T7 is configured to be electrically connected with the reset control signal line Rst2 to receive a second sub-reset control signal; the first electrode of the first light emitting control transistor T4 is electrically connected with the first power supply end VDD, the second electrode of the first light emitting control transistor T4 is electrically connected with the first electrode of the driving transistor T1, and the gate electrode of the first light emitting control transistor T4 is configured to be electrically connected with the light emitting control signal line EM1 to receive a first light emitting control signal; the first electrode of the second light emitting control transistor T5 is electrically connected with the second electrode of the driving transistor T1, the second electrode of the second light emitting control transistor T5 is electrically connected with the second electrode of the organic light emitting element 220, and the gate electrode of the second light emitting control transistor T5 is configured to be electrically connected with the light emitting control signal line EM2 to receive the second light emitting control signal; and the first electrode of the organic light emitting element 220 is electrically connected with the second power end VSS.

In one embodiment, one of the first power end VDD and the second power end VSS is a high-voltage end, and the other is a low-voltage end. In the embodiment shown in FIG. 5, the first power supply end VDD is a voltage source to output a constant first voltage, and the first voltage is a positive voltage; while the second power supply end VSS can be a voltage source to output a constant second voltage, and the second voltage can be a negative voltage. In some exemplary embodiments, the second power supply end VSS may be grounded.

In one embodiment, as shown in FIG. 5, the scanning signal and the compensation control signal can be the same, that is, the gate electrode of the data writing transistor T2 and the gate electrode of the threshold compensation transistor T3 may be electrically connected to a same signal line, such as a scanning signal line Ga1, to receive a same signal (for example, a scanning signal), at this time, the display substrate 1000 may not arrange the scanning signal line Ga2, to reduce the number of signal lines. For another example, the gate electrode of the data writing transistor T2 and the gate electrode of the threshold compensation transistor T3 may also be electrically connected to different signal lines respectively, that is, the gate electrode of the data writing transistor T2 is electrically connected with the scanning signal line Ga1, the gate electrode of the threshold compensation transistor T3 is electrically connected with the scanning signal line Ga2, and the scanning signal line Ga1 and the scanning signal line Ga2 transmit a same signal.

It should be noted that the scanning signal and the compensation control signal may also be different, so that the gate electrode of the data writing transistor T2 and the threshold compensation transistor T3 can be controlled separately, thereby increasing the flexibility of controlling the pixel circuit.

In one embodiment, as shown in FIG. 5, the first light emitting control signal and the second light emitting control signal may be the same, that is, the gate electrode of the first light emitting control transistor T4 and the gate electrode of the second light emitting control transistor T5 may be electrically connected to a same signal line, such as a light emitting control signal line EM1, to receive a same signal (for example, a first light emitting control signal), at this time, the display substrate 1000 may not arrange the light emitting control signal line EM2, to reduce the number of signal lines. In other embodiments, the gate electrode of the first light emitting control transistor T4 and the gate electrode of the second light emitting control transistor T5 may also be electrically connected to different signal lines respectively, that is, the gate electrode of the first light emitting control transistor T4 is electrically connected to the light emitting control signal line EM1, the gate electrode of the second light emitting control transistor T5 is electrically connected to the light emitting control signal line EM2, and the light emitting control signal line EM1 and the light emitting control signal line EM2 transmit a same signal.

It should be noted that in a case that the first light emitting control transistor T4 and the second light emitting control transistor T5 are different types of transistors, for example, in a case that the first light emitting control transistor T4 is a P-type transistor, and the second light emitting control transistor T5 is an N-type transistor, the first light emitting control signal and the second light emitting control signal may also be different, and the embodiments of the present application do not limit this.

In one embodiment, the first sub-reset control signal and the second sub-reset control signal may be the same, that is, the gate electrode of the first reset transistor T6 and the gate electrode of the second reset transistor T7 may be electrically connected to the same signal line, such as a reset control signal line Rst1, to receive a same signal (for example, a first sub-reset control signal), at this time, the display substrate 1000 may not arrange the reset control signal line Rst2, thereby reducing the number of signal lines. For another example, the gate electrode of the first reset transistor T6 and the gate electrode of the second reset transistor T7 may also be electrically connected to different signal lines respectively, that is, the gate electrode of the first reset transistor T6 is electrically connected to a reset control signal line Rst1, and the gate electrode of the second reset transistor T7 is electrically connected to a reset control signal line Rst2, while the reset control signal line Rst1 and the reset control signal line Rst2 transmit a same signal. It should be noted that the first sub-reset control signal and the second sub-reset control signal may also be different. In another embodiment, the first sub-reset control signal is different from the second sub-reset control signal, a pulse width of the reset control signal line Rst2 is greater than a pulse width of the reset control signal line Rst1, and the pulse width of the reset control signal line Rst2 is smaller than the pulse width of the light emitting control signal line EM2 in a case that the second light emitting control transistor T5 is turned off. In this way, it helps to extend life of the organic light emitting elements of the sub-pixels.

In one embodiment, the second sub-reset control signal may be the same as the scanning signal, that is, the gate electrode of the second reset transistor T7 may be electrically connected to the scanning signal line Ga1 to receive a scanning signal as a second sub-reset control signal.

In one embodiment, the gate electrode of the first reset transistor T6 and the source electrode of the second reset transistor T7 are respectively connected to the first reset power end Vinit1 and the second reset power end Vinit2, the first reset power end Vinit1 and the second reset power end Vinit2 can be DC reference voltage ends, to output a constant DC reference voltage. The first reset power end Vinit1 and the second reset power end Vinit2 can be the same, for example, the gate electrode of the first reset transistor T6 and the source electrode of the second reset transistor T7 are connected to a same reset power supply end. The first reset power supply end Vinit1 and the second reset power supply end Vinit2 can be high voltage ends or low voltage ends, as long as they can provide the first reset signal and the second reset signal to reset the gate electrode of the driving transistor T1 and the first electrode of the light emitting element 220, this application does not limit this.

It should be noted that the driving circuit 222, the data writing circuit 226, the storage circuit 227, the threshold compensation circuit 228 and the reset circuit 229 in the pixel circuit shown in FIG. 5 are only illustrative, and the specific structures of the driving circuit 222, the data writing circuit 226, the storage circuit 227, the threshold compensation circuit 228, the reset circuit 229 and other circuits can be set according to actual application requirements, and the embodiments of the present application do not specifically limit this.

According to the characteristics of transistors, transistors can be divided into N-type transistors and P-type transistors. For the sake of clarity, the embodiments of the present application take the transistors as P-type transistors (for example, P-type MOS transistors) as an example to elaborate on the technical solution of the present application, that is, in the description of the present application, the driving transistor T1, the data writing transistor T2, the threshold compensation transistor T3, the first light emitting control transistor T4, the second light emitting control transistor T5, the first reset transistor T6 and the second reset transistor T7 can all be P-type transistors. Of course, the transistors in the embodiments of the present application are not limited to P-type transistors, and those skilled in the art can also use N-type transistors (for example, N-type MOS transistors) to implement the functions of one or more transistors in the embodiments of the present application according to actual needs.

It should be noted that the transistors used in the embodiments of the present application may be thin film transistors or field effect transistors or other switching devices with the same characteristics, the thin film transistors may include oxide semiconductor thin film transistors, amorphous silicon thin film transistors, or polycrystalline silicon thin film transistors. The source and drain electrodes of the transistors can be symmetrical in structure, so there can be no difference in physical structures of the source and drain electrodes. In the embodiment of the present application, in order to distinguish the transistors, in addition to the gate electrode as the control electrode, one of them is directly described as the first electrode and the other as the second electrode, therefore, in the embodiments of the present application, the first electrode and the second electrode of all or part of the transistors arc interchangeable as needed.

It should be noted that in the embodiment of the present application, in addition to the 7T1C (that is, seven transistors and one capacitor) structure shown in FIG. 5, the pixel circuit of the sub-pixel can also be a structure including other numbers of transistors, such as 7T2C structure, 6T1C structure, 6T2C structure or 9T2C structure, the embodiment of the present application does not limit this.

Figure 6A:
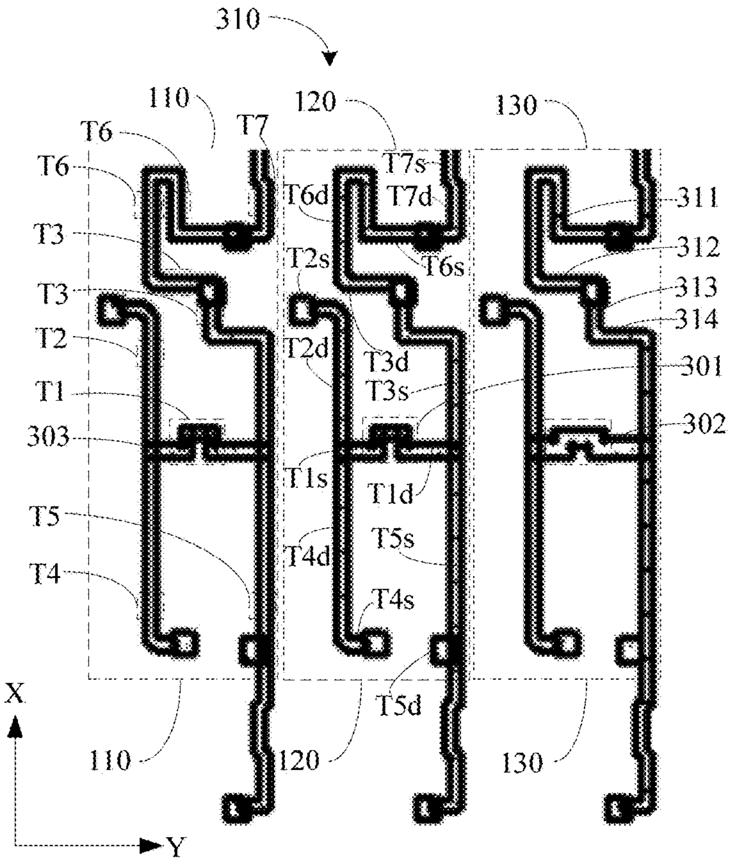
Figure 6B:
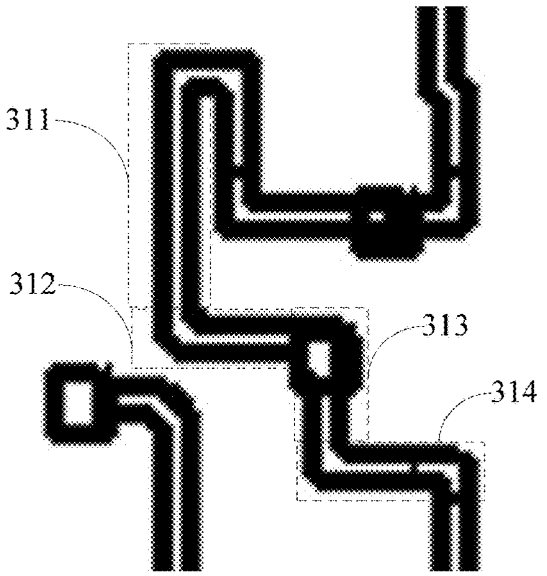
FIG. 6B is a partial enlarged schematic diagram of FIG. 6A.

FIGS. 6A to 11 are schematic diagrams of each layer of a pixel circuit provided by an embodiment of the present application. The following describes the positional relationship of each circuit in the pixel circuit on the backplane with reference to FIGS. 6A to 11, the example shown in FIG. 6A to 11 takes a pixel circuit 221 of a pixel group as an example, and uses the positions of all the transistors of the pixel circuit included in the first color sub-pixel 110 to illustrate, the components included in the pixel circuits of the second color sub-pixel 120 and the third color sub-pixel 130 are substantially at the same position as the transistors included in the first color sub-pixel. As shown in FIG. 6A, the pixel circuit 221 of the first color sub-pixel 110 includes the driving transistor T1, the data writing transistor T2, the threshold compensation transistor T3, the first light emitting control transistor T4, the second light emitting control transistor T5, the first reset transistor T6, the second reset transistor T7 and the capacitor Cst shown in FIG. 5.

FIGS. 6A to 11 also shows the scanning signal line Ga1, the reset control signal line Rst1, the reset power signal line Init1, the light emitting control signal line EM1, the data line Vd, the power signal line (including the first power signal line VDD1, the second power signal line VDD3 and the third power signal line VDD2 of the first power terminal VDD) and the shielding line 344 that are electrically connected to the pixel circuit 121 of each of the color sub-pixels. The first power signal line VDD1 and the second power signal line VDD3 are electrically connected with each other, and the first power signal line VDD1 and the third power signal line VDD2 are electrically connected with each other. The second power line VDD3 includes a first sub-power line VDD31 extending along the first direction Y and a second sub-power line VDD32 extending along the second direction X, and the first sub-power supply line VDD31 intersects the second sub-power supply line VDD32.

The scanning signal line Ga1 is configured to provide a scanning signal to the pixel group; the reset control signal line Rst1 is configured to provide a reset control signal to the pixel group; the reset power signal line Init1 is configured to provide a reset power signal to the pixel group; the light emitting control signal line EM1 is configured to provide a light emitting control signal to the pixel group; the data line Vd is configured to provide the light emitting data signal to the pixel group; the first power signal line VDD1, the second power signal line VDD3 and the third power signal line VDD2 are configured to provide power signals to the pixel group.

For example, FIG. 6A shows an active semiconductor layer 310 of a pixel circuit in the display substrate. The active semiconductor layer 310 may be patterned and formed by using a semiconductor material. The active semiconductor layer 310 can be used to manufacture the above-mentioned driving transistor T1, data writing transistor T2, threshold compensation transistor T3, first light emitting control transistor T4, second light emitting control transistor T5, first reset transistor T6 and second reset transistor T7. The active semiconductor layer 310 includes the channels and source and drain regions of all the transistors of all the sub-pixels (that is, the source region s and the drain region d shown in the second color sub-pixel), and the channels and source-drain regions of the transistors in the same pixel circuit are integrated. The active semiconductor layer 310 shown in FIG. 6A includes a channel 301 of a first color sub-pixel, a channel 302 of a second color sub-pixel, and a channel 303 of a third color sub-pixel.

It should be noted that the active semiconductor layer may include an integrally formed low-temperature polysilicon layer, in which the source region and the drain region can be made conductive by doping or the like to achieve electrical connection between the structures. That is, the active semiconductor layer of all the transistors of all the sub-pixels is an overall pattern formed of p-silicon, and all the transistors in the same pixel circuit includes a source and drain region (that is, a source region s and a drain region d) and a channel, in which the channels of different transistors are separated by the source and drain regions.

In one embodiment, the active semiconductor layers in the pixel circuits of sub-pixels of different colors arranged along the first direction have no connection relationship, and are disconnected from each other. The active semiconductor layers in the pixel circuits of sub-pixels of the same color arranged along the second direction may be arranged integrally, or may be disconnected from each other.

In one embodiment, the active semiconductor layer 310 can be made of amorphous silicon, polysilicon, and oxide semiconductor materials. It should be noted that the above-mentioned source region and drain region may be regions doped with n-type impurities or p-type impurities.

Figure 12:
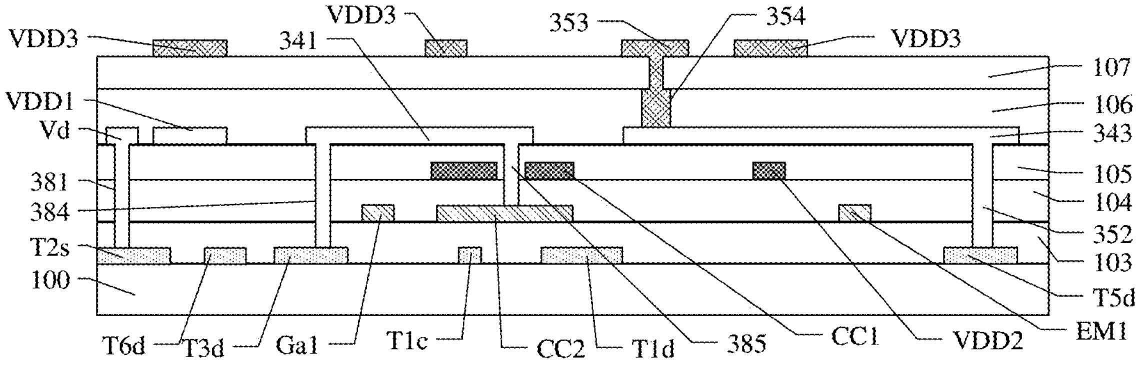
FIG. 12 is a partial cross-sectional schematic diagram at a position of a display substrate provided by an embodiment of the present disclosure.
Figure 13:
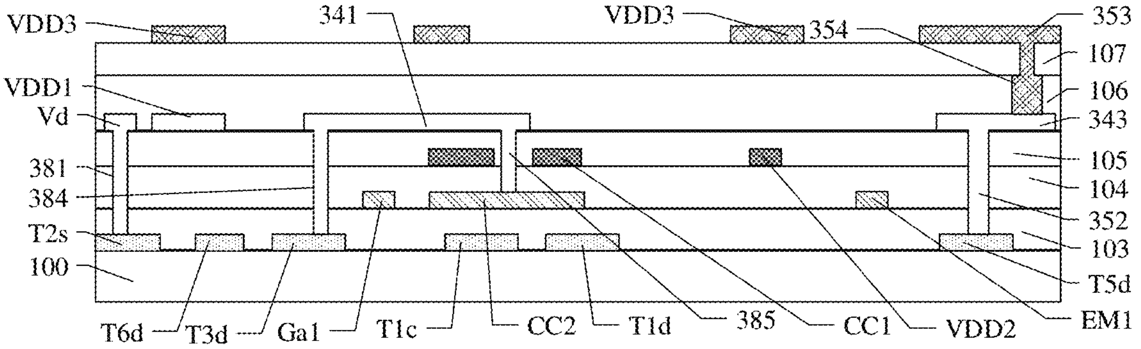
FIG. 13 is a partial cross-sectional schematic diagram at another position of the display substrate provided by an embodiment of the present disclosure.

For example, the gate metal layer of the pixel circuit may include a first conductive layer and a second conductive layer. A gate insulating layer 103 is formed on the above-mentioned active semiconductor layer 310 (as shown in FIGS. 12 and 13), which is used to protect the above-mentioned active semiconductor layer 310, and the active semiconductor layer 310 is located on the base substrate 100. FIG. 7 shows that the display substrate includes a first conductive layer 320, and the first conductive layer 320 is arranged on the gate insulating layer, thereby being insulated from the active semiconductor layer 310. The first conductive layer 320 may include the second electrode plate CC2 of the capacitor Cst, the scanning signal line Ga1, the reset control signal line Rst1, the light emitting control signal line EM1, as well as the gate electrodes of the driving transistor T1, the data writing transistor T2, the threshold compensation transistor T3, the first light emitting control transistor T4, the second light emitting control transistor T5, the first reset transistor T6 and the second reset transistor T7. The scanning signal line Ga1 includes a scanning signal line main body part Gall and a protruding part P protruding from one side of the scanning signal line main body part Gall.

For example, as shown in FIG. 7, the gate electrode of the data writing transistor T2 may be a part where the scanning signal line Ga1 is overlapped with the active semiconductor layer 310; the gate electrode of the first light emitting control transistor T4 may be a first part where the light emitting control signal line EM1 is overlapped with the active semiconductor layer 310, the gate electrode of the second light emitting control transistor T5 may be a second part where the light emitting control signal line EM1 is overlapped the active semiconductor layer 310; the gate electrode of the second reset transistor T7 is a second part where the reset control signal line Rst1 is overlapped with the active semiconductor layer 310; the threshold compensation transistor T3 may be a thin film transistor with a double-gate structure. The first gate electrode of the threshold compensation transistor T3 may be a part where the scanning signal line Ga1 is overlapped with the active semiconductor layer 310, the second gate electrode of the threshold compensation transistor T3 may be a part where the protruding part P of the scanning signal line Ga1 is overlapped with the active semiconductor layer 310. As shown in FIG. 5 and FIG. 3, the gate electrode of the driving transistor T1 may be the second electrode plate CC2 of the capacitor Cst.

It should be noted that the dotted rectangular frames in FIG. 6A show all parts where the first conductive layer 320 and the active semiconductor layer 310 are overlapped.

For example, as shown in FIG. 7, the scanning signal line Ga1, the reset control signal line Rst1, and the light emitting control signal line EM1 are arranged along the second direction X. The scanning signal line Ga1 is located between the reset control signal line Rst1 and the light emitting control signal line EM1. The signal lines extending along the first direction means that the entire row of signal lines extends along the first direction, an area of the part of the signal line extending in the first direction is much larger than an area of the part extending in the second direction; the signal lines extending along the second direction means that the entire row of signal lines extends along the second direction, and an area of the part of the signal line extending in the second direction is much larger than an area of the part extending in the first direction.

For example, in the second direction X, the second electrode plate CC2 of the capacitor Cst (that is, the gate electrode of the driving transistor T1) is located between the scanning signal line Ga1 and the light emitting control signal line EM1. The protruding part P of the scanning signal line Ga1 is located on a side of the scanning signal line Ga1 away from the light emitting control signal line EM1.

For example, as shown in FIG. 6A, in the second direction X, the gate electrode of the data writing transistor T2, the gate electrode of the threshold compensation transistor T3, the gate electrode of the first reset transistor T6 and the gate electrode of the second reset transistor T7 are all located on a first side of the gate electrode of the driving transistor T1, the gate electrode of the first light emitting control transistor T4 and the gate electrode of the second light emitting control transistor T5 are both located on a second side of the gate electrode of the driving transistor T1. For example, in the example shown in FIGS. 6A to 11, the first side and the second side of the gate electrode of the driving transistor T1 of the pixel circuit of the first color sub-pixel are opposite sides of the gate electrode of the driving transistor T1 in the second direction X. For example, as shown in FIGS. 6A to 11, in the XY plane, the first side of the gate electrode of the driving transistor T1 of the pixel circuit of the first color sub-pixel may be an upper side of the gate electrode of the driving transistor T1, the second side of the gate electrode of the driving transistor T1 of the pixel circuit of the first color sub-pixel may be a lower side of the gate electrode of the driving transistor T1. The lower side, for example, the side of the display substrate used for binding the driving chip is a lower side of the display substrate, the lower side of the gate electrode of the driving transistor T1 is the side of the gate electrode of the driving transistor T1 that is closer to the driving chip. The upper side is the opposite side to the lower side, for example, the side of the gate electrode of the driving transistor T1 that is further away from the driving chip.

For example, in some embodiments, as shown in FIGS. 6A to 11, in the first direction Y, the gate electrode of the data writing transistor T2 and the gate electrode of the first light emitting control transistor T4 are both located on a third side of the gate electrode of the driving transistor T1, the first gate electrode of the threshold compensation transistor T3, the gate electrode of the second light emitting control transistor T5 and the gate electrode of the second reset transistor T7 are all located on a fourth side of the gate electrode of the driving transistor T1. For example, in the example shown in FIGS. 6A to 11, the third side and the fourth side of the gate electrode of the driving transistor T1 of the pixel circuit of the first color sub-pixel are two opposite sides of the gate electrode of the driving transistor T1 in the first direction Y. For example, as shown in FIGS. 6A to 11, the third side of the gate electrode of the driving transistor T1 of the pixel circuit of the first color sub-pixel may be a left side of the gate electrode of the driving transistor T1 of the pixel circuit of the first color sub-pixel, the fourth side of the gate electrode of the driving transistor T1 of the pixel circuit of the first color sub-pixel may be a right side of the gate electrode of the driving transistor T1 of the pixel circuit of the first color sub-pixel. The left and right sides, for example, in the same pixel circuit, the data line is on the left side of the first power signal line VDD1, and the first power signal line VDD1 is on the right side of the data line.

Figure 8:
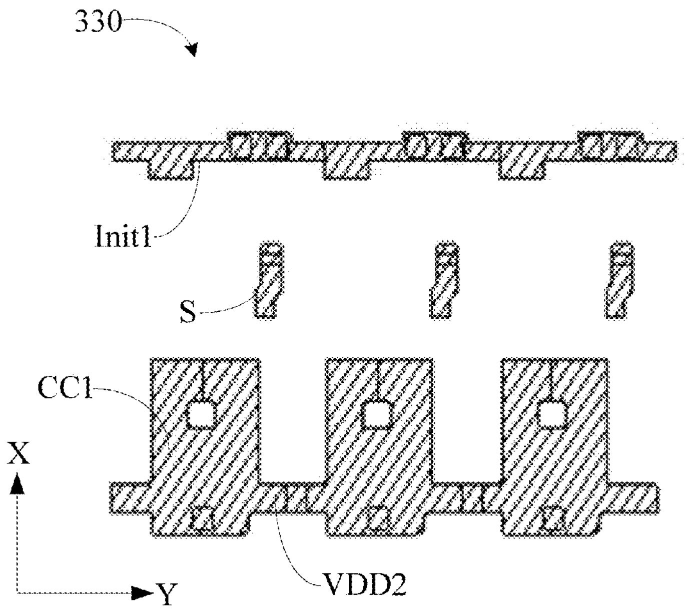

For example, a first insulating layer 104 is formed on the above-mentioned first conductive layer 320 (as shown in FIGS. 12 and 13), and the first insulating layer 104 is used to protect the above-mentioned first conductive layer 320. FIG. 8 shows a second conductive layer 330 of the pixel circuit, the second conductive layer 330 includes the first electrode plate CC1 of the capacitor Cst, the reset power signal line Init1, the third power signal line VDD2 and the light shielding part S. The third power signal line VDD2 is integrally formed with the first electrode plate CC1 of the capacitor Cst. The first electrode plate CC1 of the capacitor Cst and the second electrode plate CC2 of the capacitor Cst are at least partially overlapped to form the capacitor Cst.

Figure 9:
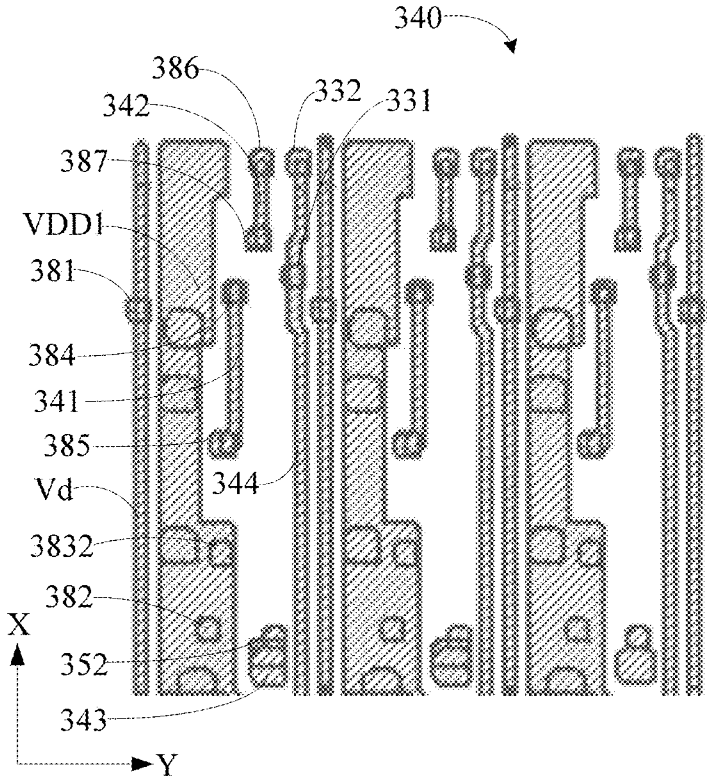

For example, a second insulating layer 105 is formed on the above-mentioned second conductive layer 330 (as shown in FIGS. 12 and 13), and the second insulating layer 105 is used to protect the above-mentioned second conductive layer 330. FIG. 9 shows a source-drain metal layer 340 of the pixel circuit, the source-drain metal layer 340 includes a data line Vd, a first power signal line VDD1 and a shielding line 344. The above-mentioned data line Vd, first power signal line VDD1 and shielding line 344 all extend along the second direction X. The shielding line 344 and the data line Vd are arranged in a same layer and are made of a same material, so that the shielding line and the data line can be formed simultaneously in a same patterning process, and thus a manufacturing process of the display substrate is simplified, and the manufacturing cost is saved. For example, the source-drain metal layer 340 further includes a connection structure 341, a connection part 342, and a first sub-electrode connection structure 343 of the electrode connection structure. One end of the connection structure 341 is connected with the gate electrode of the driving transistor T1, the other end of the connection structure 341 is connected with the source and drain regions of the threshold compensation transistor T3.

FIG. 9 also shows exemplary locations of a plurality of via holes, the source-drain metal layer 340 is connected with a plurality of film layers located between the source-drain metal layer 340 and the base substrate through the plurality of via holes shown in the figure. For example, the source-drain metal layer 340 is connected to the active semiconductor layer 310 shown in FIG. 6A through the via hole 381, the via hole 382, the via hole 384, the via hole 387 and the via hole 352, and the source-drain metal layer 340 is connected to the second conductive layer 330 shown in FIG. 8 through the via hole 3832, the via hole 386, the via hole 385, the via hole 331 and the via hole 332.

For example, a third insulating layer 106 and a fourth insulating layer 107 are formed on the above-mentioned source and drain metal layer 340 (as shown in FIGS. 12 and 13), the third insulating layer 106 and the fourth insulating layer 107 are used to protect the above-mentioned source and drain metal layer 340. The organic light-emitting elements of each of the sub-pixels may be arranged on the side of the third insulating layer and the fourth insulating layer away from the base substrate.

Figure 10:
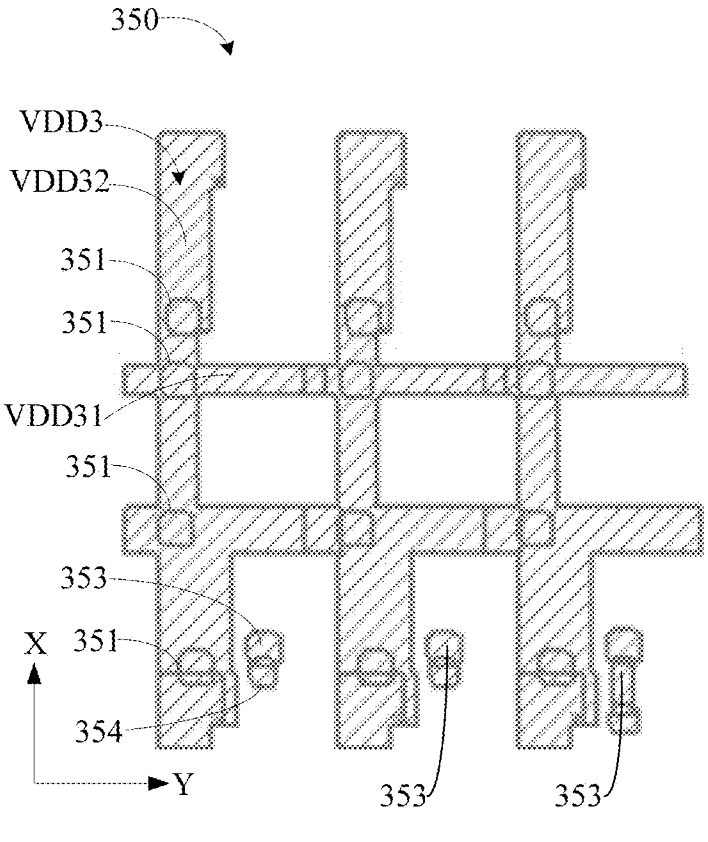

FIG. 10 shows a third conductive layer 350 of the pixel circuit, the third conductive layer 350 includes a second sub-electrode connection structure 353 of the electrode connection structure and a second power signal line VDD3 cross-distributed along the second direction X and the first direction Y. FIG. 10 also shows exemplary locations of a plurality of via holes 351 and via holes 354, the third conductive layer 350 is connected with the source-drain metal layer 340 through a plurality of via holes 351 and via holes 354 as shown in the figure.

Figure 11A:
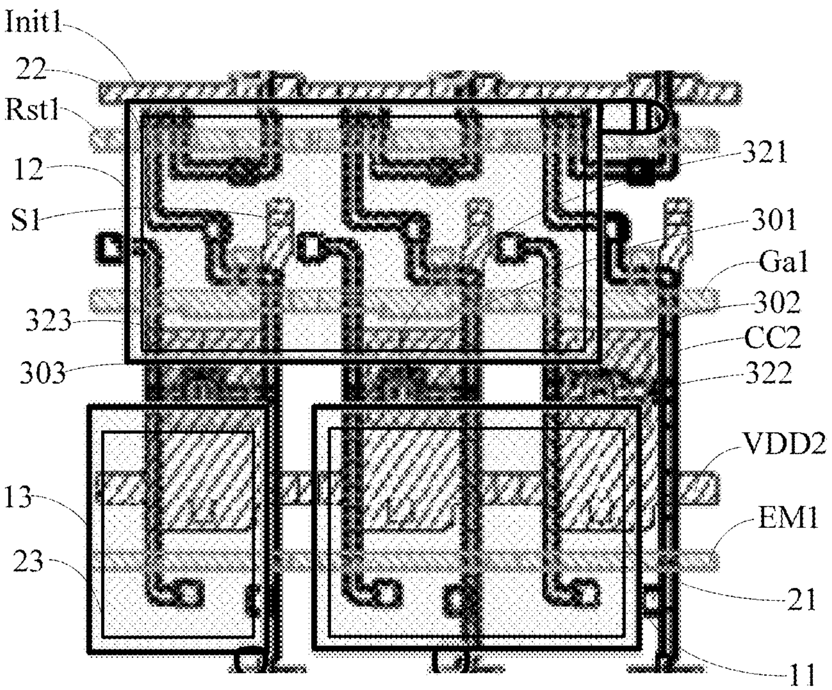
Figure 11B:
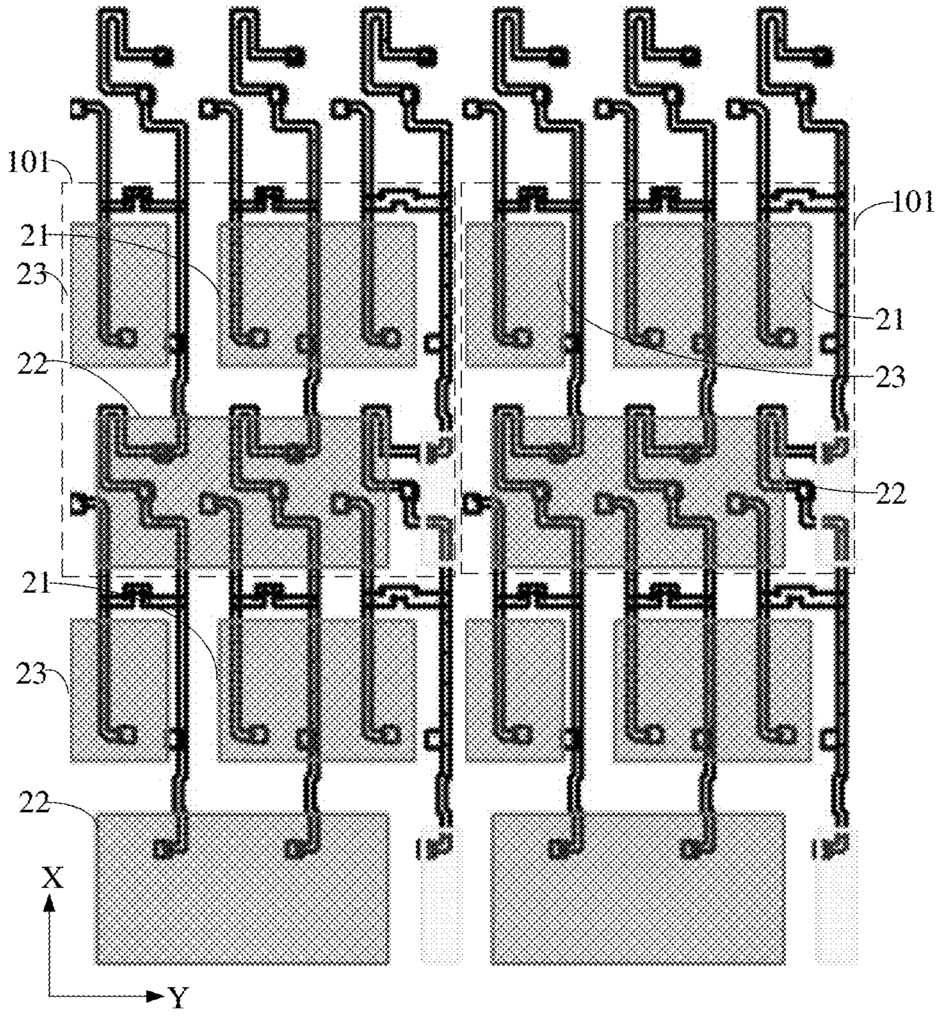
FIG. 11B is a schematic diagram of some layers of multiple pixel groups of a display substrate provided by an embodiment of the present disclosure.

FIG. 11A is a schematic diagram of a stacking position relationship of the above-mentioned active semiconductor layer 310, first conductive layer 320, second conductive layer 330, source-drain metal layer 340, and third conductive layer 350. As shown in FIGS. 6A to 11, the data line Vd is connected with the source region of the data writing transistor T2 in the active semiconductor layer 310 through at least one via hole (for example, a via hole 381) in the gate insulating layer, the first insulating layer, and the second insulating layer. The first power signal line VDD1 is connected with the source region of the corresponding first light emitting control transistor T4 in the active semiconductor layer 310 through at least one via hole (for example, a via hole 382) in the gate insulating layer, the first insulating layer and the second insulating layer.

As shown in FIGS. 6A to 11, one end of the connection structure 341 is connected with the drain region of the corresponding threshold compensation transistor T3 in the active semiconductor layer 310 through at least one via hole (for example, the via hole 384) in the gate insulation layer, the first insulation layer and the second insulation layer, and the other end of the connection structure 341 is connected to the gate electrode (that is, the second electrode plate CC2 of the capacitor Cst) of the driving transistor T1 in the first conductive layer 320 through at least one via hole (for example, the via hole 385) in the first insulating layer and the second insulating layer. One end of the connection part 342 is connected with the reset power signal line Init1 through a via hole (for example, the via hole 386) in the second insulation layer, and the other end of the connection part 342 is connected with the drain region of the second reset transistor T7 in the active semiconductor layer 310 through at least one via hole (for example, the via hole 387) in the gate insulation layer, the first insulation layer, and the second insulation layer. The first sub-electrode connection structure 343 is connected with the drain region of the second light emitting control transistor T5 in the active semiconductor layer 310 through at least one via hole (for example, the via hole 352) in the gate insulating layer, the first insulating layer and the second insulating layer. It should be noted that the source regions and the drain regions of the transistors used in the embodiments of the present disclosure may be structurally the same, so the source regions and the drain regions can be structurally indistinguishable, thus they can be interchanged as needed.

For example, as shown in FIGS. 6A to 11, the first power signal line VDD1 is connected with the first electrode plate CC1 of the capacitor Cst in the second conductive layer 330 through at least one via hole (for example, a via hole 3832) in the second insulating layer between the second conductive layer 330 and the source-drain metal layer 340.

For example, as shown in FIGS. 6A to 11, the shielding line 344 extends along the second direction X, and an orthographic projection of the shielding line 344 on the base substrate is located between an orthographic projection of the driving transistor on the base substrate and an orthographic projection of the data line on the base substrate. For example, the shielding line in the pixel circuit of the first color sub-pixel can reduce an impact of the signal transmitted on the data line in the pixel circuit of the second color sub-pixel on performance of the threshold compensation transistor T3 of the first color sub-pixel, furthermore, influence of coupling between the gate electrode of the driving transistor of the first color sub-pixel and the data line of the second color sub-pixel is reduced, and the crosstalk problem is reduced.

For example, as shown in FIGS. 6A to 11, the shielding line 344 is connected with the reset power signal line Init1 through at least one via hole (for example, a via hole 332) in the second insulation layer, in addition to making the shielding line have a fixed potential, it also makes voltage of an initialization signal transmitted on the reset power signal line more stable, so that it is more beneficial to the working performance of the pixel driving circuit.

For example, as shown in FIGS. 6A to 11, the shielding line 344 is electrically connected to the reset power signal line, so that the shielding line has a fixed potential. The shielding line 344 can be electrically connected with two reset power signal lines Init1 extending along the Y direction respectively, and the two reset power signal lines Init1 are respectively located on both sides of the shielding line 344 along the X direction. For example, these two reset power supply signal lines correspond to the n-th row pixel circuit and the (n+1)-th row pixel circuit respectively.

For example, the shielding lines 344 in the same column can be a whole shielding line, the whole shielding line includes a plurality of sub-sections located between two adjacent reset power signal lines, and each of the plurality of sub-sections is located in each pixel circuit region of the column.

For example, in addition to coupling the shielding line 344 to the reset power signal line, the shielding line 344 can also be coupled to the first power signal line, so that the shielding line 344 has a same fixed potential as the power signal transmitted by the first power signal line.

For example, the orthographic projection of the shielding line 344 on the base substrate is located between the orthographic projection of the threshold compensation transistor T3 on the base substrate and the orthographic projection of the data line Vd on the base substrate, so that the shielding line 344 can reduce the impact of signal changes transmitted on the data line on the performance of the threshold compensation transistor T3, furthermore, the influence of coupling between the gate electrode of the driving transistor and the data signal line Vd (n+1) is reduced, and the problem of vertical crosstalk is solved, so that the display substrate can obtain a better display effect in a case that the display substrate is used for display.

For example, the orthographic projection of the shielding line 344 on the base substrate may be located between the orthographic projection of the connection structure 341 on the base substrate and the orthographic projection of the data line on the base substrate; and the orthographic projection of the shielding line 344 on the base substrate is located between the orthographic projection of the driving transistor T1 on the base substrate and the orthographic projection of the data line on the base substrate.

The above setting method well reduces the first crosstalk generated between the data line and the threshold compensation transistor, and the second crosstalk generated between the data line and the connection structure, so that indirect crosstalk to the driving transistor caused by the above-mentioned first crosstalk and second crosstalk is reduced. In addition, the above arrangement also reduces the direct crosstalk between the data line and the driving transistor, so that the working performance of the display substrate is better ensured.

For example, the shielding line 344 is not limited to the above arrangement, the shielding line 344 may also be coupled only to the reset power supply signal line corresponding to the nth row of pixel circuits, or only to the reset power supply signal line corresponding to the n+1th row of pixel circuits. Moreover, an extension length of the shielding line 344 in the second direction X can also be set according to actual needs.

For example, the pixel circuit of each of the color sub-pixels also includes a light-shielding part S, and the light-shielding part S and the shielding line 344 are arranged in different layers, and an orthographic projection of the light shielding part S on the base substrate is overlapped with the orthographic projection of the shielding line 344 on the base substrate. The shielding line 344 is connected with the light-shielding part S in the second conductive layer 330 through the via hole 331 in the second insulating layer, so that the light shielding part S has a fixed potential, therefore, coupling effect between the threshold compensation transistor T3 and other nearby conductive patterns is better reduced, so that the working performance of the display substrate is more stable.

For example, the light shielding part S is overlapped with the active semiconductor layer 310 between the two gate electrodes of the threshold compensation transistor T3 to prevent the active semiconductor layer 310 between the two gate electrodes from being illuminated and changing its characteristics, for example, the voltage of this part of the active semiconductor layer is prevented from changing, to prevent crosstalk.

This example schematically shows that the light shielding part is connected with the shielding line, but it is not limited to this, and the light shielding part and the shielding line may not be connected.

For example, as shown in FIGS. 6A to 11, the second power signal line VDD3 is connected with the first power signal line VDD1 through at least one via hole 351 in the third insulating layer and the fourth insulating layer, and the second sub-electrode connection structure 353 is connected with the first sub-electrode connection structure 343 through the via holes 354 in the third insulating layer and the fourth insulating layer.

For example, the third insulating layer may be a passivation layer, and the fourth insulating layer may be a planarization layer, the third insulating layer is located between the fourth insulating layer and the base substrate. The fourth insulating layer may be an organic layer, and the organic layer is thicker than the inorganic layer such as the passivation layer.

For example, the via hole 351 and the via hole 354 are both nested via holes, that is, the via hole 351 includes a first via hole in the third insulating layer and a second via hole in the fourth insulating layer, the first via hole in the third insulating layer is opposite to the position of the second via hole in the fourth insulating layer, and the orthographic projection of the second via hole in the fourth insulating layer on the base substrate is located within the orthographic projection of the first via hole in the third insulating layer on the base substrate.

For example, the second power signal line VDD3 is distributed in a grid shape, an orthographic projection of the second sub-power line VDD32 extending along the X direction of the second power signal line VDD3 on the substrate is substantially coincided with an orthographic projection of the first power signal line VDD1 on the substrate, or the orthographic projection of the first power signal line VDD1 on the substrate is located within the orthographic projection of the second sub-power line VDD3 on the substrate, and an electrical connection between the second power signal line VDD3 and the first power signal line VDD1 can reduce voltage drop of the first power signal line VDD1, so that the uniformity of the display device is improved.

For example, the second power signal line VDD3 may be made of a same material as the source-drain metal layer.

For example, as shown in FIG. 9, the first sub-electrode connection structures 343 of the first color sub-pixel, the second color sub-pixel and the third color sub-pixel are all block structures. The first electrode of each of the color sub-pixels formed subsequently will be connected with the corresponding second sub-electrode connection structure 353 through a via hole to achieve connection with the drain region of the second light-emitting control transistor T5.

This embodiment includes but is not limited to this. The position of the second sub-electrode connection structure in each of the color sub-pixels is determined according to an arrangement pattern of the organic light-emitting elements and positions of the light emitting regions.

For example, FIG. 12 is a schematic diagram of a partial cross-sectional structure of the display substrate shown in FIG. 11A, and FIG. 11A only illustrates some of the film layers in FIG. 12. As shown in FIG. 11A and FIG. 8, in the pixel circuit of the second color sub-pixel 120, the second electrode (for example, the drain electrode T5*d*) of the second light emitting control transistor T5 in the active semiconductor layer is arranged with a gate insulating layer 103 on a side away from the base substrate 100, a light emitting control signal line EM1 is arranged on a side of the gate insulating layer 103 away from the base substrate 100, a first insulating layer 104 is arranged on a side of the light emitting control signal line EM1 away from the base substrate 100, a third power signal line VDD2 is arranged on a side of the first insulating layer 104 away from the base substrate 100, a second insulating layer 105 is arranged on a side of the third power signal line VDD2 away from the base substrate 100, and a first sub-electrode connection structure 343 is arranged on a side of the second insulating layer 105 away from the base substrate 100. The first sub-electrode connection structure 343 of the second color sub-pixel 120 is connected with the second electrode T5*d* of the second light emitting control transistor T5 in the active semiconductor layer 310 through the via holes 352 of the gate insulating layer 103, the first insulating layer 104 and the second insulating layer 105. The first sub-electrode connection structure 343 is overlapped with both the third power supply signal line VDD2 and the light emitting control signal line EM1. The first sub-electrode connection structure 343 is arranged with a third insulating layer 106 and a fourth insulating layer 107 in sequence on a side away from the base substrate 100, and a second sub-electrode connection structure 353 and a second power signal line VDD3 are arranged on a side of the fourth insulating layer 107 away from the base substrate 100. The second power signal line VDD3 and the third power signal line VDD2 are overlapped. The second sub-electrode connection structure 353 is connected with the first sub-electrode connection structure 343 through the nested via hole 354 located in the third insulating layer 106 and the fourth insulating layer 107, furthermore, connecting with the second light emitting control transistor is achieved.

For example, as shown in FIG. 12, the data line Vd is connected with the source electrode T2*s* of the data writing transistor T2 through the via hole 381 in the gate insulating layer 103, the first insulating layer 104 and the second insulating layer 105; one end of the connection structure 341 is connected with the drain electrode T3*d* of the threshold compensation transistor T3 through the via hole 384 in the gate insulating layer 103, the first insulating layer 104 and the second insulating layer 105, the other end of the connection structure 341 is connected with the gate electrode of the driving transistor T1 (for example, the second electrode plate CC2 of the capacitor Cst) through the via hole 385 in the first insulating layer 104 and the second insulating layer 105; a channel T1*c* of the driving transistor T1 is located on the side whose gate electrode faces the base substrate 100 and is not overlapped with the via hole 385. The source electrode T1*d* of the driving transistor T1 is overlapped with its gate electrode and the first electrode plate CC1 of the capacitor Cst.

For example, FIG. 13 is a schematic diagram of a partial cross-sectional structure of the display substrate shown in FIG. 11A, and FIG. 11A only illustrates part of the film layers in FIG. 13. As shown in n FIGS. 11A to 13, the first color sub-pixel 110 is different from the second color sub-pixel 120 in that an orthographic projection of a second sub-electrode connection structure 353 in the second color sub-pixel 120 on the base substrate 100 is not overlapped with an orthographic projection of a second electrode T5*d* of the second light-emitting control transistor T5 on the base substrate 100, while an orthographic projection of a second sub-electrode connection structure 353 in the first color sub-pixel 130 on the base substrate 100 is overlapped with an orthographic projection of a second electrode T5*d* of the second light-emitting control transistor T5 on the base substrate 100. In the first color sub-pixel 110, the first sub-electrode connection structure 343 is not overlapped with either the third power supply signal line VDD2 or the light emitting control signal line EM1. In the first color sub-pixel 110, the channel T1 *c* of the driving transistor T1 is located on a side whose gate electrode faces the base substrate 100 and is overlapped with the via hole 385. It can be seen from this that a channel width of the driving transistor of the first color sub-pixel is greater than a channel width of the second color sub-pixel.

For example, as shown in FIGS. 6A to 11, in the second direction X, the scanning signal line Ga1, the reset control signal line Rst1 and the reset power signal line Init1 are all located on a first side of the gate electrode of the driving transistor T1 of the pixel circuit of the first color sub-pixel, the light emitting control signal line EM1 is located on a second side of the driving transistor T1 of the pixel circuit of the first color sub-pixel.

For example, the scanning signal line Ga1, the reset control signal line Rst1, the light emitting control signal line EM1, and the reset power signal line Init1 all extend along the first direction Y, and the data line Vd extends along the second direction X.

It should be noted that a positional arrangement relationship of the driving circuit, the first light-emitting control circuit, the second light-emitting control circuit, the data writing circuit, the storage circuit, the threshold compensation circuit, and the reset circuit in each of the pixel circuits is not limited to the example shown in FIGS. 6A to 11, according to actual application requirements, the positions of the driving circuit, the first lighting control circuit, the second lighting control circuit, the data writing circuit, the storage circuit, the threshold compensation circuit and the reset circuit can be specifically set.

For example, as shown in FIGS. 6A to 13, the first electrode 11 of the first color sub-pixel is connected with the second sub-electrode connection structure 353 through a via hole (not shown) of the fifth insulating layer, so that connection with the drain region of the second light emitting control transistor T5 is achieved. In the same way, the first electrode 13 of the organic light-emitting element of the third color sub-pixel is connected with the second sub-electrode connection structure 353 through a via hole (not shown) of the fifth insulating layer, so that connection with the drain region of the second light emitting control transistor T5 is achieved. The first electrode 12 of the second color sub-pixel is connected with the second sub-electrode connection structure 353 through the via hole of the fifth insulating layer, furthermore, the first electrode 12 is connected with the second sub-electrode connection structure 343, to achieve connection with the drain region of the second light-emitting control transistor T5.

For example, FIGS. 14A to 14E are partial schematic diagrams of each layer of a display substrate in another display panel provided by an embodiment of the present disclosure. The display substrate is stacked with the light control panel shown in FIGS. 8A to 8I to form the display panel 10 shown in FIG. 1C.

The pixel circuit of the display substrate is the same as that shown in FIG. 5, and the sub-pixel structure of the display substrate is mainly different from the embodiment shown in FIGS. 6A to 13 in the following points. FIGS. 14A to 14D show only a few sub-pixels located in the same pixel row as examples.

Figure 14A:
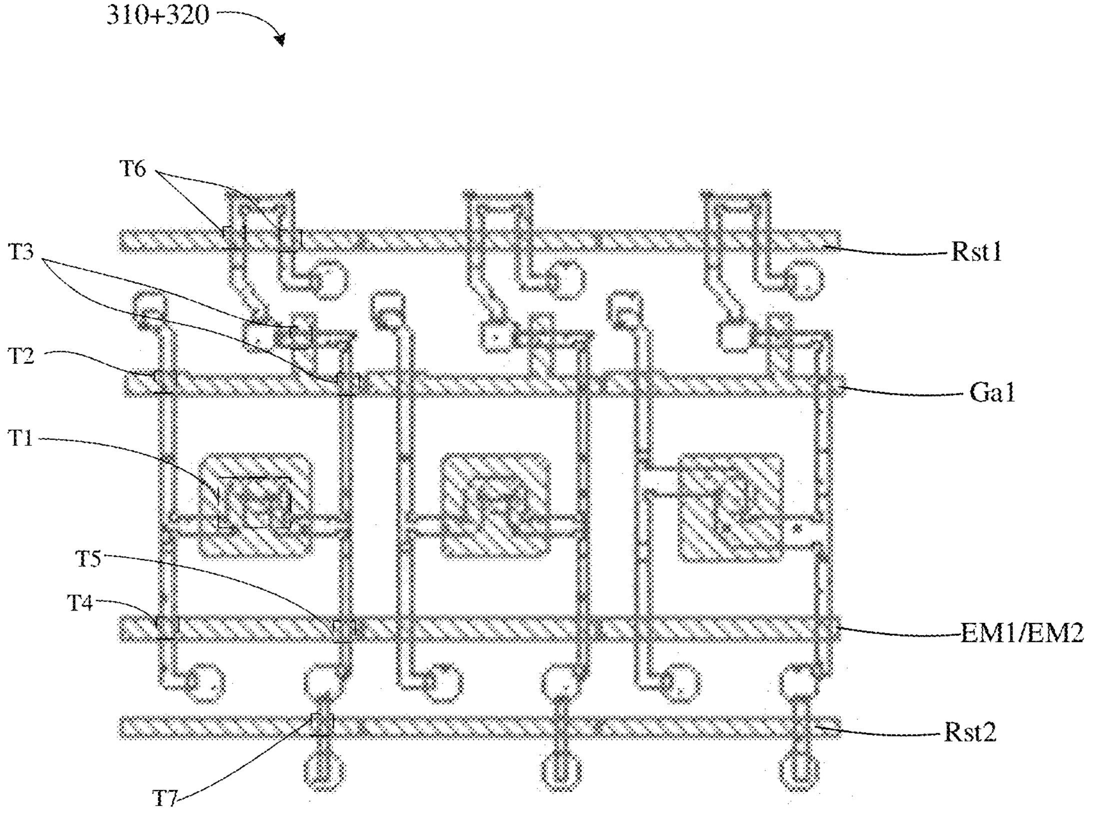
FIGS. 14A to 14E are partial schematic diagrams of layers of a display substrate in another display panel provided by an embodiment of the present disclosure.

FIG. 14A shows a schematic diagram that the active semiconductor layer 310 and the first conductive layer 320 of the pixel circuit are stacked in the display substrate. The active semiconductor layer 310 can be used to manufacture channels of the above-mentioned driving transistor T1, data writing transistor T2, threshold compensation transistor T3, first light emission control transistor T4, second light emission control transistor T5, first reset transistor T6 and second reset transistor T7. The first conductive layer 320 is arranged on the gate insulating layer, so as to be insulated from the active semiconductor layer 310. The first conductive layer 320 may include the second electrode plate CC2 of the capacitor Cst, the scanning signal line Ga1, the reset control signal line Rst1, the light emission control signal line EM1/EM2 (for example, the light-emitting control signal line used to provide light-emitting control signals to the first light-emitting control transistor T4 and the second light-emitting control transistor T5 is shared as a same signal line), as well as the gate electrodes of the driving transistor T1, the data writing transistor T2, the threshold compensation transistor T3, the first light emission control transistor T4, the second light emission control transistor T5, the first reset transistor T6 and the second reset transistor T7.

Figure 14B:
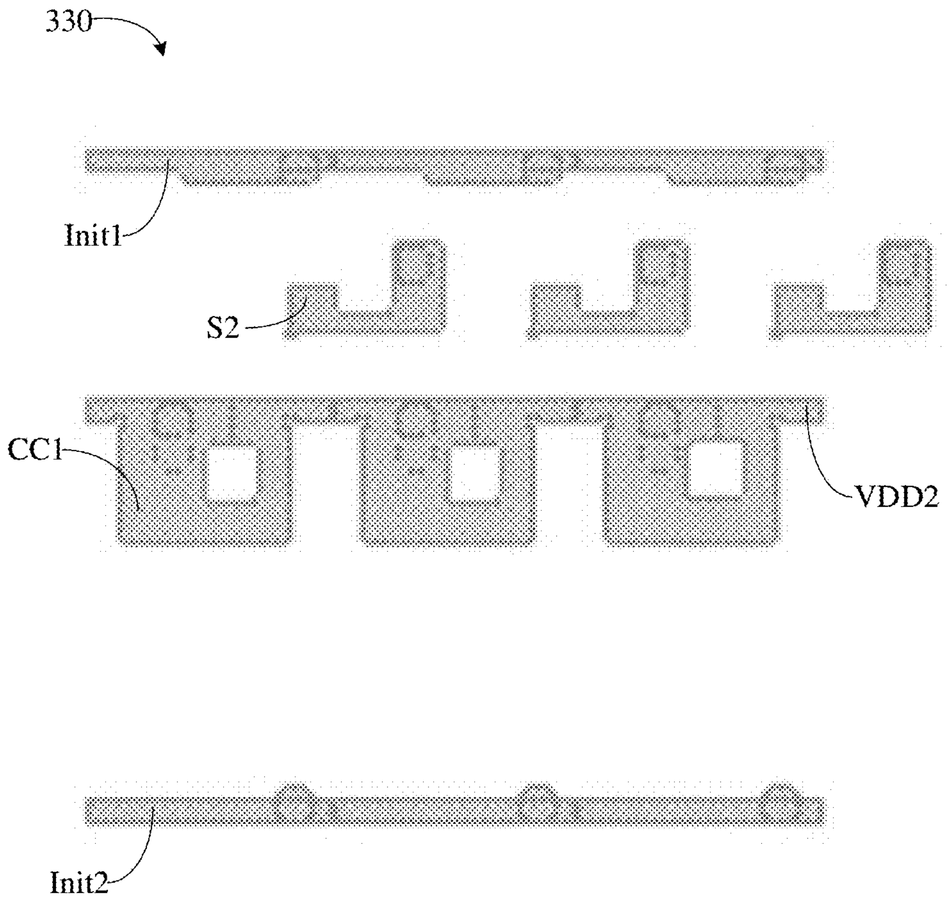

FIG. 14B shows a second conductive layer 330 of the pixel circuit, the second conductive layer 330 includes a first electrode plate CC1 of the storage capacitor, a first reset power signal line Init1, a second reset power signal line Init2, a third power signal line VDD2, and a light shielding part S2. The third power signal line VDD2 is integrally formed with the first electrode plate CC1 of the capacitor C. The first electrode plate CC1 of the capacitor Cst is at least partially overlapped with the second electrode plate CC2 of the capacitor C to form the capacitor Cst.

Figure 14C:
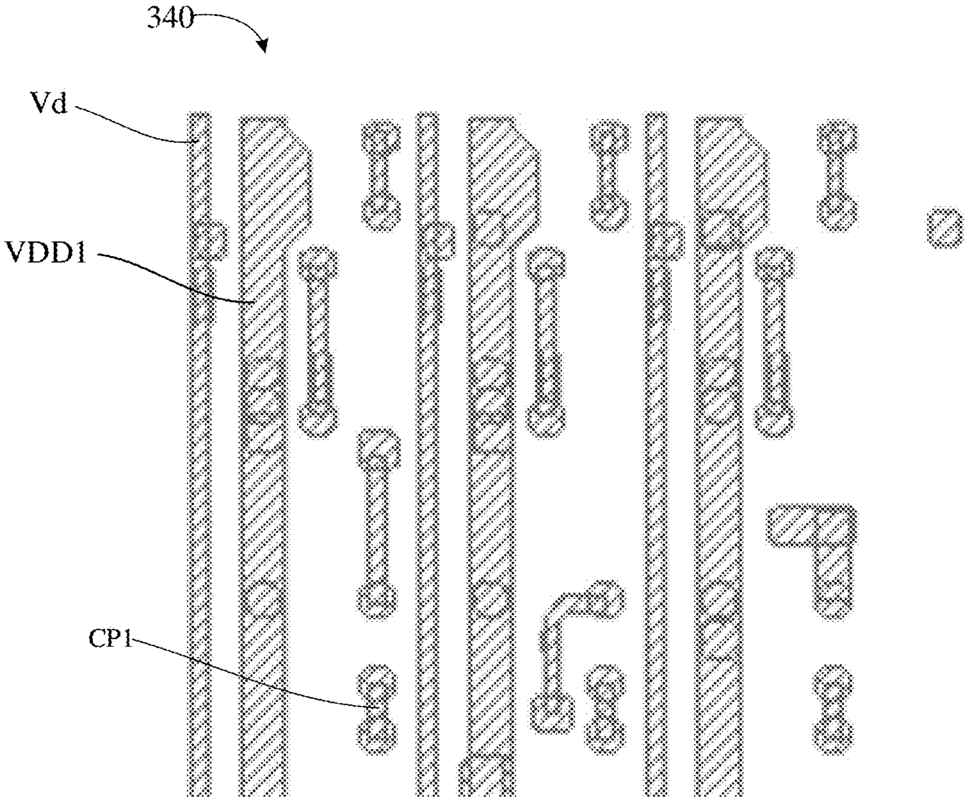
Figure 14D:
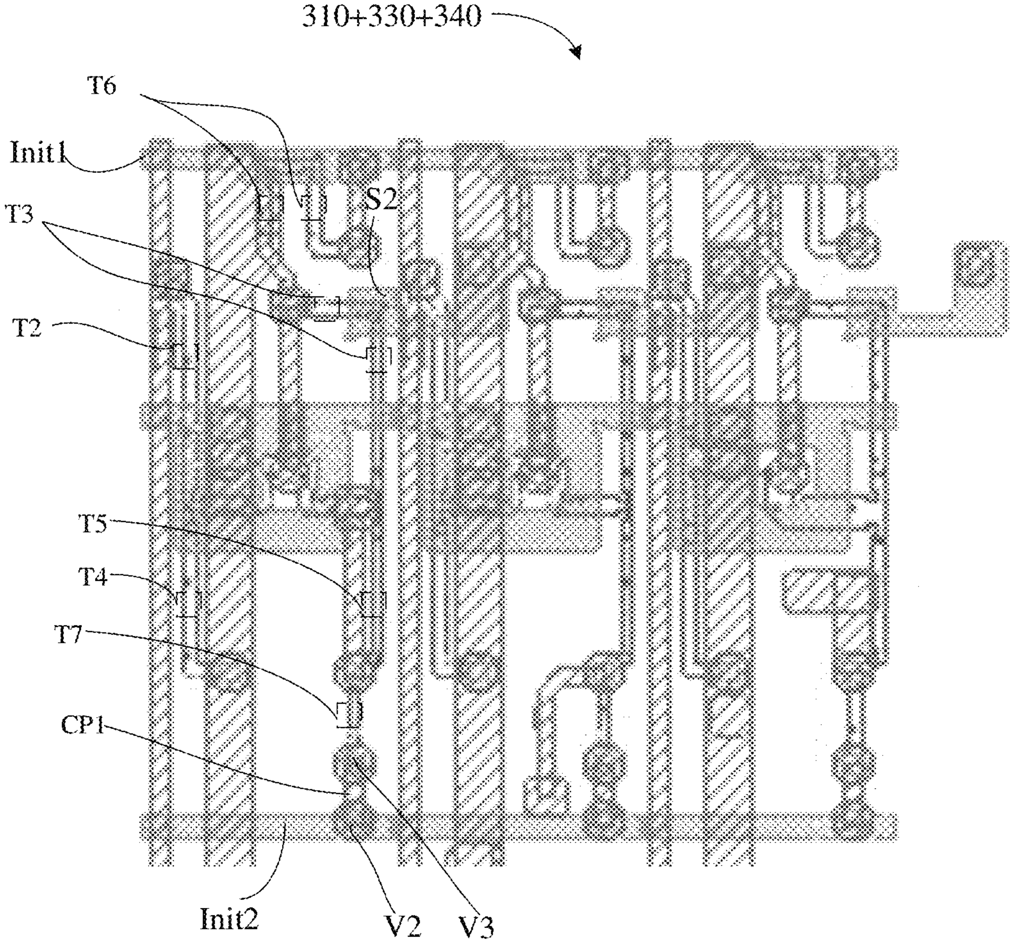

FIG. 14C shows a source-drain metal layer 340 of the pixel circuit. The source-drain metal layer 340 includes a data line Vd, a first power signal line VDD1, and so on. FIG. 14D shows a schematic diagram of the active semiconductor layer 310, the second conductive layer 330 and the source-drain metal layer 340 being stacked. As shown in FIG. 14D, the second reset power signal line Init2 is electrically connected with a connection structure CP1 through the via hole V2, the connection structure CP1 is electrically connected with the source (or drain) electrode of the second reset transistor T7 through the via hole V3. The connection method between the first reset power signal line Init1 and the first reset transistor T6 is similar to that in the previous embodiment, and other similar or identical structures will not be repeated herein.

Figure 14E:
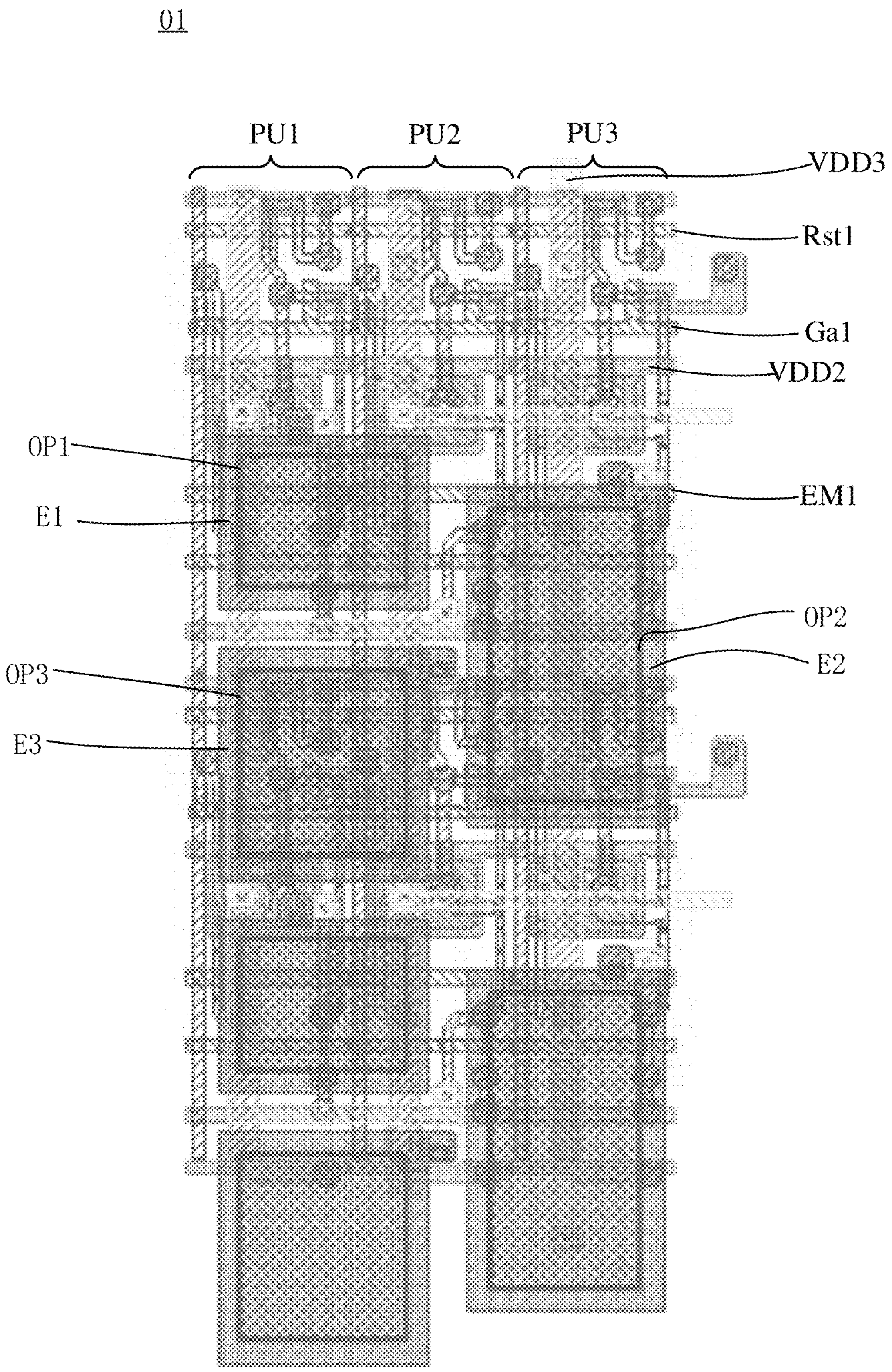

FIG. 14E shows a schematic diagram including a first electrode E1 of the first sub-pixel PU1, a first electrode E2 of the second sub-pixel PU2, and a first electrode E3 of the third sub-pixel PU3. The arrangement of the first electrode E1, the first electrode E2 and the first electrode E3 shown in FIG. 14E is the same as the arrangement of the first electrodes of the three sub-pixels of the display panel shown in FIG. 1A, and in the display panel 10, orthographic projections of the first electrode E1, the first electrode E2 and the first electrode E3 on the main surface of the first substrate are respectively overlapped with the orthographic projections of the first pixel electrode CE1, the second pixel electrode CE2 and the third pixel electrode CE3 of the light control panel 02 shown in FIG. 8H on the main surface of the first substrate, please see the previous descriptions for the specific arrangement.

Of course, the above-mentioned sub-pixel structures of the display substrate 01 are all exemplary, and are not limited to the above-mentioned embodiments. Other types of sub-pixel structures may also be used, as long as the requirements for matching with the light control panel 02 in the embodiment of the present application are met, those skilled in the art can design according to specific needs.

Figure 15A:
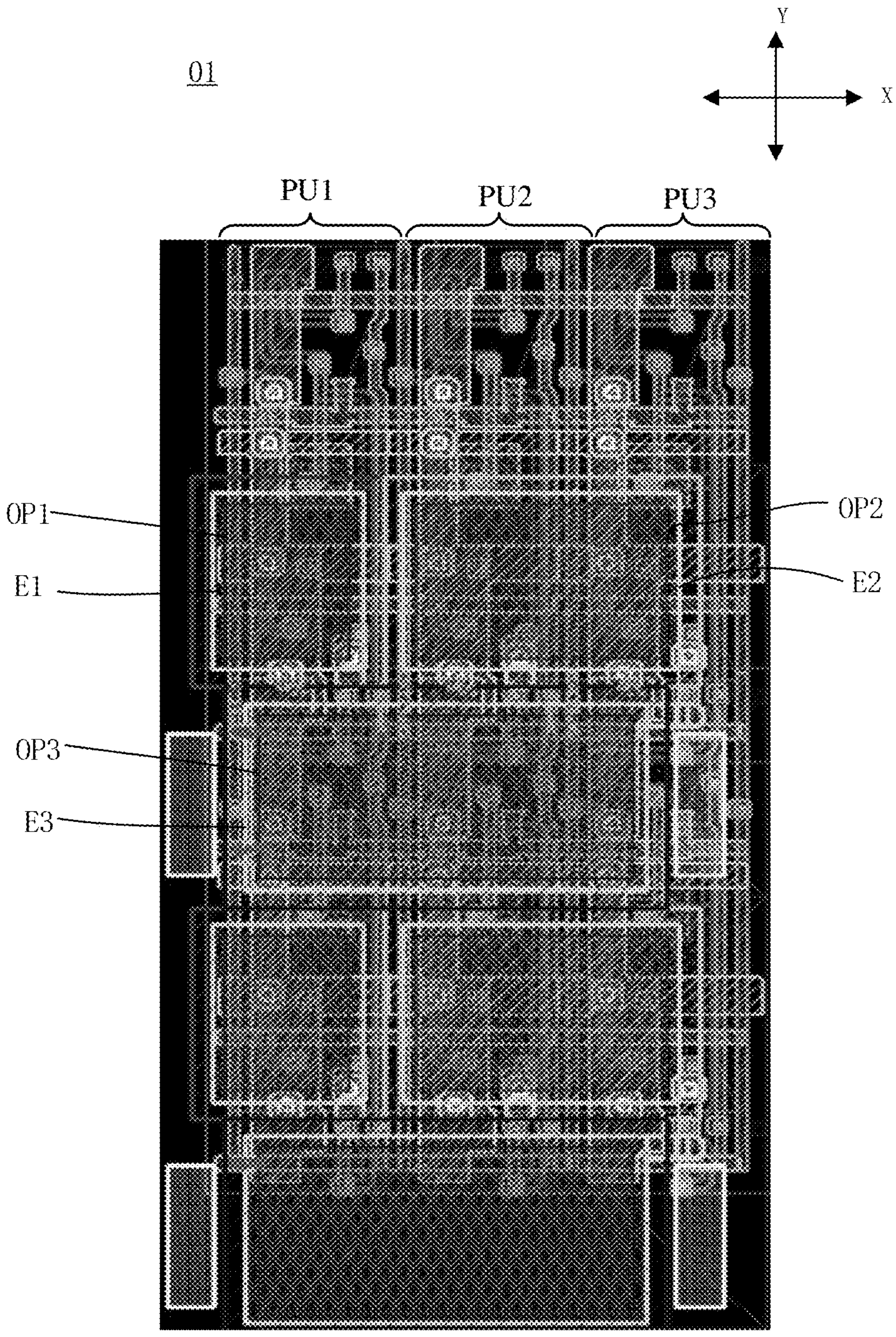
FIG. 15A is a partial planar schematic diagram of a display substrate in another display panel provided by an embodiment of the present disclosure.
Figure 15B:
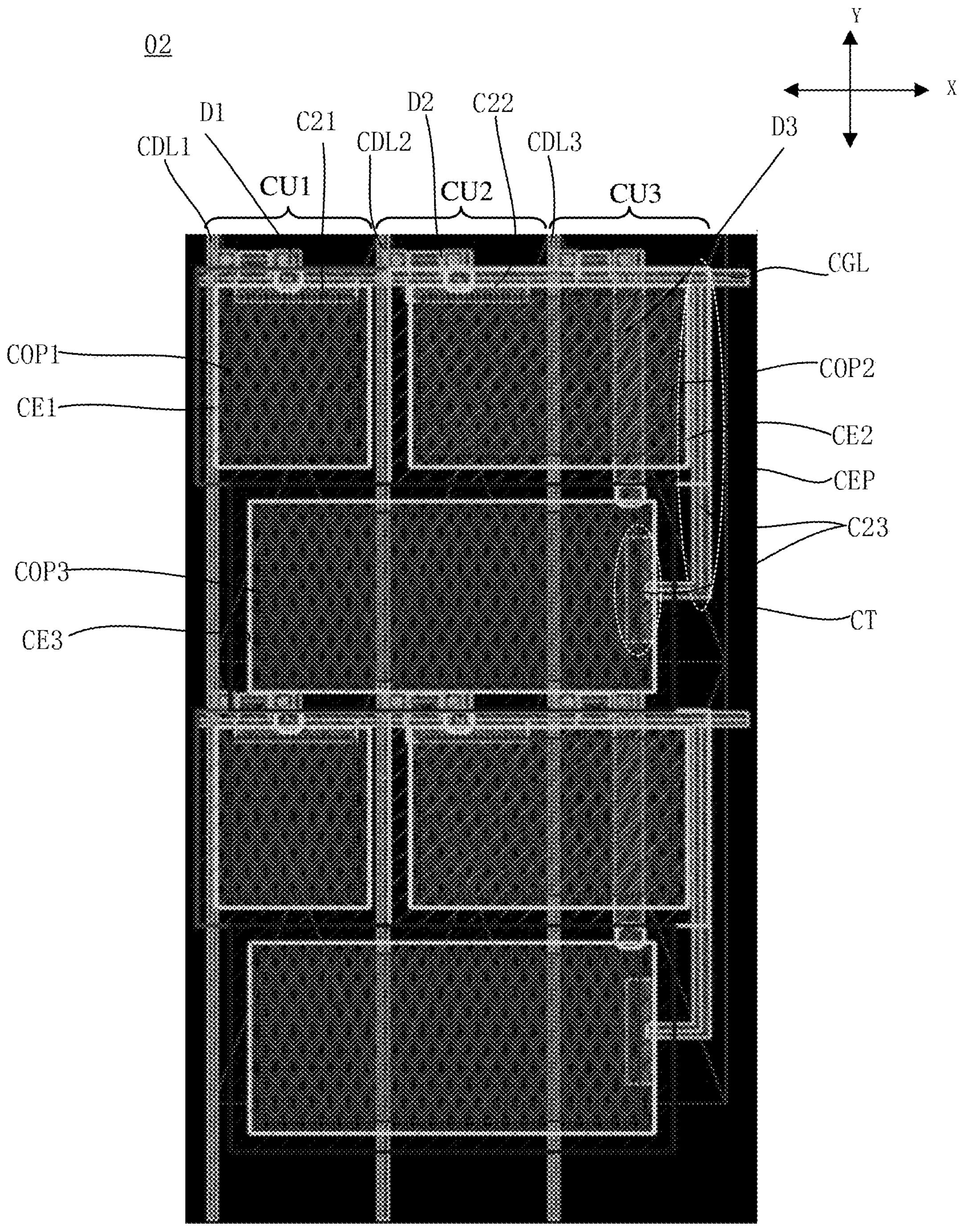
FIG. 15B is a partial planar schematic diagram of a light control panel stacked with the display substrate shown in FIG. 15A in another display panel provided by an embodiment of the present disclosure.

FIG. 15A is a partial planar schematic diagram of a display substrate in another display panel provided by an embodiment of the present disclosure, and FIG. 15B is a partial planar schematic diagram of a light control panel stacked with the display substrate shown in FIG. 15A in another display panel provided by an embodiment of the present disclosure. The embodiment shown in FIGS. 15A to 15B has the following differences from FIGS. 1A to 1C. For example, in the embodiment shown in FIGS. 15A to 15B, the first pixel electrode CE1 and the second pixel electrode CE2 are spaced apart in the row direction X, a size of the second pixel electrode CE2 in the row direction X is larger than a size of the first pixel electrode CE1 in the row direction X, moreover, the first pixel electrode CE1 covers at least part of the space in the row direction X between the light control transistor Tc of the first sub-light control unit CU1 and the light control transistor Tc of the second sub-light control unit CU2, the second pixel electrode CE2 covers at least part of the space in the row direction X between the light control transistor Tc of the second sub-light control unit CU2 and the light control transistor Tc of the third sub-light control unit CU3.

For example, as shown in FIG. 15B, a whole formed by the first pixel electrode CE1 and the second pixel electrode CE2 is aligned with the third pixel electrode CE3 in the column direction Y, the third pixel electrode CE3 is located on a side of the entire structure constituted by the first pixel electrode CE1 and the second pixel electrode CE2 in the column direction Y away from the gate line that provides the light control gate signal to the light control unit; the length of the second electrode plate C23 of the light control storage capacitor C of the third sub-light control unit CU3 in the column direction Y is greater than the length of the second electrode plate C21 of the light control storage capacitor C of the first sub-light control unit CU1 in the column direction Y, and is greater than the length of the second electrode plate C22 of the light control storage capacitor C of the second sub-light control unit CU2 in the column direction Y, to adapt to the arrangement of the entire structure constituted by the first pixel electrode CE1 and the second pixel electrode CE2 and the third pixel electrode CE3. For example, the length of the second electrode plate C22 of the light control storage capacitor C of the second sub-light control unit CU2 in the column direction Y is substantially equal to the length of the second plate C21 of the light control storage capacitor C of the first sub-light control unit CU1 in the column direction Y.

And, as shown in FIG. 15B, an end CT of the second electrode plate C23 of the light control storage capacitor C of the third sub-light control unit CU3 in the column direction Y (the part shown by the smaller white oval dotted frame) is overlapped with the third pixel electrode CE3, a connection part CEP (the part shown by the smaller white oval dotted frame) connecting the end CT and the light control gate line CGL extends in the column direction Y, and an orthographic projection of the connection portion CEP on the main surface 11 of the first substrate 1*a* is not overlapped with orthographic projections of the second opening COP1 of the first sub-light control unit CU1, the second opening COP2 of the second sub-light control unit CU2 and the second opening COP3 of the third sub-light control unit CU3 on the main surface 11 of the first substrate 1*a*, so that the non-display region is reasonably utilized in a limited space to set up the longer connection part CEP, and the connection part CEP is prevented from blocking each second opening, thereby increasing the aperture ratio of the entire display panel 10 as much as possible.

For example, as shown in FIG. 15B, a size of the third pixel electrode CE3 in the row direction X is larger than a size of the second pixel electrode CE2 in the row direction X, and an orthographic projection of the third pixel electrode CE3 in the row direction X is at least partially overlapped with an orthographic projection of the first pixel electrode CE1 in the row direction X, and is at least partially overlapped with the orthographic projection of the second pixel electrode CE2 in the row direction X.

For example, as shown in FIG. 15B, an orthographic projection of a first part of the light control data line CDL2 that provides a light control data signal to the second sub-light control unit CU2 on the main surface 11 of the first substrate 1*a* is located between the orthographic projection of the first pixel electrode CE1 on the main surface 11 of the first substrate 1*a* and the orthographic projection of the second pixel electrode CE2 on the main surface 11 of the first substrate 1*a*, and a second part of the light control data line CDL2 is overlapped with the orthographic projection of the third pixel electrode CE3 on the main surface 11 of the first substrate 1*a*; the orthographic projection of the light control data line CDL on the main surface 11 of the first substrate 1*a* and the orthographic projection of the second pixel electrode CE2 on the main surface 11 of the first substrate 1*a* that provides a light control data signal to the third sub-light control unit CU3 are overlapped with the orthographic projection of the second pixel electrode CE2 on the main surface 11 of the first substrate 1*a*, and are overlapped with the orthographic projection of the third pixel electrode CE3 on the main surface 11 of the first substrate 1*a*, so that the signal line is prevented from blocking the second opening as much as possible, and the aperture ratio of the display panel 10 is improved.

For example, the light control transistor Tc of the first sub-light control unit CU1, the light control transistor Tc of the second sub-light control unit CU2, and the light control transistor Tc of the third sub-light control unit CU3 are basically arranged on a straight line extending along the row direction X, a size of the second electrode D3 of the light control transistor Tc of the third sub-light control unit CU3 in the column direction Y is larger than a size of the second electrode D1 of the light control transistor Tc of the first sub-light control unit CU1 in the column direction Y and a size of the second electrode D2 of the light control transistor Tc of the second sub-light control unit CU2 in the column direction Y; an orthographic projection of an end of the second electrode D3 of the light control transistor Tc of the third sub-light control unit CU3 close to the third pixel electrode CE3 on the main surface 11 of the first substrate 1*a* is overlapped with an orthographic projection of the third pixel electrode CE3 on the main surface 11 of the first substrate 1*a*, a part of an orthographic projection of the second electrode D3 of the light control transistor Tc of the third sub-light control unit CU3 extending along the column direction Y on the main surface 11 of the first substrate 1*a* is also overlapped with an orthographic projection of the second pixel electrode CE2 on the main surface 11 of the first substrate 1*a*, to take into account PPI and opening rate. For example, the second electrode Dc of the light control transistor T of the three-sub light control unit CU3 is a strip structure extending along the column direction Y.

Or, in other embodiments, there is no overlap between the part of the orthographic projection of the second electrode of the light control transistor of the third sub-light control unit extending along the column direction Y on the main surface of the first substrate and the orthographic projection of the first pixel electrode, the second pixel electrode and the third pixel electrode on the main surface 11 of the first substrate, so that a display panel with a larger aperture ratio is obtained.

For example, in the embodiment shown in FIGS. 15A to 15B, an area of the orthographic projection of the first pixel electrode CE1 on the main surface 11 of the first substrate 1*a* is smaller than an area of the orthographic projection of the second pixel electrode CE2 on the main surface 11 of the first substrate 1*a*, and the area of the orthographic projection of the second pixel electrode CE2 on the main surface 11 of the first substrate 1*a* is smaller than an area of the orthographic projection of the third pixel electrode CE3 on the main surface 11 of the first substrate 1*a*. For example, the sub-pixel corresponding to the first sub-light control unit CU1 emits red light, the sub-pixel corresponding to the second sub-light control unit CU2 emits green light, and the sub-pixel corresponding to the third sub-light control unit CU3 emits blue light, so that the luminous intensity and lifespan of light emitting materials of different colors can be balanced. For example, the light emitting elements of the sub-pixels of the display substrate 01 are organic light-emitting diode devices, of course, other types of electroluminescent devices are also possible.

Other unmentioned structures of the embodiment shown in FIGS. 15A to 15B may refer to the description of the embodiment shown in FIGS. 1A to 4I.

At least one embodiment of the present disclosure further provides a display device, which includes any display panel 10 provided by the embodiments of the present disclosure. This display device has the same technical effects as the display panel 10, which will not be repeated herein. For example, the display device can be a mobile phone, a tablet computer, a television, a monitor, a notebook computer, a digital photo frame, a vehicle-mounted display device such as a navigator, or any other product or component with a display function, and the embodiments of the present disclosure do not limit this.

At least one embodiment of the present disclosure also provides a control method of any display panel 10 provided by the embodiment of the present disclosure, including: using at least part of the sub-light control units CU1/CU2/CU3 of the light control panel 02 to modulate light emitted from the first opening, so that the light emitted from the first opening passes through the second openings of at least part of the sub-light control units among the plurality of sub-light control units CU1/CU2/CU3 and then emit from the display panel 10.

Figure 16:
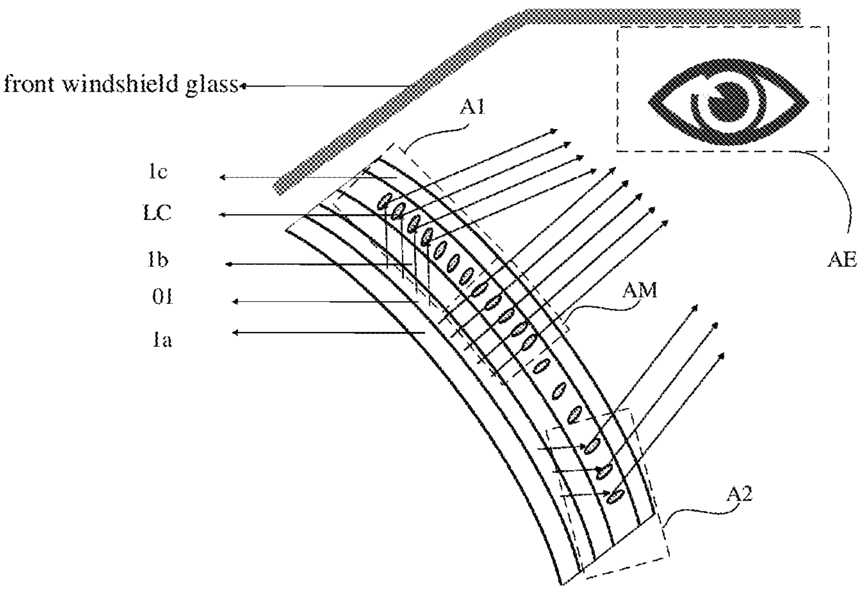
FIG. 16 is an application schematic diagram of a display device provided by an embodiment of the present disclosure.

FIG. 16 is an application schematic diagram of a display device provided by an embodiment of the present disclosure. For example, the display panel 10 includes a first edge display region A1 close to a first edge of the display panel 10, a second edge display region A2 close to the second edge of the display panel 10 and a middle display region AM located between the first edge display region A1 and the second edge display region A2, the first edge is opposite to the second edge; in a direction perpendicular to the ground, a distance from the first edge display region A1 to an eye box AE of an observer of the display panel 10 is smaller than a distance from the second edge display region A2 to the eye box AE of the observer of the display panel 10; the control method includes: controlling the deflection direction of the light emitted from the first opening in the first edge display region A1 after being modulated by the sub-light control unit to be opposite to the deflection direction of the light emitted from the first opening in the second edge display region A2 after being modulated by the sub-light control unit, and controlling the light emitted from the first opening in the middle display region AM not to be deflected after being modulated by the sub-light control unit. For example, the display panel 10 is used in driving scenarios, as a navigator or entertainment display device, in this case, for example, the first edge display region A1 is farther from the ground and closer to the driver's eye box than the second edge display region A2; on the one hand, deflection of liquid crystal molecules in the first edge display region A1 can be controlled to prevent light emitted from the first edge display region A1 from propagating to the windshield glass, more light emitted from the first edge display region A1 is spread to the eye box, so that the light emitted from the display panel 10 is prevented from being imaged on the windshield glass and interfering with the driver's driving vision; on the other hand, deflection of liquid crystal molecules in the second edge display region A2 can be controlled to allow more light emitted from the second edge display region A2 to spread to the eye box, so that the driver can view the image of the second edge display region A2 more comprehensively. For example, the display panel 10 is a curved screen, and the surface of the curved screen is a curved surface that protrudes toward the observer.

What has been described above is only an exemplary embodiment of the present disclosure, and is not used to limit the scope of protection of the present disclosure, which is determined according to the scope defined by the claims.

The invention claimed is:

1. A display panel, comprising:

a display substrate, comprising a first substrate and a plurality of sub-pixels arranged on a main surface of the first substrate, wherein each of the plurality of sub-pixels has a first opening, and light for generating a display image is emitted from the first opening; and a light control panel, stacked with the display substrate in a direction perpendicular to the main surface of the first substrate, and comprising a plurality of sub-light control units, wherein each of the plurality of sub-light control units has a second opening, and the plurality of sub-light control units correspond to the plurality of sub-pixels one by one, the light emitted from the first opening passes through the second openings of at least part of the sub-light control units in the plurality of sub-light control units and then exits the display panel, the at least part of the sub-light control units in the plurality of sub-light control units is configured to modulate the light emitted from the first opening;

an orthographic projection of the second opening of each of the sub-light control units on the main surface of the first substrate is substantially overlapped with an orthographic projection of the first opening of a corresponding sub-pixel on the main surface of the first substrate;

the light control panel is a liquid crystal panel, each of the plurality of sub-light control units further comprises a pixel electrode, liquid crystal molecules, a common electrode and a light control transistor;

the light control panel further comprises:

a light control gate line, extending along a row direction, and electrically connected with a gate electrode of the light control transistor to provide a light control gate signal to the light control transistor; and a light control data line, extending along a column direction, and electrically connected with a first electrode of the light control transistor to provide a light control data signal to the light control transistor, wherein a second electrode of the light control transistor is electrically connected with the pixel electrode, the liquid crystal molecules are configured to be rotatable under an action of an electric field between the pixel electrode and the common electrode, to modulate the light emitted from the first opening; and in each of the sub-light control units, the second opening exposes at least a part of the pixel electrode.

2. The display panel according to claim 1, wherein a ratio of an area of a part of the second opening of each of the sub-light control units of which part an orthographic projection on the main surface of the first substrate is overlapped with the orthographic projection of the first opening of the corresponding sub-pixel on the main surface of the first substrate to an area of the orthographic projection of the first opening of the corresponding sub-pixel on the main surface of the first substrate is greater than or equal to 80%.

3. The display panel according to claim 1, wherein the orthographic projection of the second opening of each of the sub-light control units on the main surface of the first substrate completely coincides with the orthographic projection of the corresponding first opening of the sub-pixel on the main surface of the first substrate.

4. The display panel according to claim 1, wherein each of the plurality of sub-pixels comprises a driving transistor and a light emitting element, the driving transistor is configured to control a magnitude of the driving current flowing through the light emitting element, the light emitting element is configured to receive the driving current and is driven by the driving current to emit light, and comprises a first electrode; in each of the sub-pixels, the first opening exposes at least a part of the first electrode; and an orthographic projection of the pixel electrode on the main surface of the first substrate substantially coincides with an orthographic projection of the corresponding first electrode of the sub-pixel on the main surface of the first substrate.

5. The display panel according to claim 1, wherein an orthographic projection of the light control transistor of each of the sub-light control units on the main surface of the first substrate is not overlapped with all orthographic projections of the first openings of the plurality of sub-pixels of the display substrate on the main surface of the first substrate, and is not overlapped with all orthographic projections of the second openings of the plurality of sub-light control units of the light control panel on the main surface of the first substrate.

6. The display panel according to claim 1, wherein an orthographic projection of the light control gate line on the main surface of the first substrate is not overlapped with all orthographic projections of the first openings of the plurality of sub-pixels of the display substrate on the main surface of the first substrate, and is not overlapped with all orthographic projections of the second openings of the plurality of sub-light control units of the light control panel on the main surface of the first substrate.

7. The display panel according to claim 6, wherein the plurality of sub-light control units are arranged in a light control array; the light control array comprises a plurality of light control units arranged in an array, one of the light control units comprises a plurality of the sub-light control units arranged continuously; the light control array comprises light control rows extending along the row direction and light control columns extending along the column direction, the row direction is intersected with the column direction, both the light control rows and the light control columns comprise a plurality of the light control units; and the light control rows comprise a first light control row and a second light control row adjacent to each other, both an orthographic projection of the light control gate line that provides the light control gate signal to the first light control row on the main surface of the first substrate, and orthographic projections of the light control transistors of the plurality of sub-light control units of the first light control row on the main surface of the first substrate are located between orthographic projections of the second openings of the plurality of sub-light control units of the first light control row on the main surface of the first substrate and orthographic projections of the second openings of the plurality of sub-light control units of the second light control row on the main surface of the first substrate.

8. The display panel according to claim 1, wherein the plurality of sub-light control units are arranged in a light control array; the light control array comprises a plurality of light control units arranged in an array, one of the light control units comprises a plurality of the sub-light control units arranged continuously;

each of the light control units comprises a first edge extending along the column direction, the plurality of sub-light control units of each of the light control units are arranged in the row direction and comprise an edge sub-light control unit closest to the first edge; and an orthographic projection of the light control data line located at the first edge and providing the light control data signal to the edge sub-light control unit on the main surface of the first substrate is not overlapped with orthographic projections of the second openings of all sub-light control units of each of the light control units on the main surface of the first substrate, and is not overlapped with orthographic projections of the first openings of the sub-pixels corresponding to all the sub-light control units on the main surface of the first substrate.

9. The display panel according to claim 4, wherein each of the plurality of sub-light control units further comprises a light control storage capacitor, and the light control storage capacitor comprises:

a first electrode plate, configured as the pixel electrode; and a second electrode plate, arranged in a same layer as the light control gate line and electrically connected with the light control gate line that provides the light control gate signal to the each of the plurality of sub-light control units, wherein the second electrode plate of the light control storage capacitor protrudes from the light control gate line which is electrically connected with the second electrode plate along the column direction, an orthographic projection of at least an end of the second electrode plate in the column direction away from the light control gate line electrically connected with the second electrode plate on the main surface of the first substrate is overlapped with an orthographic projection of the pixel electrode on the main surface of the first substrate.

10. The display panel according to claim 9, wherein the plurality of sub-light control units of each of the light control units comprise a first sub-light control unit, a second sub-light control unit and a third sub-light control unit that are arranged sequentially in the row direction, colors of emitting light of the sub-pixels corresponding to the first sub-light control unit, the second sub-light control unit and the third sub-light control unit are different from each other;

a distance between the light control transistor of the first sub-light control unit and the light control transistor of the second sub-light control unit in the row direction is a first distance, a distance between the light control transistor of the second sub-light control unit and the light control transistor of the third sub-light control unit in the row direction is a second distance; and the second distance is greater than the first distance.

11. The display panel according to claim 10, wherein the pixel electrode electrically connected with the second electrode of the light control transistor of the first sub-light control unit is a first pixel electrode, the pixel electrode electrically connected with the second electrode of the light control transistor of the second sub-light control unit is a second pixel electrode, and the pixel electrode electrically connected with the second electrode of the light control transistor of the third sub-light control unit is a third pixel electrode;

the first pixel electrode and the second pixel electrode are spaced apart in the column direction, and an entire structure constituted by the first pixel electrode and the second pixel electrode is arranged with the third pixel electrode in the row direction; and both the first pixel electrode and the second pixel electrode cover at least part of a space between the light control transistor of the first sub-light control unit and the light control transistor of the second sub-light control unit in the row direction, and at least part of a space between the light control transistor of the second sub-light control unit and the light control transistor of the third sub-light control unit in the row direction, and the third pixel electrode covers at least part of a space between the light control transistor of the second sub-light control unit and the light control transistor of the third sub-light control unit in the row direction.

12. The display panel according to claim 11, wherein the second pixel electrode is located on a side of the first pixel electrode away from the gate line that provides the light control gate signal to the light control unit in the column direction, a distance in the column direction between the third pixel electrode and the gate line that provides the light control gate signal to the light control unit is greater than a distance in the column direction between the first pixel electrode and the gate line that provides the light control gate signal to the light control unit; and a length of the second electrode plate of the light control storage capacitor of the second sub-light control unit in the column direction is greater than a length of the second electrode plate of the light control storage capacitor of the third sub-light control unit in the column direction, and the length of the second electrode plate of the light control storage capacitor of the third sub-light control unit in the column direction is greater than a length of the second electrode plate of the light control storage capacitor of the first sub-light control unit in the column direction.

13. The display panel according to claim 12, wherein a size of the third pixel electrode in the column direction is larger than a size of the second pixel electrode in the column direction, and is larger than a size of the first pixel electrode in the column direction; and, an orthographic projection of the third pixel electrode in the column direction is at least partially overlapped with an orthographic projection of the first pixel electrode in the column direction, and is at least partially overlapped with an orthographic projection of the second pixel electrode in the column direction;

the light control transistor of the first sub-light control unit, the light control transistor of the second sub-light control unit and the light control transistor of the third sub-light control unit are basically arranged on a straight line extending along the row direction; and a size of the second electrode of the light control transistor of the second sub-light control unit in the column direction is larger than a size of the second electrode of the light control transistor of the third sub-light control unit in the column direction, and the size of the second electrode of the light control transistor of the third sub-light control unit in the column direction is larger than a size of the second electrode of the light control transistor of the first sub-light control unit in the column direction.

14. The display panel according to claim 11, wherein the second electrode of the light control transistor of the second sub-light control unit comprises an extension part extending along the column direction, an orthographic projection of the extension part on the main surface of the first substrate is located between an orthographic projection of the second opening of the first sub-light control unit on the main surface of the first substrate and an orthographic projection of the second opening of the third sub-light control unit on the main surface of the first substrate.

15. The display panel according to claim 10, wherein the pixel electrode electrically connected with the second electrode of the light control transistor of the first sub-light control unit is a first pixel electrode, the pixel electrode electrically connected with the second electrode of the light control transistor of the second sub-light control unit is a second pixel electrode, and the pixel electrode electrically connected with the second electrode of the light control transistor of the third sub-light control unit is a third pixel electrode;

the first pixel electrode and the second pixel electrode are spaced apart in the row direction, a size of the second pixel electrode in the row direction is larger than a size of the first pixel electrode in the row direction; and the first pixel electrode covers at least part of a space between the light control transistor of the first sub-light control unit and the light control transistor of the second sub-light control unit in the row direction, and the second pixel electrode covers at least part of a space in the row direction between the light control transistor of the second sub-light control unit and the light control transistor of the third sub-light control unit.

16. The display panel according to claim 15, wherein an entire structure constituted by the first pixel electrode and the second pixel electrode is arranged with the third pixel electrode in the column direction, the third pixel electrode is on a side of the entire structure constituted by the first pixel electrode and the second pixel electrode in the column direction away from the gate line that provides the light control gate signal to the light control unit;

a length of the second electrode plate of the light control storage capacitor of the third sub-light control unit in the column direction is greater than a length of the second electrode plate of the light control storage capacitor of the first sub-light control unit in the column direction, and is greater than a length of the second electrode plate of the light control storage capacitor of the second sub-light control unit in the column direction; and a size of the third pixel electrode in the row direction is larger than a size of the second pixel electrode in the row direction, and an orthographic projection of the third pixel electrode in the row direction is at least partially overlapped with an orthographic projection of the first pixel electrode in the row direction, and is at least partially overlapped with an orthographic projection of the second pixel electrode in the row direction.

17. The display panel according to claim 10, wherein the sub-pixel corresponding to the first sub-light control unit emits red light, the sub-pixel corresponding to the second sub-light control unit emits green light, and the sub-pixel corresponding to the third sub-light control unit emits blue light.

18. A display device, comprising the display panel according to claim 1.

19. A control method of the display panel according to claim 1, comprising:

utilizing at least part of the sub-light control units of the plurality of sub-light control units of the light control panel to modulate the light emitted from the first opening, so that the light emitted from the first opening passes through the second openings of at least part of the sub-light control units in the plurality of sub-light control units and then emit from the display panel.

* * * * *